(12) United States Patent
Okamoto et al.

(10) Patent No.: US 11,997,846 B2
(45) Date of Patent: May 28, 2024

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Satoru Okamoto, Isehara (JP); Ryo Tokumaru, Isehara (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 715 days.

(21) Appl. No.: 17/256,349

(22) PCT Filed: Jun. 27, 2019

(86) PCT No.: PCT/IB2019/055427
§ 371 (c)(1),
(2) Date: Dec. 28, 2020

(87) PCT Pub. No.: WO2020/008304
PCT Pub. Date: Jan. 9, 2020

(65) Prior Publication Data
US 2021/0265353 A1 Aug. 26, 2021

(30) Foreign Application Priority Data

Jul. 6, 2018 (JP) ................. 2018-128911

(51) Int. Cl.
*H10B 12/00* (2023.01)
*G11C 11/402* (2006.01)
*H01L 29/786* (2006.01)

(52) U.S. Cl.
CPC .......... *H10B 12/30* (2023.02); *G11C 11/4023* (2013.01); *H01L 29/7869* (2013.01)

(58) Field of Classification Search
CPC ...... H10B 12/30; H10B 12/033; H10B 12/05; H10B 12/31; G11C 11/4023; G11C 11/404; H01L 29/7869; H01L 29/78648
See application file for complete search history.

(56) References Cited

U.S. PATENT DOCUMENTS 8,940,601 B2   1/2015   Sakamoto et al.
9,917,207 B2   3/2018   Yamazaki
(Continued)

FOREIGN PATENT DOCUMENTS

JP   09-064303 A     3/1997
JP   2008-177225 A   7/2008
(Continued)

OTHER PUBLICATIONS

International Search Report (Application No. PCT/IB2019/055427) dated Sep. 17, 2019.
(Continued)

*Primary Examiner* — Kyoung Lee
(74) *Attorney, Agent, or Firm* — Eric J. Robinson; Robinson Intellectual Property Law Office, P.C.

(57) ABSTRACT

A semiconductor device that can be miniaturized or highly integrated is provided. The semiconductor device includes an oxide; a first conductor and a second conductor provided apart from each other over the oxide; a third conductor including a region that is over the oxide and overlaps with a region between the first conductor and the second conductor; a first insulator over the third conductor; a fourth conductor that is electrically connected to the first conductor through a first opening provided in the first insulator; a second insulator that is provided over the first insulator and that is provided over the fourth conductor in the first opening; a fifth conductor overlapping with the fourth conductor with the second insulator positioned therebetween in the first opening; and a sixth conductor electrically (Continued)

connected to the second conductor in a second opening provided in the first insulator and the second insulator. The fifth conductor and the sixth conductor are in contact with a top surface of the second insulator over the first insulator.

14 Claims, 28 Drawing Sheets

(56) References Cited

U.S. PATENT DOCUMENTS

| | | | |
|---|---|---|---|
| 9,966,473 | B2 | 5/2018 | Endo |
| 10,546,958 | B2 | 1/2020 | Endo |
| 2012/0032730 | A1 | 2/2012 | Koyama |
| 2016/0336454 | A1 | 11/2016 | Endo |
| 2017/0012139 | A1 | 1/2017 | Sasagawa et al. |
| 2017/0186875 | A1* | 6/2017 | Yamazaki ......... H01L 29/78648 |
| 2018/0190826 | A1 | 7/2018 | Endo |

FOREIGN PATENT DOCUMENTS

| | | |
|---|---|---|
| JP | 2012-257187 A | 12/2012 |
| JP | 2013-021012 A | 1/2013 |
| JP | 2016-213468 A | 12/2016 |
| JP | 2017-050530 A | 3/2017 |
| JP | 2017-120896 A | 7/2017 |

OTHER PUBLICATIONS

Written Opinion (Application No. PCT/IB2019/055427) dated Sep. 17, 2019.

* cited by examiner

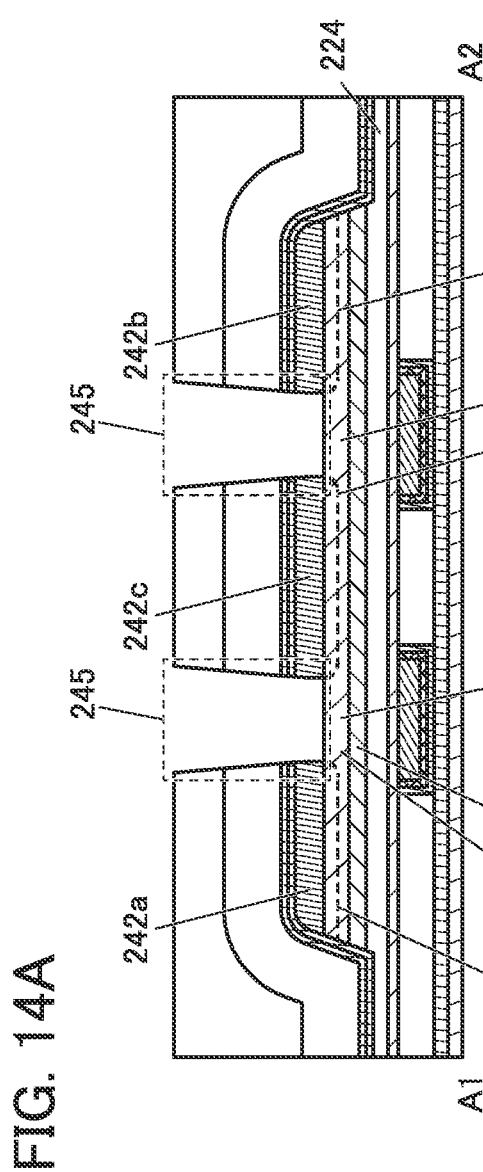
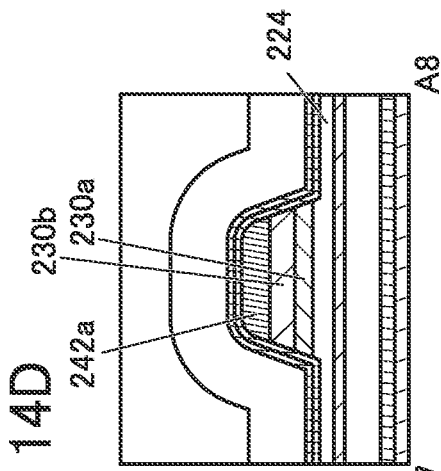
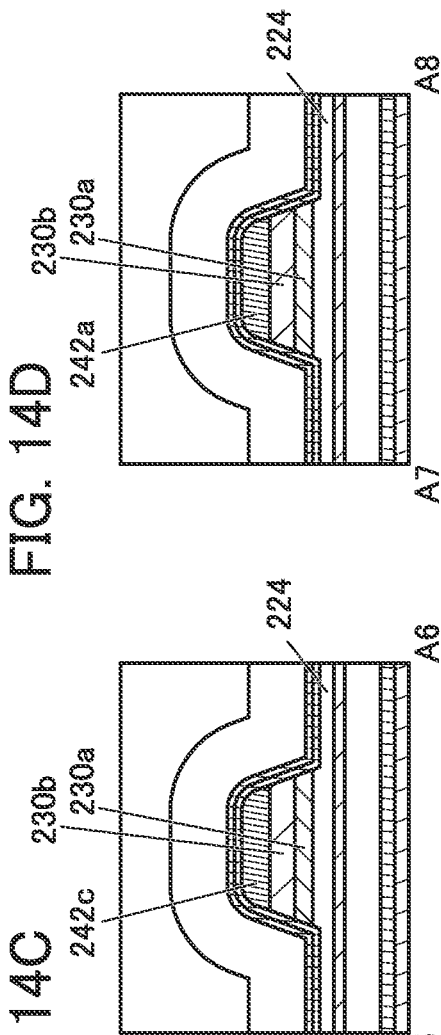
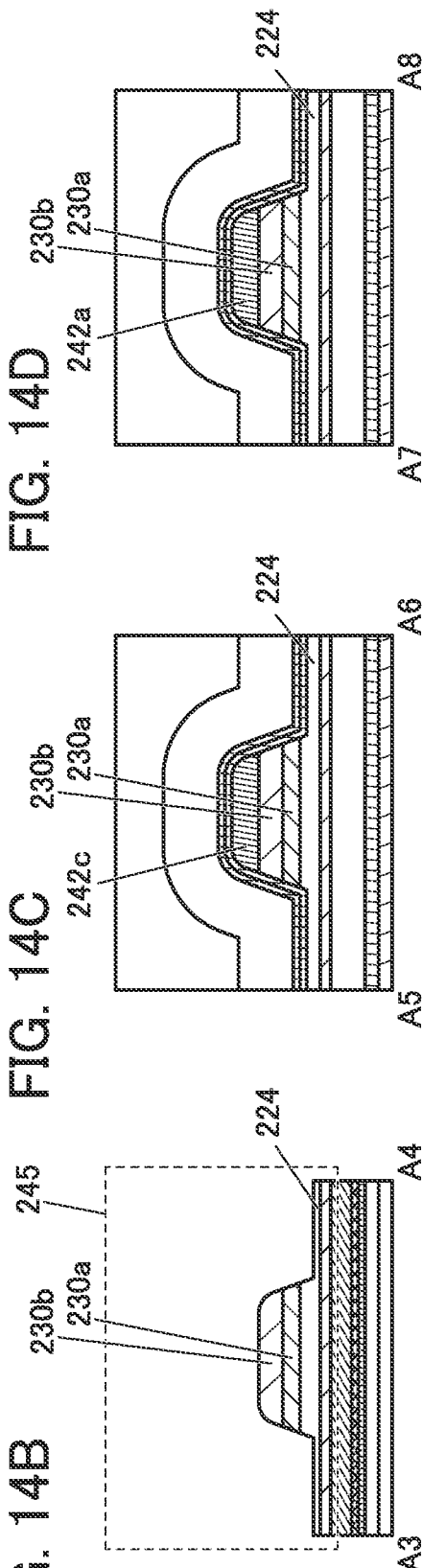

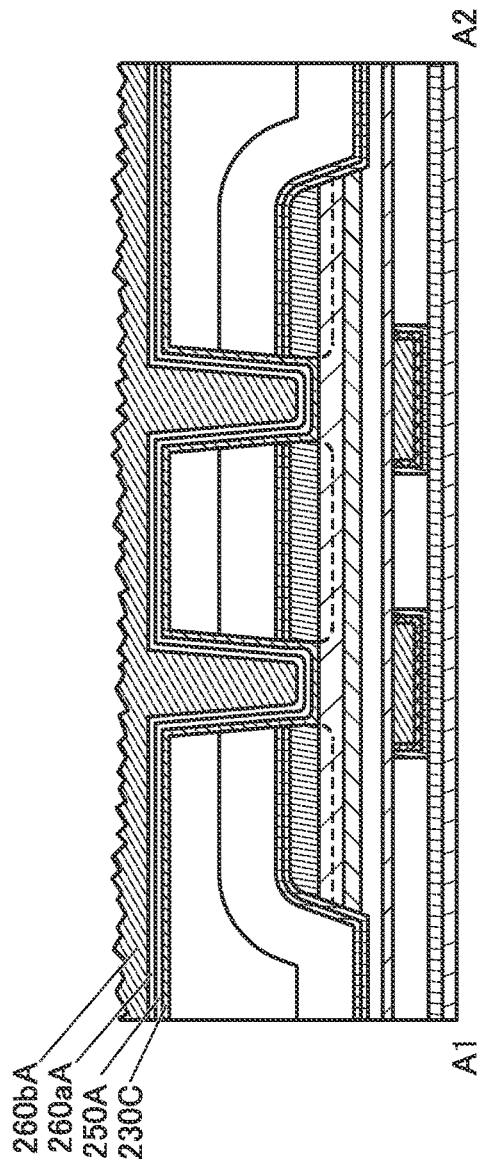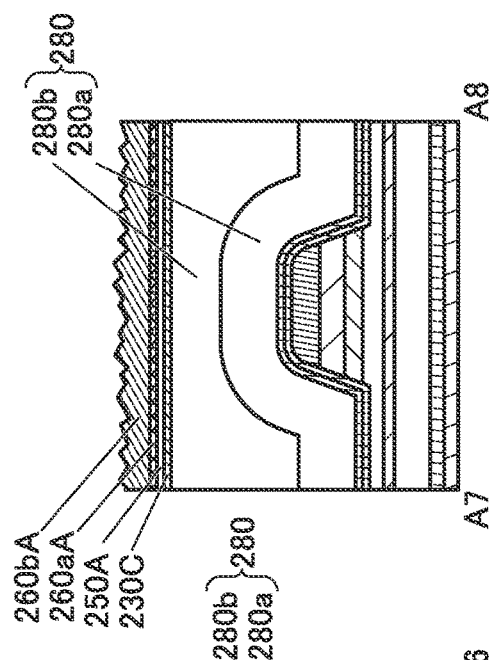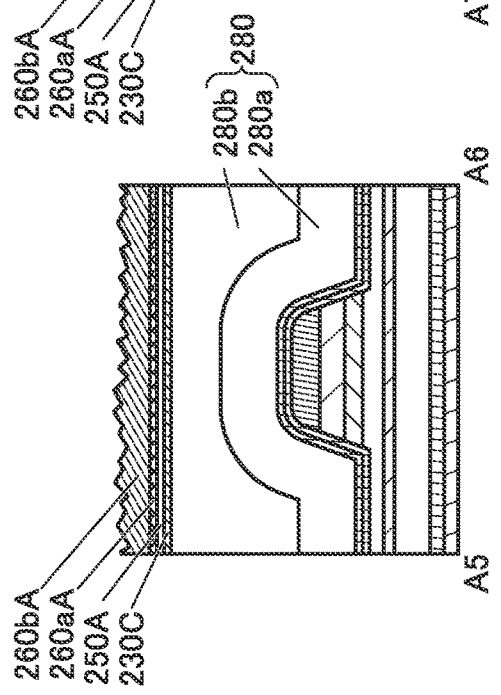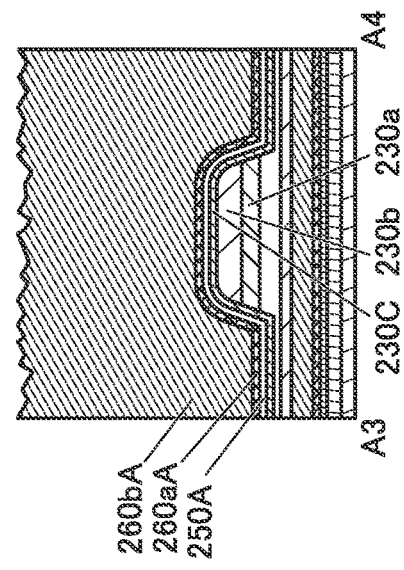

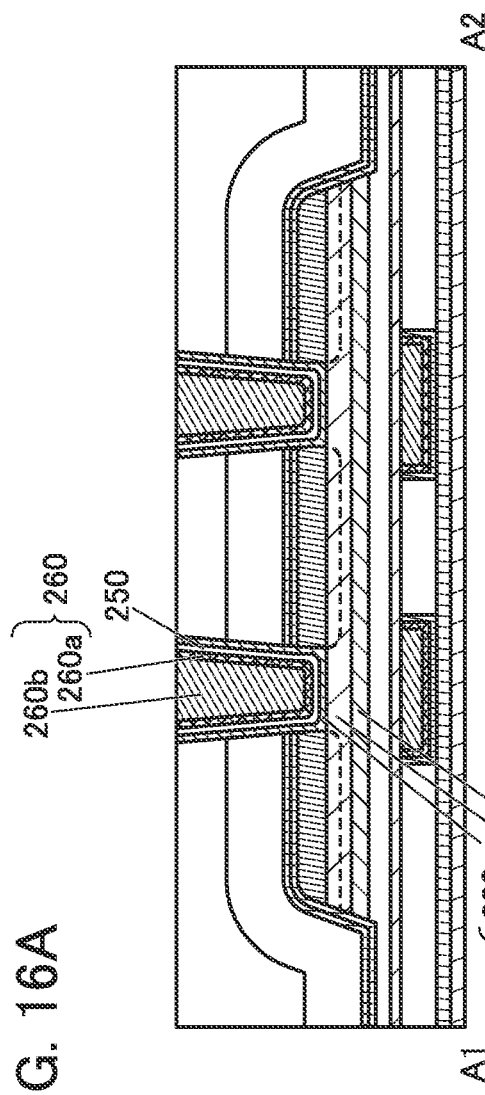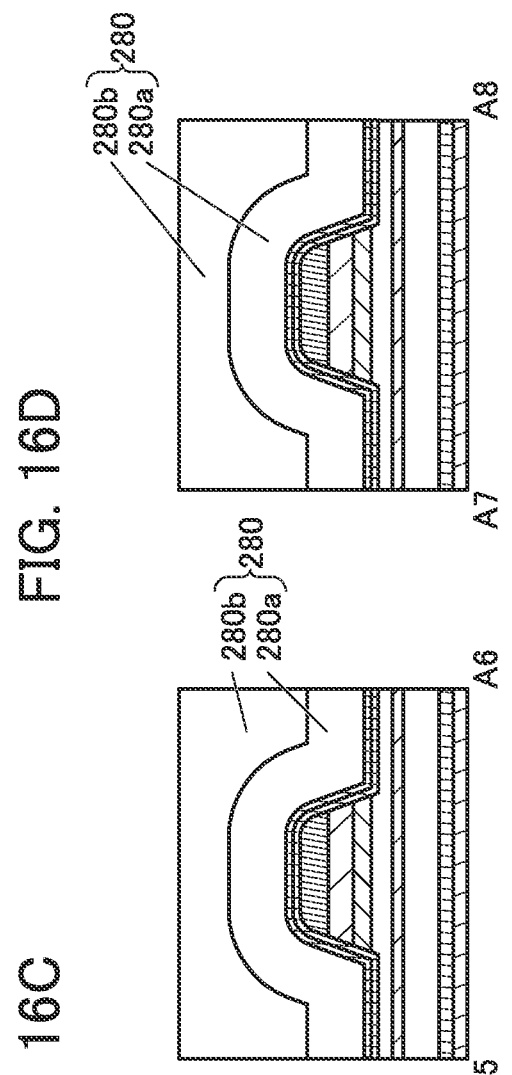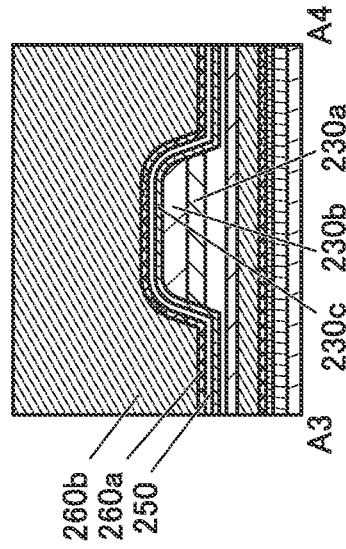

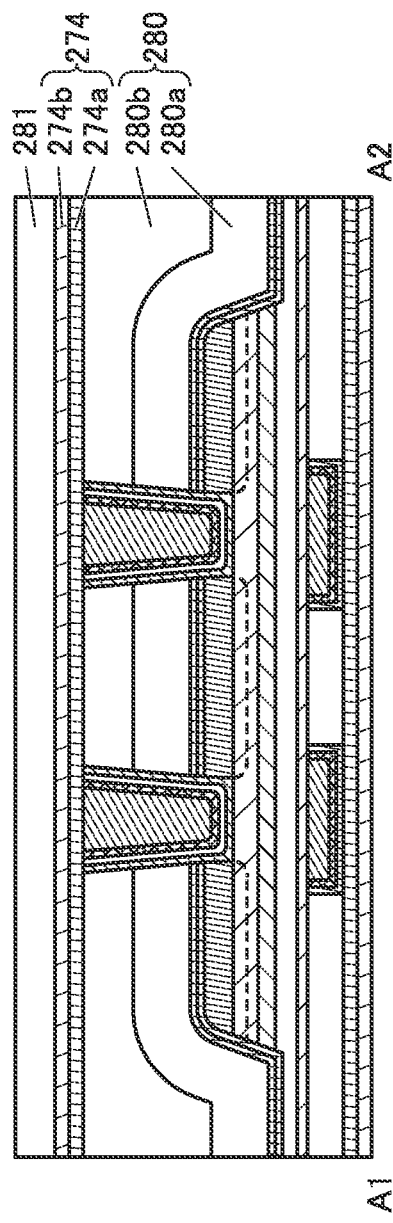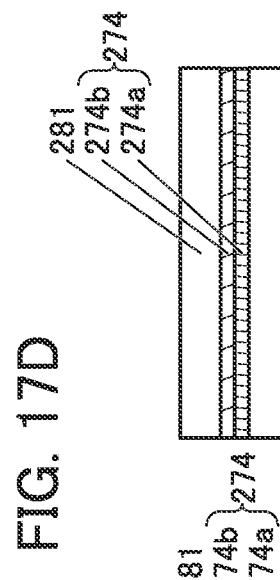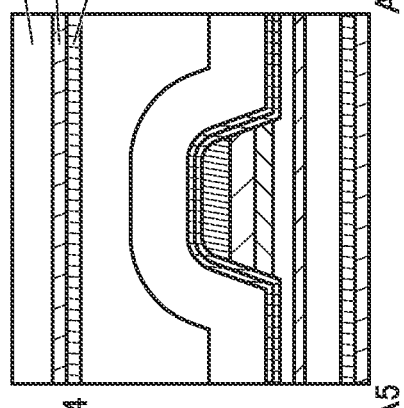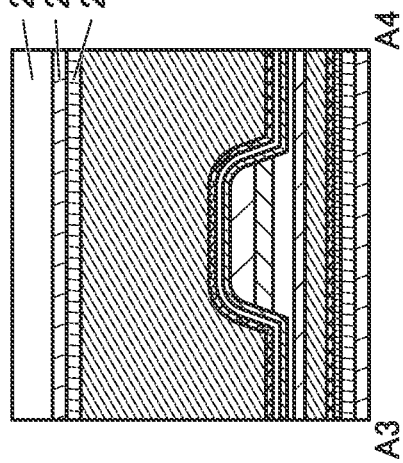
FIG. 17A
FIG. 17B
FIG. 17C
FIG. 17D

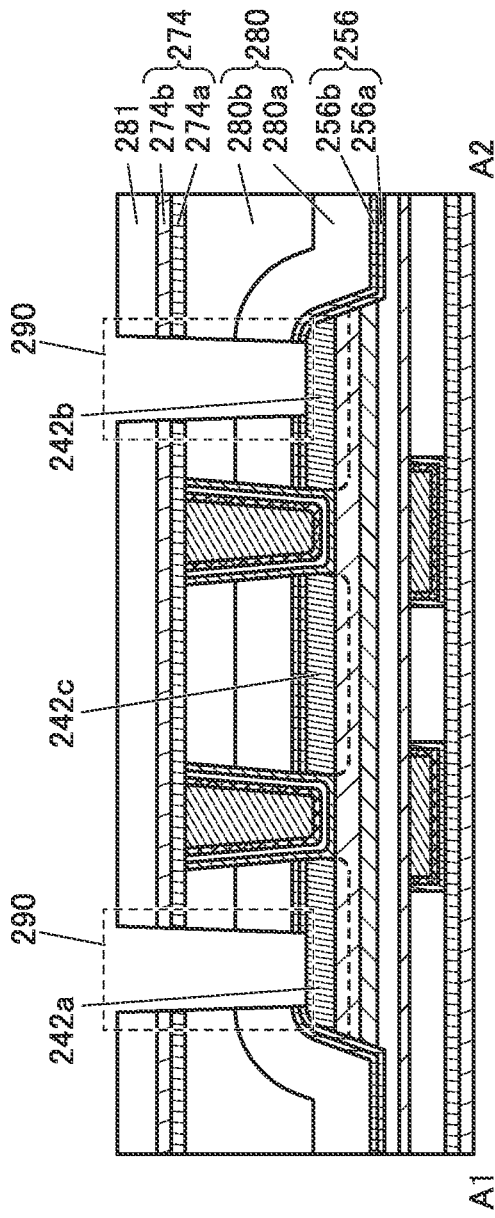
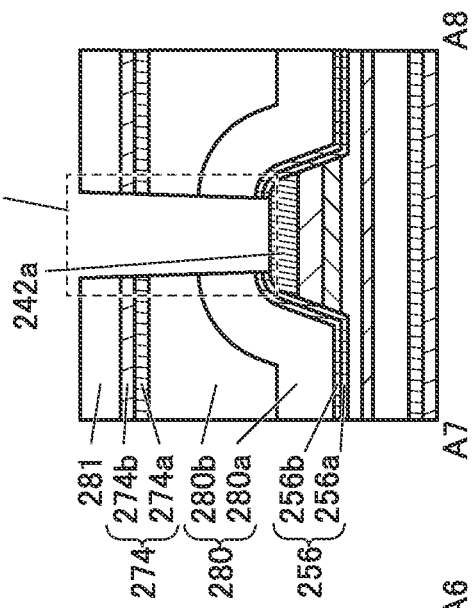
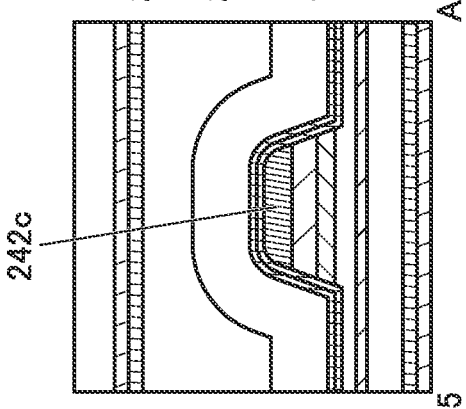
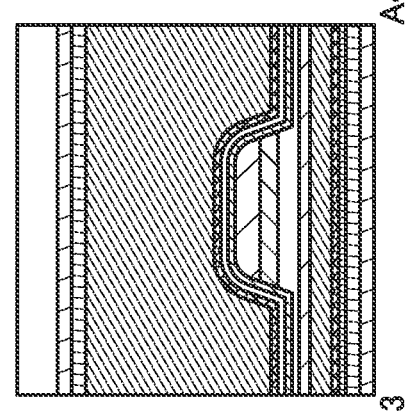

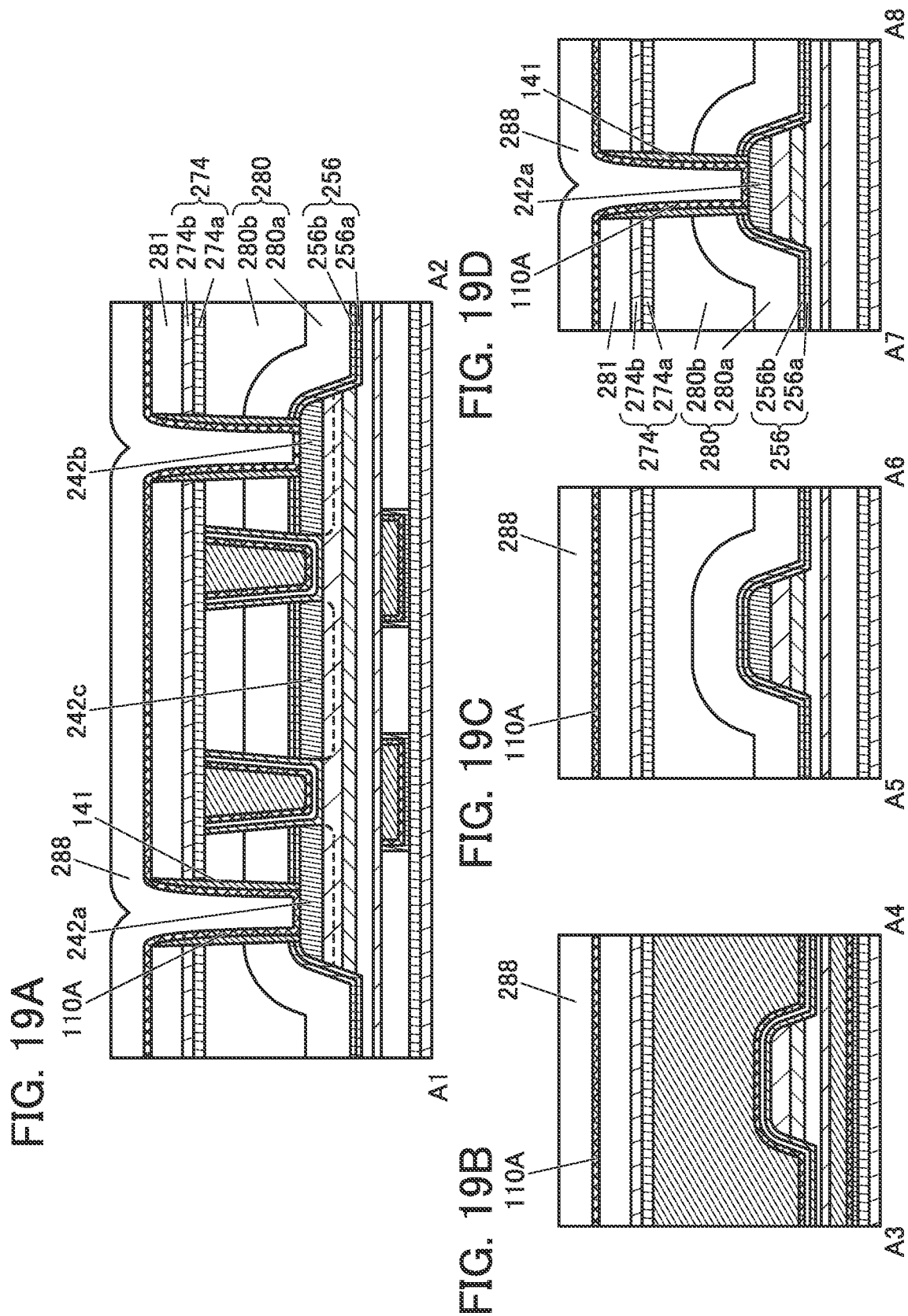

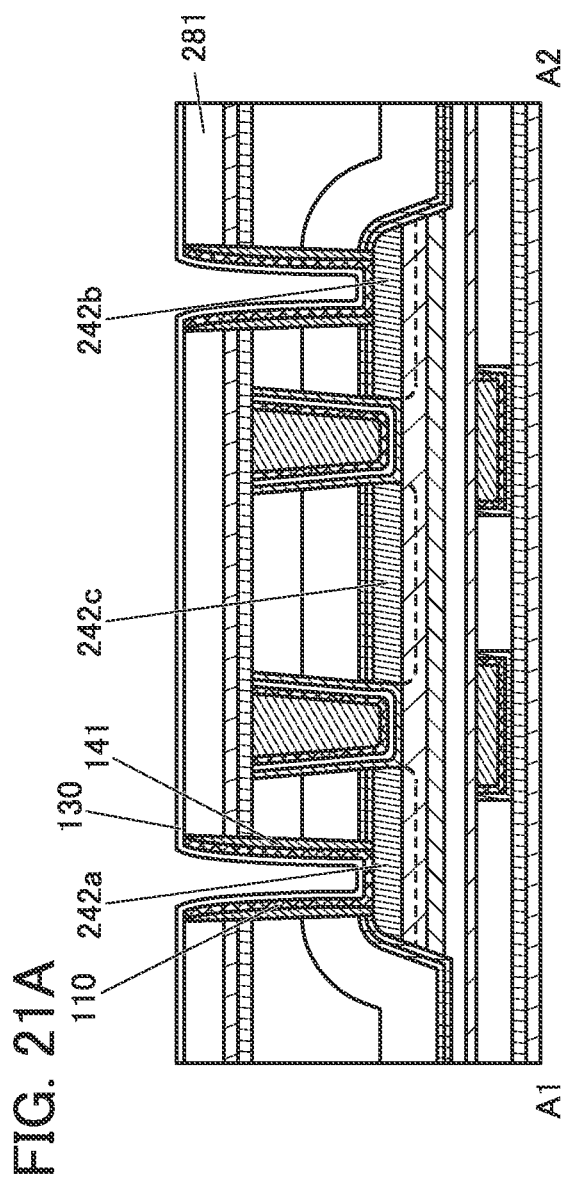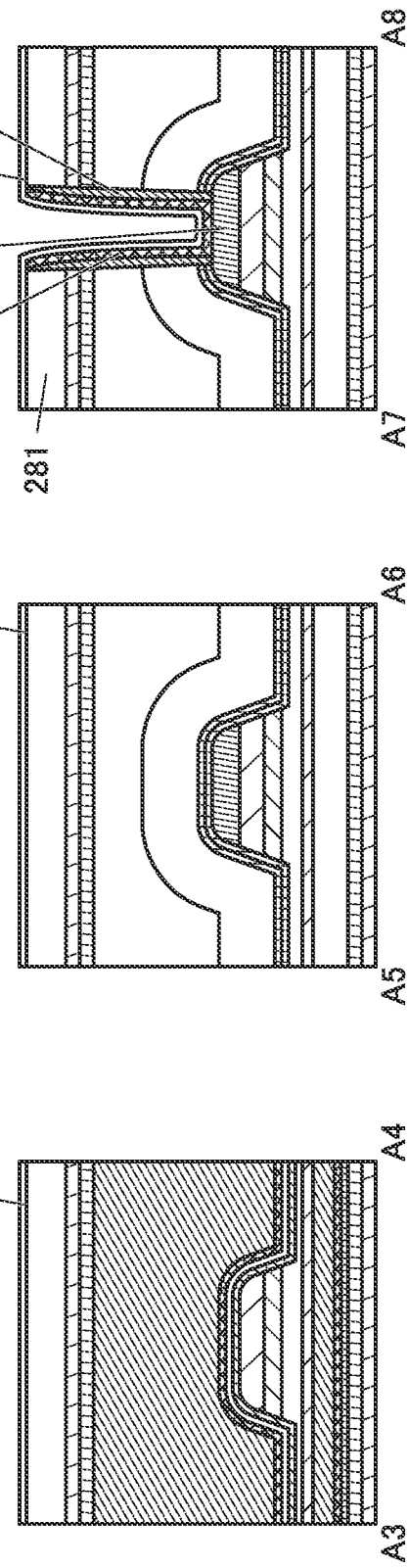

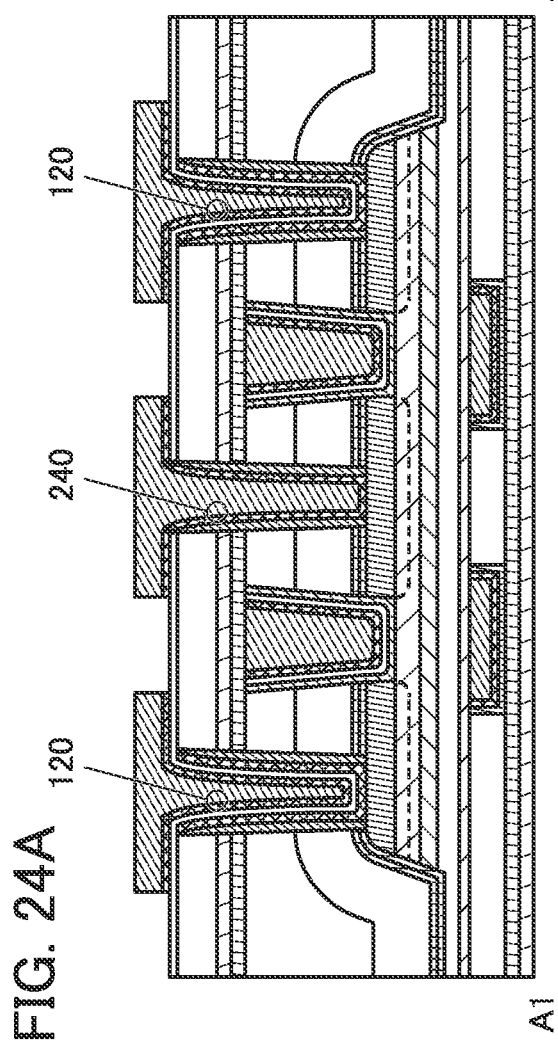
FIG. 24A
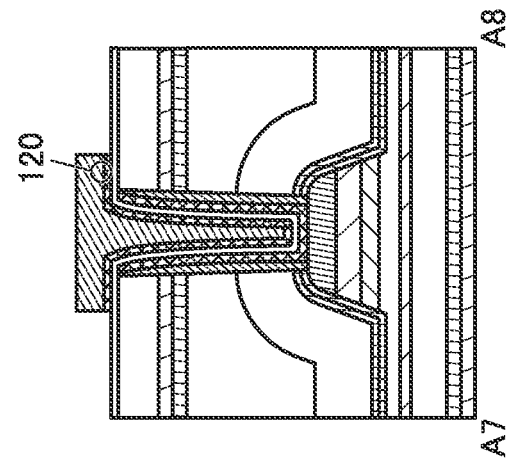
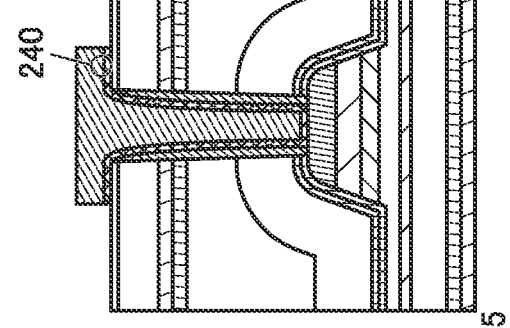
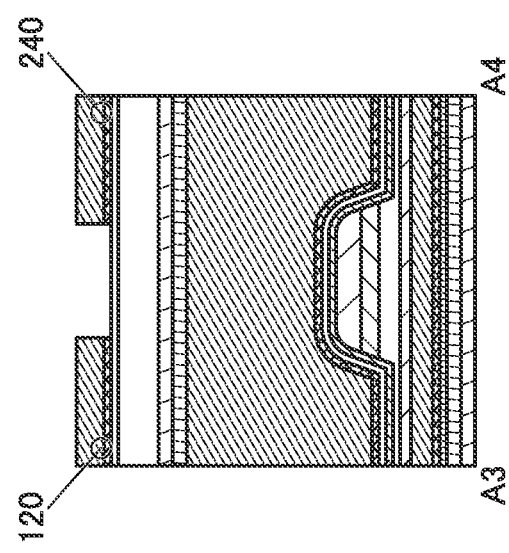
FIG. 24B

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed and an LSI, a CPU, and a memory are mainly used. A CPU is an aggregation of semiconductor elements in which an electrode which is a connection terminal is formed, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

In addition, a technique for forming a transistor by using a semiconductor thin film formed over a substrate having an insulating surface has attracted attention. The transistor is applied to a wide range of electronic devices such as an integrated circuit (IC) and an image display device (also simply referred to as a display device). A silicon-based semiconductor material is widely known as a material for a semiconductor thin film that can be used in a transistor, and as another material, an oxide semiconductor has attracted attention.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1).

Furthermore, a method for manufacturing a transistor using an oxide semiconductor in which a gate electrode is formed to be embedded in an opening portion is disclosed (see Patent Document 2).

In recent years, demand for an integrated circuit in which transistors and the like are integrated with high density has risen with reductions in the size and weight of an electronic device. Furthermore, the productivity of a semiconductor device including an integrated circuit is required to be improved.

REFERENCES

Patent Documents

[Patent Document 1] Japanese Published Patent Application No. 2012-257187
[Patent Document 2] Japanese Published Patent Application No. 2017-050530

SUMMARY OF THE INVENTION

Problems to be Solved by the Invention

An object of one embodiment of the present invention is to provide a semiconductor device that can be miniaturized or highly integrated. An object of one embodiment of the present invention is to provide a semiconductor device having favorable electrical characteristics. An object of one embodiment of the present invention is to provide a semiconductor device having favorable frequency characteristics. An object of one embodiment of the present invention is to provide a semiconductor device with favorable reliability. An object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device in which power consumption can be reduced. An object of one embodiment of the present invention is to provide a novel semiconductor device.

Note that the descriptions of these objects do not disturb the existence of other objects. Note that one embodiment of the present invention does not necessarily achieve all of these objects. Objects other than these are apparent from the description of the specification, the drawings, the claims, and the like, and objects other than these can be derived from the description of the specification, the drawings, the claims, and the like.

Means for Solving the Problems

One embodiment of the present invention is a semiconductor device including an oxide; a first conductor and a second conductor provided apart from each other over the oxide; a third conductor including a region that is over the oxide and overlaps with a region between the first conductor and the second conductor; a first insulator over the third conductor; a fourth conductor that is electrically connected to the first conductor through a first opening provided in the first insulator; a second insulator that is provided over the first insulator and is provided over the fourth conductor in the first opening; a fifth conductor overlapping with the fourth conductor with the second insulator positioned therebetween in the first opening; and a sixth conductor electrically connected to the second conductor in a second opening provided in the first insulator and the second insulator. The fifth conductor and the sixth conductor are in contact with a top surface of the second insulator over the first insulator.

In the above, the fourth conductor, the second conductor, and the fifth conductor preferably form a capacitor.

In the above, the semiconductor device may include a third insulator, and the third insulator is preferably provided between the third conductor and the oxide, between the third conductor and the first conductor, and between the third conductor and the second conductor.

In the above, the third insulator is preferably in contact with the first insulator.

In the above, the fifth conductor and the sixth conductor preferably contain the same material.

In the above, the fifth conductor and the sixth conductor are preferably formed in the same step.

In the above, the oxide preferably contains indium, an element M (M is aluminum, gallium, yttrium, or tin), and zinc.

Effect of the Invention

According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device having favorable frequency characteristics can be provided. According to one embodiment of the present invention, a semiconductor device with favorable reliability can be provided. According to one embodiment of the present invention, a semiconductor device with high productivity can be provided.

A semiconductor device capable of retaining data for a long time can be provided. A semiconductor device capable of high-speed data writing can be provided. A semiconductor device with high design flexibility can be provided. A semiconductor device in which power consumption can be reduced can be provided. A novel semiconductor device can be provided.

Note that the descriptions of these effects do not disturb the existence of other effects. Note that one embodiment of the present invention does not necessarily have all of these effects. Effects other than these are apparent from the description of the specification, the drawings, the claims, and the like, and effects other than these can be derived from the description of the specification, the drawings, the claims, and the like.

BRIEF DESCRIPTION OF THE DRAWINGS

FIGS. 14A-14D Cross-sectional views illustrating a method for fabricating a semiconductor device of one embodiment of the present invention.

FIGS. 15A-15D Cross-sectional views illustrating a method for fabricating a semiconductor device of one embodiment of the present invention.

FIGS. 16A-16D Cross-sectional views illustrating a method for fabricating a semiconductor device of one embodiment of the present invention.

FIGS. 17A-17D Cross-sectional views illustrating a method for fabricating a semiconductor device of one embodiment of the present invention.

FIGS. 18A-18D Cross-sectional views illustrating a method for fabricating a semiconductor device of one embodiment of the present invention.

FIGS. 19A-19D Cross-sectional views illustrating a method for fabricating a semiconductor device of one embodiment of the present invention.

FIGS. 21A-21D Cross-sectional views illustrating a method for fabricating a semiconductor device of one embodiment of the present invention.

FIGS. 24A-24B Cross-sectional views illustrating a method for fabricating a semiconductor device of one embodiment of the present invention.

FIG. 26 FIGS. 26A-26B Schematic views of a semiconductor device of one embodiment of the present invention.

FIG. 27 FIGS. 27A-27E Schematic views of memory devices of one embodiment of the present invention.

FIG. 28 FIGS. 28A-28H Diagrams each illustrating an electronic device of one embodiment of the present invention.

MODE FOR CARRYING OUT THE INVENTION

Figure 1A:
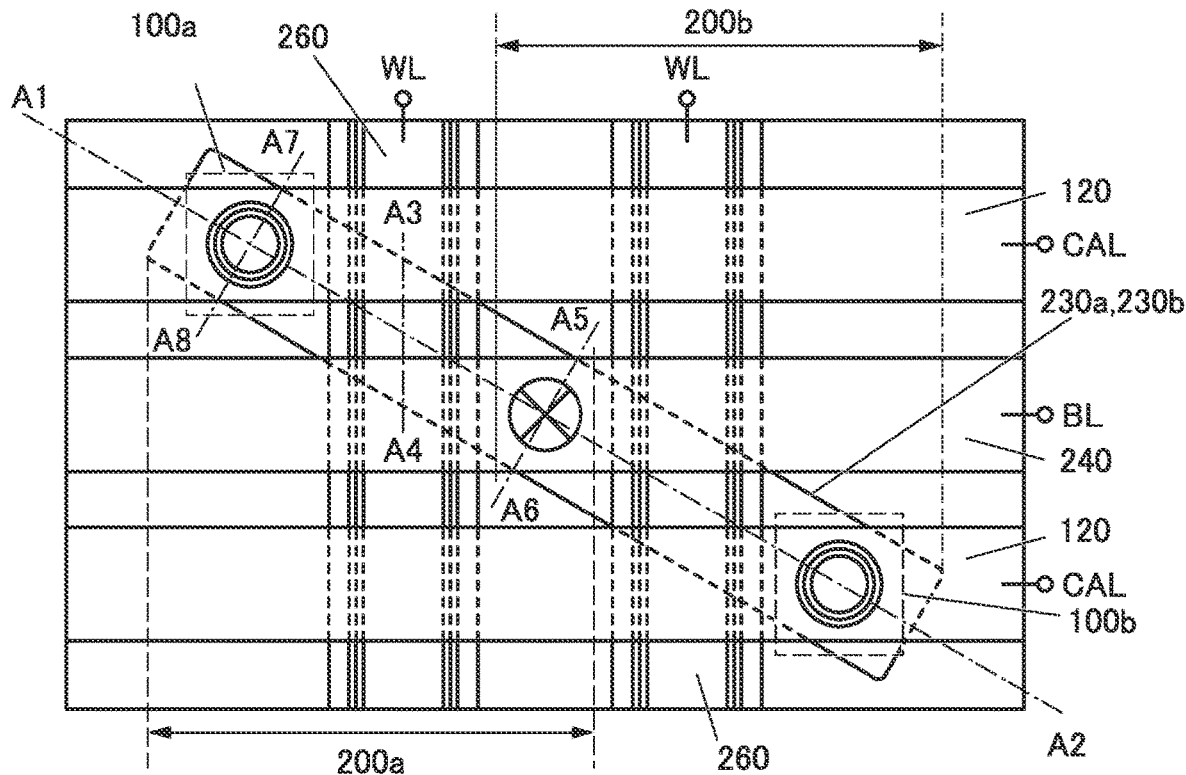
FIGS. 1A-1B A top view and a cross-sectional view of a semiconductor device of one embodiment of the present invention.

Hereinafter, embodiments are described with reference to drawings. However, the embodiments can be implemented with many different modes, and it is readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes, values, or the like shown in the drawings. For example, in an actual manufacturing process, a layer, a resist mask, or the like might be unintentionally reduced in size by treatment such as etching, which might not be reflected in the drawings for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y denote an object (e.g., a device, an element, a circuit, a wiring, an electrode, a terminal, a conductive film, or a layer).

Functions of a source and a drain might be switched when a transistor of opposite polarity is employed or a direction of current is changed in circuit operation. Therefore, the terms "source" and "drain" can be interchanged with each other in this specification and the like in some cases.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Furthermore, in this specification, the simple term "channel width" refers to an apparent channel width in some cases. Alternatively, in this specification, the simple term "channel width" refers to effective channel width in some cases. Note that the values of a channel length, a channel width, an effective channel width, an apparent channel width, and the like can be determined, for example, by analyzing a cross-sectional TEM image and the like.

Note that an impurity in a semiconductor refers to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies are formed by entry of impurities, for example. Furthermore, in the case where the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" or "orthogonal" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" or "substantially orthogonal" indicates a state where two straight lines are placed at an angle greater than or equal to 60° and less than or equal to 120°.

Note that in this specification, a barrier film means a film having a function of inhibiting passage of oxygen and impurities such as hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, it can also be referred to as a transistor including an oxide or an oxide semiconductor.

In this specification and the like, the term of normally off means that current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

An example of a semiconductor device including a transistor 200 of one embodiment of the present invention is described below.

<Structure Example of Semiconductor Device>

FIG. 1 and FIG. 2 are a top view and cross-sectional views of a semiconductor device including the transistor 200 and a capacitor 100 of one embodiment of the present invention and the periphery of the semiconductor device. Note that in this specification, the semiconductor device is referred to as a memory cell 600 in some cases.

Figure 1B:
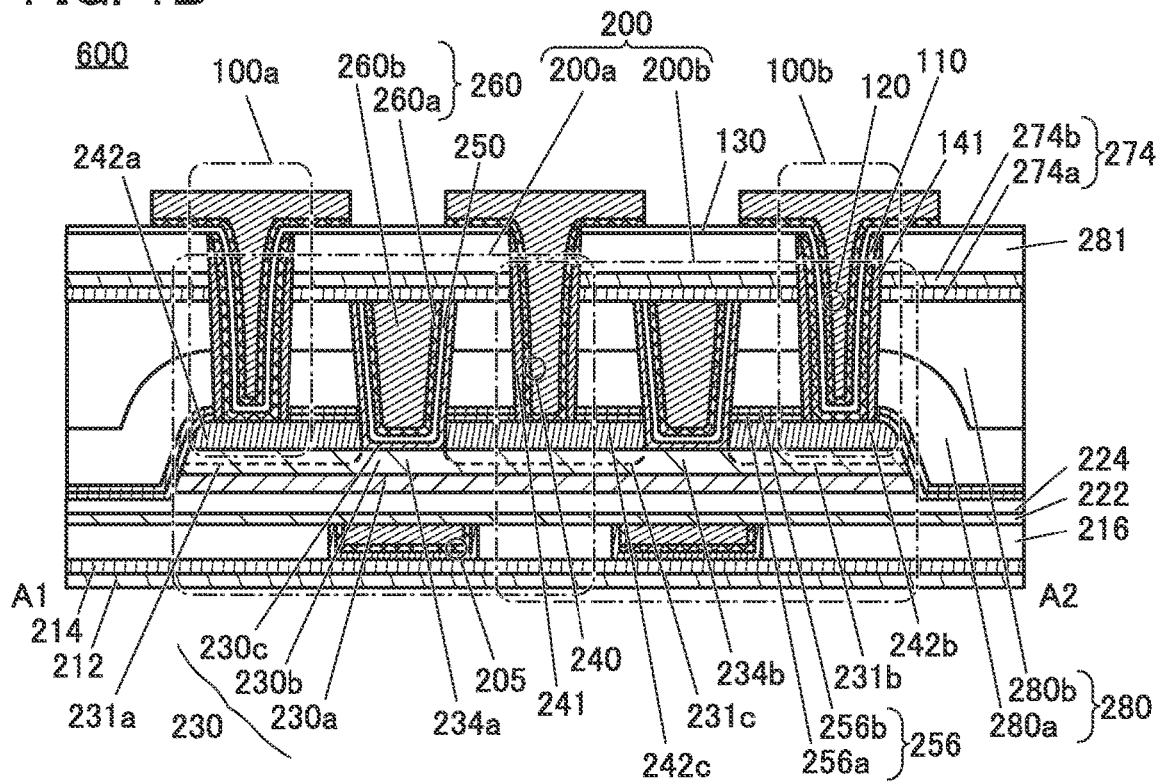
Figure 2A:
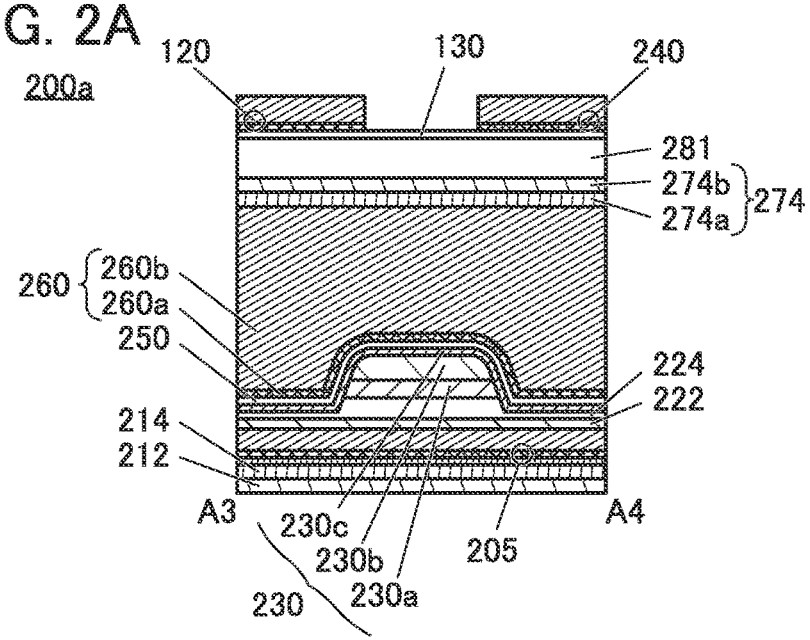
FIGS. 2A-2C Cross-sectional views of a semiconductor device of one embodiment of the present invention.
Figure 2B:
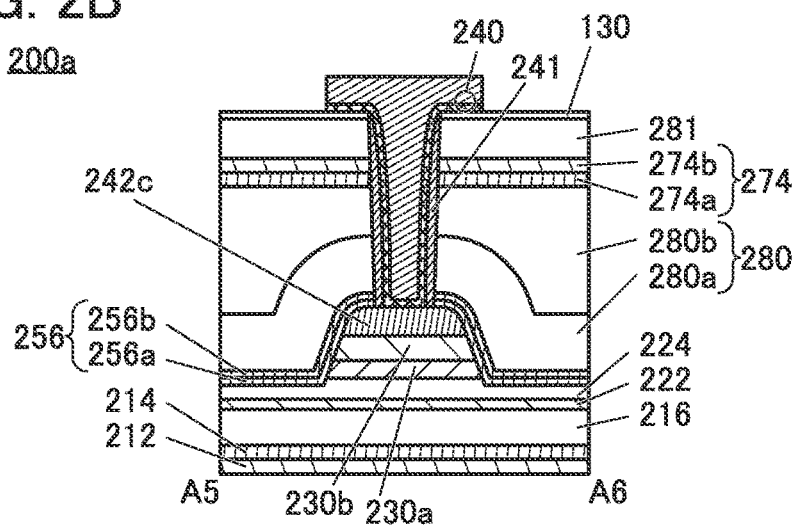
Figure 2C:
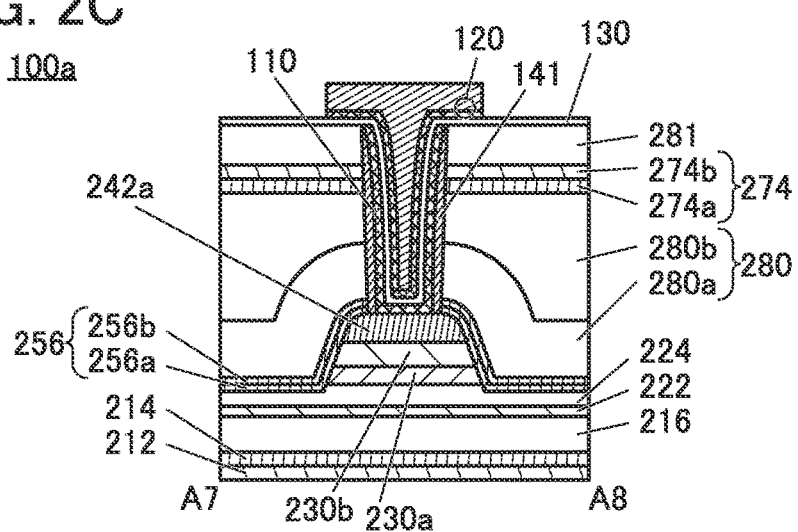

FIG. 1(A) is a top view of a semiconductor device including the transistor 200 and the capacitor 100. FIG. 1(B), FIG. 2(A), FIG. 2(B), and FIG. 2(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. Moreover, FIG. 2(A) is a cross-sectional view of a portion indicated by a dashed-dotted line A3-A4 in FIG. 1(A), and is a cross-sectional view of a channel formation region in the direction in which a conductor 260 extends. Note that FIG. 2(A) illustrates a cross section in the channel width direction of the transistor 200. Moreover, FIG. 2(B) is a cross-sectional view of a portion indicated by a dashed-dotted line A5-A6 in FIG. 1(A), and is a cross-sectional view of a connection portion between a conductor 242c and a conductor 240 functioning as a wiring BL. FIG. 2(C) is a cross-sectional view of a portion indicated by a dashed-dotted line A7-A8 in FIG. 1(A), and is a cross-sectional view of a connection portion between a capacitor 100a and a conductor 242a. Note that for simplification of the drawing, some components are not illustrated in the top view in FIG. 1(A).

The semiconductor device of one embodiment of the present invention includes the transistor 200, the capacitor 100 electrically connected to the transistor 200, and an insulator 212, an insulator 214, an insulator 280, an insulator 274, and an insulator 281 that function as interlayer films. The conductor 240 functioning as a plug and being electrically connected to the transistor 200 is also included.

Note that the transistor 200 includes the conductive layer 260 functioning as two gate electrodes in one semiconductor layer. In other words, the transistor 200 has a structure including a transistor 200a and a transistor 200b in one semiconductor layer. One of a source and a drain of the transistor 200a is shared with one of a source and a drain of the transistor 200b. Thus, as compared with the case where the transistor 200a and the transistor 200b are separately formed, the number of plugs connected to the transistor 200 can be reduced and the area of the transistor 200 can be small. The other of the source and the drain of the transistor 200a is electrically connected to the capacitor 100a, and the other of the source and the drain of the transistor 200b is electrically connected to a capacitor 100b.

Here, in this embodiment, the description of one of the transistor 200a and the transistor 200b is mainly made as the detailed description of the transistor 200 in some cases, and as long as there is no particular description, the description of the other of the transistor 200a and the transistor 200b is omitted because the transistor 200a and the transistor 200b have similar structures. Furthermore, in this specification, the transistor 200 refers to one or both of the transistor 200a and the transistor 200b.

Furthermore, in this embodiment, the description of one of the capacitor 100a and the capacitor 100b is mainly made as the detailed description of the capacitor 100 in some cases, and as long as there is no particular description, the description of the other of the capacitor 100a and the capacitor 100b is omitted because the capacitor 100a and the capacitor 100b have similar structures. Furthermore, in this specification, the capacitor 100 refers to one or both of the capacitor 100a and the capacitor 100b.

An insulator 241 may be provided in contact with an inner wall of an opening in an insulator 256, the insulator 280, the insulator 274, the insulator 281, and an insulator 130. At this time, the conductor 240 is provided in contact with the inner wall of the opening in the insulator 256, the insulator 280, the insulator 274, the insulator 281, and the insulator 130 with the insulator 241 positioned therebetween. A first conductor of the conductor 240 is formed in contact with the insulator 241, and a second conductor of the conductor 240 is formed on the inner side thereof. The characteristics and reliability of the semiconductor device can be improved when the insulator 241 is provided; however, it does not always need to be provided. Note that although the transistor 200 having a structure in which the first conductor of the conductor 240 and the second conductor of the conductor 240 are stacked is shown, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

An insulator 141 may be provided in contact with an inner wall of an opening in the insulator 256, the insulator 280, the insulator 274, and the insulator 281. At this time, the capacitor 100 is provided in contact with an inner wall of the opening in the insulator 256, the insulator 280, the insulator 274, and the insulator 281 with the insulator 141 positioned therebetween. A conductor 110 functioning as a lower electrode is formed in contact with the insulator 141, the insulator 130 is formed on the inner side of the conductor 110, and a conductor 120 functioning as an upper electrode is formed on the inner side of the insulator 130. The characteristics and reliability of the semiconductor device can be improved when the insulator 141 is provided; however, it does not always need to be provided. The conductor 120 is preferably formed using the same material as the conductor 240 at the same step as the conductor 240.

[Transistor 200]

As illustrated in FIG. 1, the transistor 200 includes the insulator 212 positioned over a substrate (not illustrated); the insulator 214 positioned over the insulator 212; an insulator 216 positioned over the insulator 214; a conductor 205 (a conductor 205a, a conductor 205b, and a conductor 205c) embedded in the insulator 216; an insulator 222 positioned over the insulator 216 and the conductor 205; an insulator 224 positioned over the insulator 222; an oxide 230a positioned over the insulator 224; an oxide 230b positioned over the oxide 230a; a conductor 242 (the conductor 242a, a conductor 242b, and the conductor 242c) positioned over the oxide 230b; the insulator 256 (an insulator 256a and an insulator 256b) covering the insulator 224, the oxide 230a, the oxide 230b, and the conductor 242; the insulator 280 (an insulator 280a and an insulator 280b) that is positioned over the insulator 256 and includes an opening portion; an oxide 230c that is provided in contact with a top surface and a side surface of the oxide 230b, a side surface of the oxide 230a, a side surface of the conductor 242, a side surface of the insulator 256, and a side surface of the insulator 280 in the opening portion; an insulator 250 on the inner side of the oxide 230c; a conductor 260a on the inner side of the insulator 250; and a conductor 260b provided on the inner side of the conductor 260a to be embedded.

Note that the insulator 274 is provided over the insulator 280, the oxide 230c, the insulator 250, the conductor 260a, and the conductor 260b, the insulator 281 is provided over the insulator 274, the insulator 130 is provided over the insulator 281, the opening is provided in the insulator 130, the insulator 281, the insulator 274, the insulator 280, and the insulator 256, the insulator 241 is provided on a side surface of the opening, and the conductor 240 is provided inside the opening in which the insulator 241 is provided.

Figure 3A:
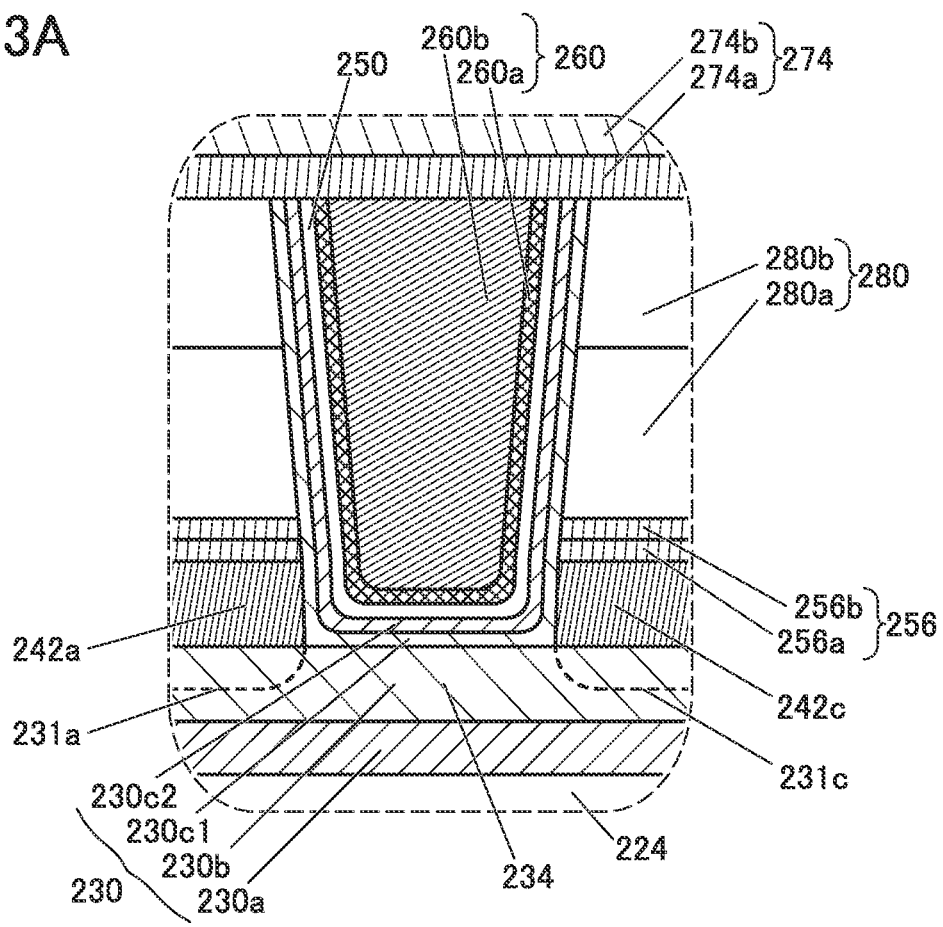
FIGS. 3A-3B Cross-sectional views of a semiconductor device of one embodiment of the present invention.
Figure 3B:
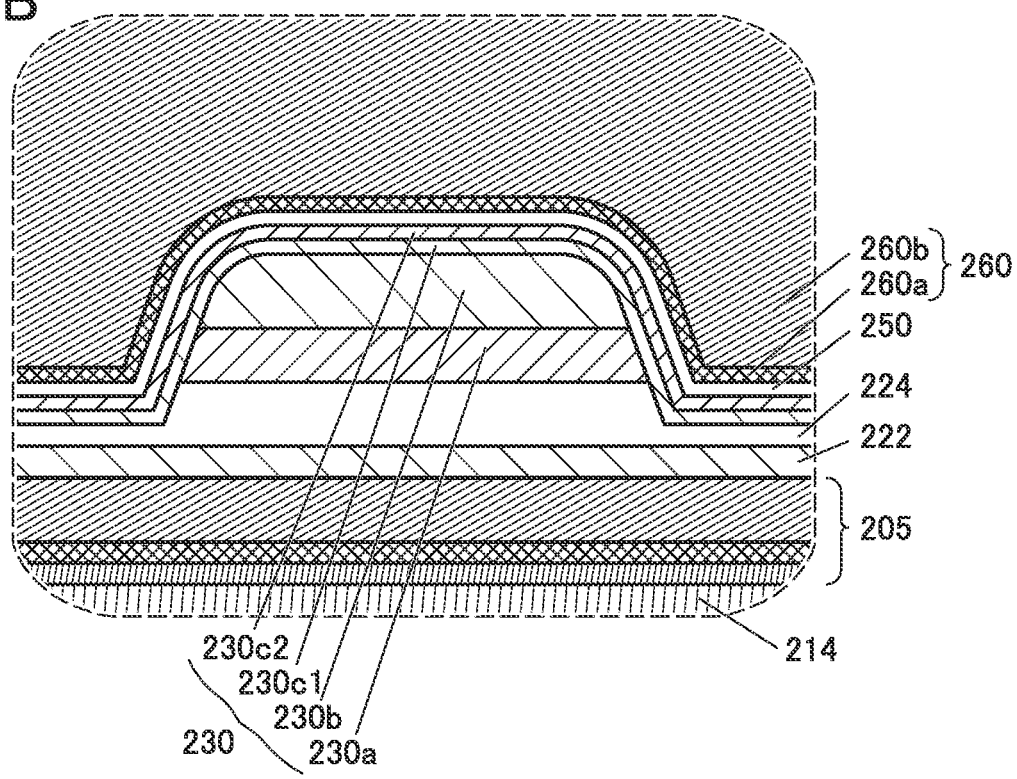

Note that the transistor 200 is shown to have the structure in which the oxide 230 has a three-layer stacked structure of the oxide 230a, the oxide 230b, and the oxide 230c in a region where a channel is formed (hereinafter also referred to as a channel formation region) and its vicinity; however, the present invention is not limited thereto. For example, the oxide 230 may have a single-layer structure of the oxide 230b, a two-layer structure of the oxide 230b and the oxide 230a, a two-layer structure of the oxide 230b and the oxide 230c, or a stacked-layer structure of four or more layers. Alternatively, each of the oxide 230a, the oxide 230b, and the oxide 230c may have a stacked-layer structure of two or more layers. FIG. 3(A) and FIG. 3(B) are enlarged views of the channel formation region of the transistor 200a and its vicinity illustrated in FIG. 1(B) and FIG. 2(A), respectively. FIG. 3(A) and FIG. 3(B) illustrate an example in which the oxide 230c has a stacked-layer structure of two layers of an oxide 230c1 and an oxide 230c2 over the oxide 230c1. Although FIG. 3(A) and FIG. 3(B) illustrate the enlarged views of the transistor 200a only, the transistor 200b has a structure similar to that of the transistor 200a. Moreover, the conductor 260 in the transistor 200 is shown to have a two-layer structure of the conductor 260a and the conductor 260b; however, the present invention is not limited thereto. For example, the conductor 260 may have a single-layer structure or a stacked-layer structure of three or more layers.

Here, the conductor 260 functions as a gate electrode of the transistor and the conductor 242a, the conductor 242b, and the conductor 242c function as source electrodes and drain electrodes. As described above, the conductor 260 is formed to be embedded in the opening in the insulator 280 and a region between the conductor 242a and the conductor 242c or a region between the conductor 242b and the conductor 242c with the oxide 230c and the insulator 250 therebetween. Here, the positions of the conductor 260, the conductor 242a, the conductor 242b, and the conductor 242c with respect to the openings in the insulator 280 are selected in a self-aligned manner. That is, the gate electrode can be positioned between the source electrode and the drain electrode in a self-aligned manner in the transistor 200. Therefore, the conductor 260 can be formed without an alignment margin, resulting in a reduction in the area occupied by the transistor 200. Accordingly, miniaturization and high integration of the semiconductor device can be achieved.

In addition, since the conductor 260 is formed in the region between the conductor 242a and the conductor 242c or the region between the conductor 242b and the conductor 242c in a self-aligned manner, the conductor 260 does not have a region overlapping the conductor 242a, the conductor 242b, or the conductor 242c. Thus, parasitic capacitance formed between the conductor 260 and each of the conductor 242a, the conductor 242b, and the conductor 242c can be reduced. As a result, the switching speed of the transistor 200 can be increased, and the transistor 200 can have high frequency characteristics.

In the transistor 200, a metal oxide functioning as an oxide semiconductor (hereinafter also referred to as an oxide semiconductor) is preferably used as the oxide 230 (the oxide 230a, the oxide 230b, and the oxide 230c), which includes a channel formation region.

The transistor 200 using an oxide semiconductor in a channel formation region has an extremely low leakage current in a non-conduction state; thus, a semiconductor device with low power consumption can be provided. An oxide semiconductor can be deposited by a sputtering method, an ALD (Atomic Layer Deposition) method, or the like, and thus can be used for the transistor 200 included in a highly integrated semiconductor device.

For example, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used as the oxide 230. Furthermore, an In—Ga oxide or an In—Zn oxide may be used as the oxide 230.

Here, the oxide 230 might have increased carrier density to have reduced resistance when impurities such as hydrogen, nitrogen, and a metal element exist therein. Furthermore, the oxide 230 might have increased carrier density to have reduced resistance when the oxygen concentration thereof decreases.

When the conductor 242 (the conductor 242a, the conductor 242b, and the conductor 242c) that is provided over and in contact with the oxide 230 and functions as the source electrode and the drain electrode has a function of absorbing oxygen in the oxide 230 or has a function of supplying impurities such as hydrogen, nitrogen, or a metal element to the oxide 230, a region 231 (a region 231a, a region 231b, and a region 231c) is partly formed in the oxide 230 as a low-resistance region in some cases.

The insulator 256 (the insulator 256a and the insulator 256b) is provided to inhibit the oxidation of the conductor 242. Thus, the insulator 256 does not always need to be provided in the case where the conductor 242 is an oxidation-resistant material or a material that does not significantly lose its conductivity even after absorbing oxygen. The insulator 256 covers the side surfaces of the oxide 230a and the oxide 230b and is in contact with the insulator 224 or the insulator 222, so that entry of impurities such as hydrogen or water into the oxide 230a and the oxide 230b and release of oxygen from the oxide 230a and the oxide 230b can be inhibited.

As illustrated in FIG. 1(B), the conductor 242 is provided over and in contact with the oxide 230, and the region 231 (the region 231a, the region 231b, and the region 231c) is formed as a low-resistance region at and near the interface between the oxide 230 and the conductor 242. The oxide 230 includes a region 234 (a region 234a and a region 234b) functioning as the channel formation region of the transistor 200. Note that the region 234a and the region 234b function as the channel formation regions of the transistor 200a and the transistor 200b, respectively.

The region 231 serves as a source region or a drain region. The region 231 has an increased carrier concentration and a lowered resistance because it has a lower oxygen concentration or contains more impurities such as hydrogen, nitrogen, and a metal element than the region 234. In other words, the region 231 is a region having higher carrier density and lower resistance than the region 234. The region 234 functioning as the channel formation region is a high-resistance region with a low carrier density because it has a higher oxygen concentration or a lower impurity concentration than the region 231.

Note that in the case where the region 231, which is a low-resistance region, contains a metal element, the region 231 preferably contains any one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum in addition to the metal element contained in the oxide 230.

Although the region 231 is formed near the interface of the oxide 230b with the conductor 242 in the thickness direction of the oxide 230b in FIG. 1(B), one embodiment of the present invention is not limited thereto. For example, the region 231 may have substantially the same thickness as the oxide 230b or may also be formed in the oxide 230a.

In the oxide 230, the boundaries between the regions are difficult to be clearly observed in some cases. The concentration of a metal element and an impurity element such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

To selectively reduce the resistance of the oxide 230, as the conductor 242, for example, a material that contains at least one of an impurity and metal elements that increase conductivity such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum is preferably used. Alternatively, a conductive film 242A to be the conductor 242 is formed using a material, a deposition method, or the like that injects impurities such as an element that forms oxygen vacancies or an element trapped by oxygen vacancies into the oxide 230. Examples of the element contain hydrogen, boron, carbon, nitrogen, fluorine, phosphorus, sulfur, chlorine, and a rare gas. Typical examples of the rare gas are helium, neon, argon, krypton, and xenon.

Here, a transistor using an oxide semiconductor is likely to have its electrical characteristics changed by impurities and oxygen vacancies in the region of the oxide semiconductor where a channel is formed, which may affect the reliability. Moreover, when the region of the oxide semiconductor where a channel is formed includes oxygen vacancies, the transistor tends to have normally-on characteristics. Thus, oxygen vacancies in the region 234 where a channel is formed are preferably reduced as much as possible.

To inhibit the transistor from becoming normally on, the insulator 250 near the oxide 230 preferably contains oxygen more than oxygen in the stoichiometric composition (also referred to as excess oxygen). Oxygen in the insulator 250 is diffused into the oxide 230 to reduce oxygen vacancies in the oxide 230 and can inhibit the transistor from becoming normally on.

That is, excess oxygen in the insulator 250 is diffused into the region 234 of the oxide 230, whereby oxygen vacancies in the region 234 of the oxide 230 can be reduced.

It is preferable to provide the insulator 212, the insulator 214, the insulator 222, the insulator 256, the insulator 274, and the like to inhibit diffusion of oxygen contained in the oxide 230 and the insulator 250 to the outside of the transistor 200. For those insulators, a material that does not easily pass oxygen is preferably used. For example, an oxide containing one of aluminum and hafnium or a nitride of silicon can be used. Moreover, a metal oxide that can be used for the oxide 230a or the oxide 230c2, that is, a metal oxide such as an indium-gallium-zinc oxide in which the concentration of In is reduced or a metal oxide not containing In can be used. Furthermore, those insulators are preferably a material that does not easily pass impurities such as hydrogen, water, nitrogen, and a metal element. The use of such a material can inhibit entry of impurities from the outside of the transistor 200 into the transistor 200.

An oxide semiconductor can be deposited by a sputtering method, an ALD method, or the like, and thus can be used for a transistor included in a highly integrated semiconductor device. The transistor using an oxide semiconductor in a channel formation region has an extremely low leakage current (off-state current) in a non-conduction state; thus, a semiconductor device with low power consumption can be provided.

Accordingly, a semiconductor device including a transistor with a high on-state current can be provided. A semiconductor device including a transistor with a low off-state current can be provided. A semiconductor device that has reduced variation in electrical characteristics, stable electrical characteristics, and improved reliability can be provided.

The structure of the semiconductor device including the transistor 200 of one embodiment of the present invention is described in detail below.

As illustrated in FIG. 1(A) and FIG. 2(A), the conductor 205 extends in the channel width direction, and is positioned to overlap with the oxide 230 and the conductor 260. Furthermore, as illustrated in FIG. 1(B), the conductor 205 is preferably provided to be embedded in the insulator 216.

The conductor 260 sometimes functions as a first gate (also referred to as a top gate) electrode. The conductor 205 sometimes functions as a second gate (also referred to as a bottom gate) electrode. In that case, the Vth of the transistor 200 can be controlled by changing a potential applied to the conductor 205 independently of a potential applied to the conductor 260. In particular, the Vth of the transistor 200 can be higher than 0 V and the off-state current can be reduced by applying a negative potential to the conductor 205. Thus, a drain current when a potential applied to the conductor 260 is 0 V can be smaller in the case where a negative potential is applied to the conductor 205 than in the case where the negative potential is not applied to the conductor 205.

Note that as illustrated in FIG. 1(B) and FIG. 2(A), the conductor 205 is positioned to overlap with the oxide 230 and the conductor 260. The conductor 205 is preferably provided larger than the region 234 of the oxide 230. As illustrated in FIG. 2(A), it is particularly preferable that the conductor 205 extend to an outer region than an end portion of the region 234 of the oxide 230 that intersects with the channel width direction. That is, the conductor 205 and the conductor 260 preferably overlap with each other with the insulators therebetween on an outer side of the side surface of the oxide 230 in the channel width direction.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region in the region 234 can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

Although details are described later, as the conductor 205, the conductor 205a is formed in contact with an inner wall of an opening in the insulator 216, the conductor 205b is formed on the inner side of the conductor 205a, and the conductor 205c is formed on the inner side of the conductor 205b. Here, the top surfaces of the conductor 205a, the conductor 205b, and the conductor 205c can be substantially level with the top surface of the insulator 216. Although the transistor 200 having a structure in which the conductor 205a, the conductor 205b, and the conductor 205c are stacked is shown, the present invention is not limited thereto. For example, the conductor 205 may have a single-layer structure, a stacked-layer structure of two layers, or a stacked-layer structure of four or more layers. In the case where a structure body has a stacked-layer structure, layers may be distinguished by ordinal numbers corresponding to the formation order.

Here, for one or both the conductor 205a and the conductor 205b, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom (through which the impurities are less likely to pass). Alternatively, it is preferable to use a conductive material that has a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and oxygen.

When one or both of the conductor 205a and the conductor 205b has/have a function of inhibiting diffusion of oxygen, a reduction in the conductivity of the conductor 205c due to oxidation can be inhibited. As a conductive material having a function of inhibiting diffusion of oxygen, for example, tantalum, tantalum nitride, titanium, titanium nitride, ruthenium, ruthenium oxide, or the like is preferably used. Thus, each of the conductor 205a and the conductor 205b may be formed using a conductive material selected from the above. Accordingly, impurities such as hydrogen and water can be inhibited from diffusing to the transistor 200 side through the conductor 205.

For the conductor 205c, a material having higher conductivity than the conductor 205a and the conductor 205b is preferably used, and a conductive material whose main component is tungsten, copper, or aluminum is preferably used.

Each of the insulator 212 and the insulator 214 preferably functions as a barrier insulating film that inhibits impurities such as water or hydrogen from entering the transistor 200 from the substrate side. Accordingly, for the insulator 212 and the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (through which the above impurities are less likely to pass). Alternatively, it is preferable to use an insulating material having a function of inhibiting diffusion of oxygen (e.g., at least one of an oxygen atom, an oxygen molecule, and the like) (through which the oxygen is less likely to pass).

For the insulator 212 and the insulator 214, aluminum oxide, hafnium oxide, silicon nitride, or the like can be used. Moreover, a metal oxide that can be used for the oxide 230a or the oxide 230c2, that is, a metal oxide such as an indium-gallium-zinc oxide in which the concentration of In is reduced or a metal oxide not containing In can be used. For example, it is preferable that the insulator 212 be formed using silicon nitride or the like, and the insulator 214 be formed using aluminum oxide or the like. Accordingly, impurities such as hydrogen and water can be inhibited from diffusing to the transistor 200 side from the substrate side through the insulator 212 and the insulator 214. Alternatively, oxygen contained in the insulator 216, the insulator 224, or the like can be inhibited from diffusing to the substrate side through the insulator 212 and the insulator 214.

The insulator 216, the insulator 280, and the insulator 281 that function as interlayer films preferably have lower permittivity than the insulator 212 or the insulator 214. When a material with a low permittivity is used for an interlayer film, the parasitic capacitance generated between wirings can be reduced.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 216, the insulator 280, and the insulator 281. Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

The insulator 222, the insulator 224, and the insulator 250 each have a function of a gate insulator.

Here, as the insulator 224, an insulator that contains oxygen more than oxygen in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced and the reliability of the transistor 200 can be improved.

As the insulator including an excess-oxygen region, specifically, an insulator that releases part of oxygen by heating is preferably used. An insulator that releases oxygen by heating is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used as the insulator 224. Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

In the case where the insulator 224 includes an excess-oxygen region, it is preferable that the insulator 222 have a function of inhibiting diffusion of oxygen (e.g., at least one of an oxygen atom, an oxygen molecule, and the like) (through which the oxygen is less likely to pass).

When the insulator 222 has a function of inhibiting diffusion of oxygen or impurities, oxygen contained in the oxide 230 is not diffused to the insulator 216 side, which is preferable. Furthermore, the conductor 205 can be inhibited from reacting with oxygen contained in the insulator 224 or the oxide 230.

For example, a single layer or a stacked layer of an insulator containing a what is called high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) is preferably used as the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (through which the oxygen is less likely to pass). As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

Note that the insulator 222, and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. When the oxide 230a is provided under the oxide 230b, impurities can be inhibited from being diffused into the oxide 230b from the structure bodies formed below the oxide 230a. Moreover, when the oxide 230c is provided over the oxide 230b, impurities can be inhibited from being diffused into the oxide 230b from the structure bodies formed above the oxide 230c.

Note that the oxide 230 preferably has a stacked-layer structure of oxides which differ in the atomic ratio of metal elements. Specifically, the atomic proportion of the element M in constituent elements in the metal oxide used as the oxide 230a is preferably greater than the atomic proportion of the element M in constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum is gradually varied at a junction region of the oxide 230a, the oxide 230b, and the oxide 230c. In other words, the energy level of the conduction band minimum at a junction region of each of the oxide 230a, the oxide 230b, and the oxide 230c is continuously varied or continuously connected. To obtain this, the densities of defect states in mixed layers formed at an interface between the oxide 230a and the oxide 230b and an interface between the oxide 230b and the oxide 230c are preferably made low.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure including the oxide 230c1 and the oxide 230c2 over the oxide 230c1 include a stacked-layer structure of In:Ga:Zn=4:2:3 [atomic ratio] as the oxide 230c1 and In:Ga:Zn=1:3:4 [atomic ratio] as the oxide 230c2, a stacked-layer structure of In:Ga:Zn=4:

2:3 [atomic ratio] as the oxide 230c1 and Ga:Zn=2:1 [atomic ratio] as the oxide 230c2, a stacked-layer structure of In:Ga:Zn=4:2:3 [atomic ratio] as the oxide 230c1 and Ga:Zn=2:5 [atomic ratio] as the oxide 230c2, and a stacked-layer structure of In:Ga:Zn=4:2:3 [atomic ratio] as the oxide 230c1 and gallium oxide as the oxide 230c2.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics. Note that in the case where the oxide 230c has a stacked-layer structure, not only the above effect of reducing the density of defect states at the interface between the oxide 230b and the oxide 230c but also the effect of inhibiting diffusion of a constituent element contained in the oxide 230c to the insulator 250 side should be obtained. More specifically, the oxide 230c has a stacked-layer structure and an oxide containing no In or having a reduced In concentration is positioned in an upper portion of the stacked-layer structure, so that possible diffusion of In to the insulator 250 side can be inhibited. Since the insulator 250 functions as the gate insulator, the transistor has defects in characteristics when In diffuses. Thus, when the oxide 230c has a stacked-layer structure, a highly reliable semiconductor device can be provided.

When the oxide 230c has a stacked-layer structure, the interface between the oxide 230b and the oxide 230c1 and its vicinity may serve as a main carrier path.

Since the oxide 230c1 is in contact with the side surface of the insulator 280, oxygen contained in the insulator 280 can be supplied to the channel formation region of the transistor 200 through the oxide 230c1. For the oxide 230c2, a material through which oxygen is less likely to pass is preferably used. The use of the above material can inhibit absorption of oxygen contained in the insulator 280 into the insulator 250 or the conductor 260 through the oxide 230c1 and the oxide 230c2; as a result, oxygen can be efficiently supplied to the channel formation region.

The oxide 230 includes the region 231 and the region 234. At least part of each region 231 includes a region in contact with the conductor 242.

When the transistor 200 is turned on, the region 231a, the region 231b, or the region 231c functions as the source region or the drain region. At least part of the region 234 functions as the region where the channel is formed.

That is, through appropriate selection of the areas of the regions, a transistor having electrical characteristics necessary for a circuit design can be easily provided.

As the oxide 230, a metal oxide functioning as an oxide semiconductor (hereinafter also referred to as an oxide semiconductor) is preferably used. For example, as a metal oxide to be the region 234, a metal oxide having a band gap of 2 eV or more, preferably 2.5 eV or more, is preferably used. With the use of a metal oxide having such a wide band gap, the off-state current of the transistor can be reduced.

A transistor using an oxide semiconductor has an extremely low off-state leakage current; thus, a semiconductor device with low power consumption can be provided. An oxide semiconductor can be deposited by a sputtering method or the like, and thus can be used for a transistor included in a highly integrated semiconductor device.

The conductor 242 (the conductor 242a, the conductor 242b, and the conductor 242c) functioning as the source electrodes and the drain electrodes is provided over the oxide 230b. For the conductor 242, an alloy containing any of the above metal elements, an alloy containing any of the above metal elements in combination, or the like is preferably used. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the oxide 230, the oxygen concentration in the region 231 sometimes decreases. In addition, a metal compound layer that contains the metal contained in the conductor 242 and the component of the oxide 230 is sometimes formed in the region 231. In such a case, the carrier density of the region 231 increases, and the region 231 becomes a low-resistance region.

Here, the region between the conductor 242a and the conductor 242c and the region between the conductor 242b and the conductor 242c are formed to overlap with the openings in the insulator 280. In this manner, the conductor 260 can be formed in a self-aligned manner between the conductor 242a and the conductor 242c and between the conductor 242b and the conductor 242c.

The insulator 256 is provided to cover the conductor 242 and inhibits oxidation of the conductor 242. At this time, the insulator 256 may be provided to cover a side surface of the oxide 230 and to be in contact with the insulator 224.

A metal oxide containing one or more kinds selected from hafnium, aluminum, gallium, yttrium, zirconium, tungsten, titanium, tantalum, nickel, germanium, magnesium, and the like can be used as the insulator 256. Moreover, for the insulator 256, a metal oxide that can be used for the oxide 230a or the oxide 230c2, that is, a metal oxide such as an indium-gallium-zinc oxide in which the concentration of In is reduced or a metal oxide not containing In may be used.

It is particularly preferable to use an insulator containing an oxide of one or both of aluminum and hafnium such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 256 is not an essential component when the conductor 242 is an oxidation-resistant material or does not significantly lose its conductivity even after absorbing oxygen. Design is appropriately determined in consideration of required transistor characteristics.

The insulator 256 may have a stacked-layer structure including the insulator 256a and the insulator 256b over the insulator 256a. At this time, the insulator 256a and the insulator 256b may be formed using different materials. Furthermore, the insulator 256a and the insulator 256b can be formed by different methods. For example, aluminum oxide formed by a sputtering method may be used for the insulator 256a, and aluminum oxide formed by an ALD method may be used for the insulator 256b.

The insulator 280 is provided over the insulator 256. The insulator 280 preferably contains, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable. The insulator 280 preferably contains a larger amount of oxygen so that oxygen contained in the insulator 280 is supplied to the oxide 230$b$ through the oxide 230$c$ (the oxide 230$c$1 in the case where the oxide 230$c$ has a stacked-layer structure), and preferably contains more oxygen than that in the stoichiometric ratio, for example. To increase the concentration of oxygen contained in the insulator 280, a deposition gas used for forming the insulator 280 preferably contains oxygen.

The concentration of impurities such as water and hydrogen in the insulator 280 is preferably reduced. In addition, the insulator 280 may have a stacked-layer structure of two or more layers. In addition, a top surface of the insulator 280 may be planarized. Moreover, the insulator 280 preferably has a low hydrogen concentration and includes an excess-oxygen region or excess oxygen, and may be formed using a material similar to that for the insulator 216, for example.

Although FIG. 1(B) shows the insulator 280 having a two-layer structure of the insulator 280$a$ and the insulator 280$b$, the insulator 280 may have a single-layer structure or a stacked-layer structure of three or more layers.

The insulator 280$a$ is provided over the insulator 256, and the insulator 280$b$ is provided over the insulator 280$a$. At that time, a top surface of the insulator 280$a$ is preferably planarized.

For example, the insulator 280$a$ and the insulator 280$b$ are preferably formed using an insulating material including an excess oxygen region or an insulating material in which an excess oxygen region can be easily formed. Specifically, silicon oxide deposited by a sputtering method is used as the insulator 280$a$ and silicon oxynitride deposited by a CVD method is used as the insulator 280$b$. The thickness of the insulator 280$a$ is preferably within the range of 30 nm to 100 nm, further preferably within the range of 40 nm to 80 nm. Such a stacked structure of two layers can improve the coverage of the insulator 280.

It is preferable that an insulating material including an excess-oxygen region or an insulating material in which an excess-oxygen region is likely to be formed be used as the insulator 280$a$, and an insulating material that is likely to form an excess-oxygen region in the film on which the material is formed be used as the insulator 280$b$. Specifically, silicon oxide deposited by a sputtering method is used as the insulator 280$a$, and aluminum oxide deposited by a sputtering method is used as the insulator 280$b$. The structure in which such two layers are stacked can efficiently supply excess oxygen contained in the insulator 280$a$ to the oxide 230.

As illustrated in FIG. 1(B) and FIG. 2(A), the oxide 230$c$ is provided in contact with the top surface of the oxide 230$b$, the side surface of the oxide 230$b$, the side surface of the oxide 230$a$, the side surface of the conductor 242, the side surface of the insulator 256, and the side surface of the insulator 280.

The insulator 250 functions as a gate insulator. The insulator 250 is preferably positioned in contact with the inner side (the top surface and the side surface) of the oxide 230$c$. The insulator 250 is preferably formed using an insulator from which oxygen is released by heating. For example, it is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS analysis. Note that the temperature of the film surface in the TDS analysis is preferably within the range of 100° C. to 700° C., or 100° C. to 400° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 250 in contact with the top surface of the oxide 230$c$, oxygen can be efficiently supplied from the insulator 250 to the region 234 of the oxide 230$b$ through the oxide 230$c$. Furthermore, as in the insulator 224, the concentration of impurities such as water or hydrogen in the insulator 250 is preferably reduced. The thickness of the insulator 250 is preferably within the range of 1 nm to 20 nm.

Although the conductor 260 functioning as the first gate electrode has a two-layer structure in FIG. 1(B), a single-layer structure or a stacked-layer structure of three or more layers may be employed. For example, when the conductor 260 has a two-layer structure, the conductor 260$a$ is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., N$_2$O, NO, and NO$_2$), and a copper atom, like the conductor 205$a$ or the conductor 205$b$. Alternatively, it is preferable to use a conductive material having a function of inhibiting diffusion of oxygen (e.g., at least one of an oxygen atom, an oxygen molecule, and the like).

When the conductor 260$a$ has a function of inhibiting oxygen diffusion, it is possible to prevent a reduction in conductivity of the conductor 260$b$ due to oxidation caused by oxygen contained in the insulator 250. As a conductive material having a function of inhibiting diffusion of oxygen, for example, tantalum, tantalum nitride, titanium, titanium nitride, ruthenium, ruthenium oxide, or the like is preferably used.

Moreover, a conductive material containing tungsten, copper, or aluminum as its main component is preferably used for the conductor 260$b$. As the conductor 260 also functioning as a wiring, a conductor having high conductivity is preferably used. For example, a conductive material containing tungsten, copper, or aluminum as its main component can be used. In addition, the conductor 260$b$ may have a stacked-layer structure, for example, a stacked-layer structure of any of the above conductive materials and titanium or titanium nitride.

In the case where the conductor 205 extends to an outer region than the end portion of the oxide 230 that intersects with the channel width direction as illustrated in FIG. 2(A), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that the channel formation region formed in the oxide 230 can be covered.

That is, the channel formation region in the region 234 can be electrically surrounded by the electric field of the conductor 260 having a function of the first gate electrode and the electric field of the conductor 205 having a function of the second gate electrode.

Here, it is preferable that the top surfaces of the oxide 230c, the insulator 250, and the conductor 260 be substantially level with the top surface of the insulator 280 as illustrated in FIG. 1(B).

The insulator 274 is preferably provided over the insulator 280. The insulator 274 preferably functions as a barrier insulating film that inhibits the mixing of impurities such as water or hydrogen into the transistor 200. Accordingly, for the insulator 274, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (through which the above impurities are less likely to pass). Alternatively, it is preferable to use an insulating material having a function of inhibiting diffusion of oxygen (e.g., at least one of an oxygen atom, an oxygen molecule, and the like) (through which the above oxygen is less likely to pass).

For the insulator 274, aluminum oxide, hafnium oxide, silicon nitride, or the like can be used. Moreover, a metal oxide that can be used for the oxide 230a or the oxide 230c2, that is, a metal oxide such as an indium-gallium-zinc oxide in which the concentration of In is reduced or a metal oxide not containing In can be used. The insulator 274 may have a stacked-layer structure including an insulator 274a and an insulator 274b over the insulator 274a. For example, it is preferable that aluminum oxide or the like be used for the insulator 274a and that silicon nitride or the like be used for the insulator 274b. Thus, impurities such as hydrogen and water can be inhibited from diffusing to the transistor 200 side. Alternatively, oxygen contained in the insulator 250, the insulator 280, and the like can be inhibited from being diffused above the insulator 274.

The insulator 281 functioning as an interlayer film is preferably provided over the insulator 274. As in the insulator 224, the insulator 280, and the like, the concentration of impurities such as water or hydrogen in the insulator 281 is preferably reduced. The insulator 130 described later is provided over the insulator 281.

The conductor 240 electrically connected to the conductor 242c is positioned over the insulator 130 and in the opening formed in the insulator 130, the insulator 281, the insulator 274, the insulator 280, and the insulator 256. At that time, the insulator 241 is preferably provided on the side surface of the opening. The insulator 241 preferably has a function of inhibiting passage of oxygen and impurities such as hydrogen. A material similar to that for the insulator 212, the insulator 214, the insulator 222, the insulator 256, the insulator 274, or the like can be used for the insulator 241. When the insulator 241 is provided, oxygen can be inhibited from being absorbed by the conductor 240. When oxygen is inhibited from being absorbed by the conductor 240, oxygen contained in the insulator 280 and the like can be supplied to the oxide 230 without an increase in resistivity of the conductor 240 by oxidation and oxygen absorption by the conductor 240. Moreover, diffusion of hydrogen contained in the insulator 280 and the insulator 281 to the oxide 230 through the conductor 240 can be inhibited.

Note that the conductor 240 may have a stacked-layer structure including a first conductor and a second conductor. In this case, the second conductor is provided over the first conductor connected to the conductor 242. Moreover, the first conductor is preferably provided to cover a side surface of the second conductor.

Here, FIG. 2(B) illustrates a cross-sectional view of a portion indicated by the dashed-dotted line A5-A6 in FIG. 1(A), that is, the source region or the drain region of the transistor 200. As illustrated in FIG. 2(B), the conductor 240 is in contact with a top surface of the conductor 242c that is not covered with the insulator 241.

For the conductor 240, a conductive material containing tungsten, copper, or aluminum as its main component is preferably used. In addition, the conductor 240 may have a stacked-layer structure.

In the case where the conductor 240 has a stacked-layer structure including the first conductor and the second conductor over the first conductor, a conductive material having a function of inhibiting passage of impurities such as water or hydrogen is preferably used for the first conductor, like the conductor 205a and the like. For example, tantalum, tantalum nitride, titanium, titanium nitride, ruthenium, ruthenium oxide, or the like is preferably used. A single layer or a stacked layer of the conductive material having a function of inhibiting passage of impurities such as water or hydrogen may be used. With use of the conductive material, impurities such as hydrogen or water can be inhibited from entering the oxide 230 through the conductor 240 from a layer above the insulator 281. A conductive material containing tungsten, copper, or aluminum as its main component is preferably used for the second conductor provided over the first conductor.

[Capacitor 100]

As illustrated in FIG. 1(B), the capacitor 100a is provided in a region overlapping with the transistor 200a. In a similar manner, the capacitor 100b is provided in a region overlapping with the transistor 200b. FIG. 2(C) is a cross-sectional view of a portion indicated by the dashed-dotted line A7-A8 in FIG. 1(A), and is also a cross-sectional view of a portion where the capacitor 100a is connected to the conductor 242a. Note that the capacitor 100b includes components that corresponds to the components included in the capacitor 100a. The structure of the capacitor 100 is described as the structures of the capacitor 100a and the capacitor 100b in detail below. Thus, unless otherwise specified, the description for the capacitor 100 can be referred to for the capacitor 100a and the capacitor 100b below.

The capacitor 100 includes the conductor 110, the insulator 130, and the conductor 120 over the insulator 130.

The capacitor 100 has a structure in which the conductor 110 functioning as a lower electrode (also referred to as a first terminal in some cases) faces the conductor 120 functioning as an upper electrode (also referred to as a second terminal in some cases) with the insulator 130 functioning as a dielectric therebetween.

The capacitor 100 is provided to be embedded in the opening formed in the insulator 281, the insulator 274, the insulator 280, and the insulator 256.

The conductor 110 is provided in contact with the conductor 242 in the opening portion. The conductor 110 is preferably provided in contact with a side surface of the opening. Alternatively, the insulator 141 may be provided to cover sidewalls of the insulator 281, the insulator 274, the insulator 280, and the insulator 256 in the opening. The insulator 141 preferably has a function similar to that of the insulator 241, and a material similar to that for the insulator 241 can be used for the insulator 141. In the case where the insulator 141 is provided, the conductor 110 is in contact with the insulator 141, and the insulator 141 is provided between the conductor 110 and each of the insulator 281, the insulator 274, the insulator 280, and the insulator 256. It is preferable that a top surface of the conductor 110 be substantially level with a top surface of the insulator 281.

The insulator 130 is provided at least on the inner side and on the top surface of the conductor 110 to cover the conductor 110. Moreover, the insulator 130 may be provided to cover the top surface of the insulator 281 as illustrated in FIG. 1(B) and FIG. 2(C).

The conductor 120 is provided over the insulator 130 and in the opening portion formed in the insulator 281, the insulator 274, the insulator 280, and the insulator 256 with at least the conductor 110 and the insulator 130 therebetween. Moreover, the conductor 120 may be provided over one or both of the insulator 281 and the insulator 130 so that part of the conductor 120 functions as a wiring. The conductor 120 is preferably provided in the same layer as the conductor 240 over the insulator 130. For example, the conductor 120 and the conductor 240 are in contact with a top surface of the insulator 130 over the insulator 281.

In the capacitor 100, the upper electrode and the lower electrode face each other with the dielectric positioned therebetween on the side surface as well as the bottom surface of the opening formed in the insulator 281, the insulator 274, the insulator 280, and the insulator 256; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of a semiconductor device.

Here, a conductor that can be used as the conductor 205, the conductor 242, the conductor 260, the conductor 240, or the like can be used as the conductor 110 and the conductor 120. The conductor 110 or the conductor 120 may have a stacked-layer structure. For example, the conductor 110 or the conductor 120 may have a stacked-layer structure of a conductive material containing titanium, titanium nitride, tantalum, or tantalum nitride as its main component and a conductive material containing tungsten, copper, or aluminum as its main component. Alternatively, the conductor 110 or the conductor 120 may have a single-layer structure or a stacked-layer structure of three or more layers.

In particular, the conductor 120 is preferably formed using the same material as the conductor 240 at the same step as the conductor 240. When the conductor 120 and the conductor 240 are formed using the same material at the same step, the deposition steps can be reduced and the number of masks for processing using a lithography method can be reduced; accordingly, the manufacturing cost of the semiconductor device can be reduced. The conductor 120 and the conductor 240 formed in such a manner are positioned in the same layer over the insulator 130. For example, the conductor 120 and the conductor 240 are in contact with the top surface of the insulator 130.

An insulator having a high permittivity is preferably used for the insulator 130. For example, an insulator containing an oxide of one or both of aluminum and hafnium can be used. Aluminum oxide, hafnium oxide, an oxide containing aluminum and hafnium (hafnium aluminate), or the like is preferably used as the insulator containing an oxide of one or both of aluminum and hafnium.

The insulator 130 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 100 can have a large capacitance value and a low leakage current.

<Memory Device>

The semiconductor device including the above transistor 200 and the above capacitor 100 is the memory cell 600, and a memory device can be formed.

<Structure Example of Memory Device>

The structure examples of the memory cell 600 are described with reference to FIG. 4 to FIG. 6.

Figure 4:
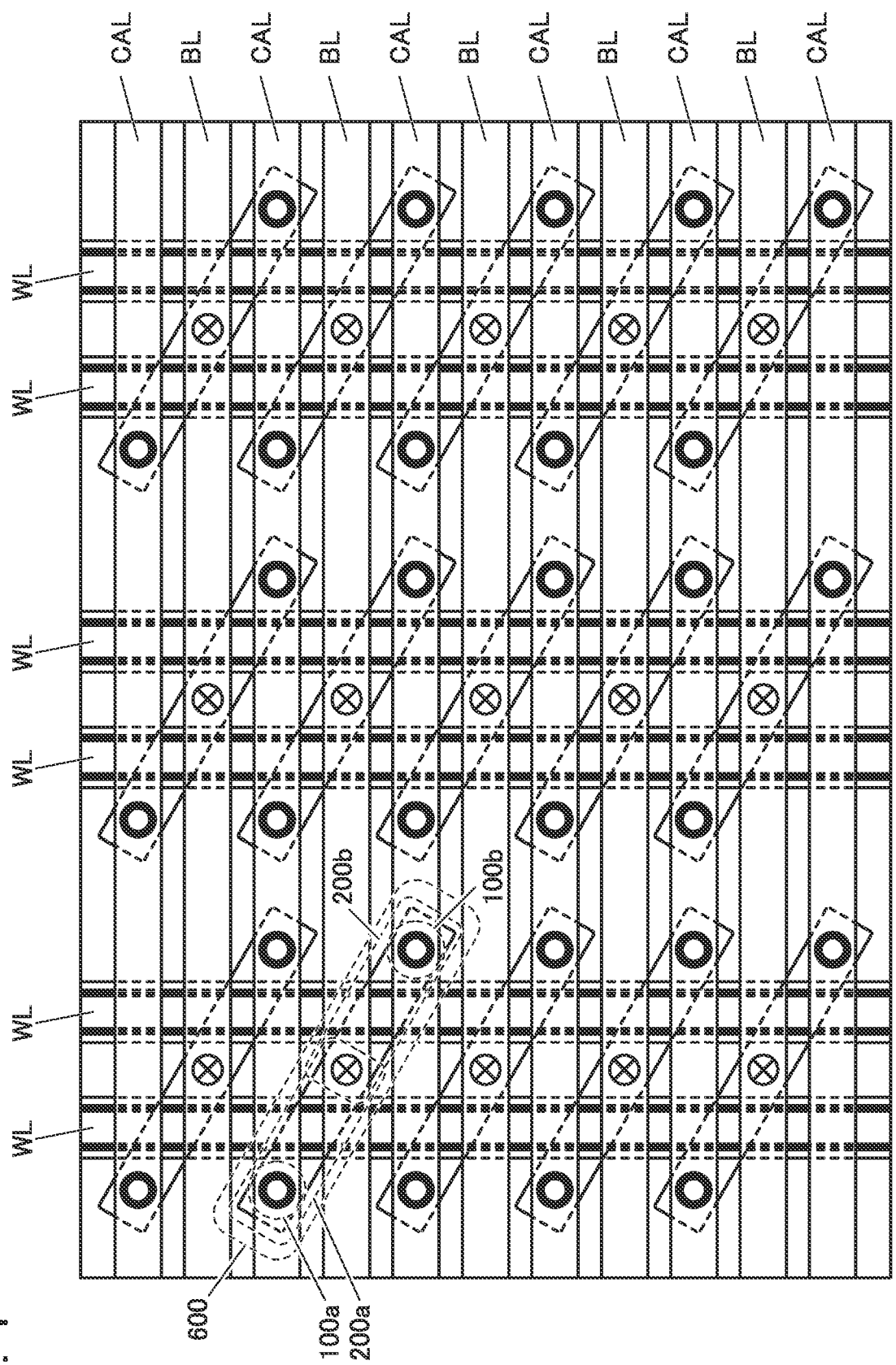
FIG. 4 A top view of a semiconductor device of one embodiment of the present invention.
Figure 5:
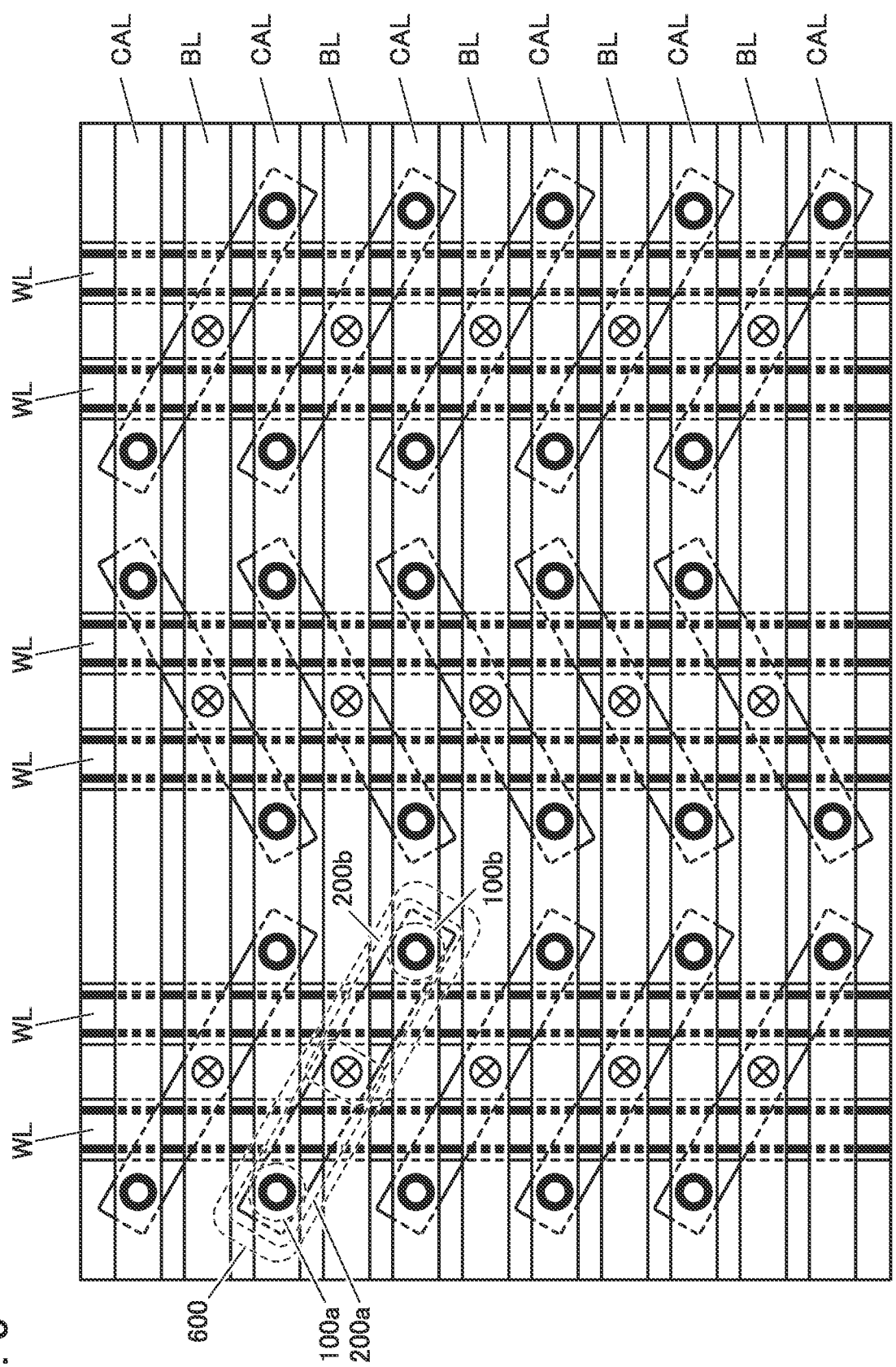
FIG. 5 A top view of a semiconductor device of one embodiment of the present invention.
Figure 6:
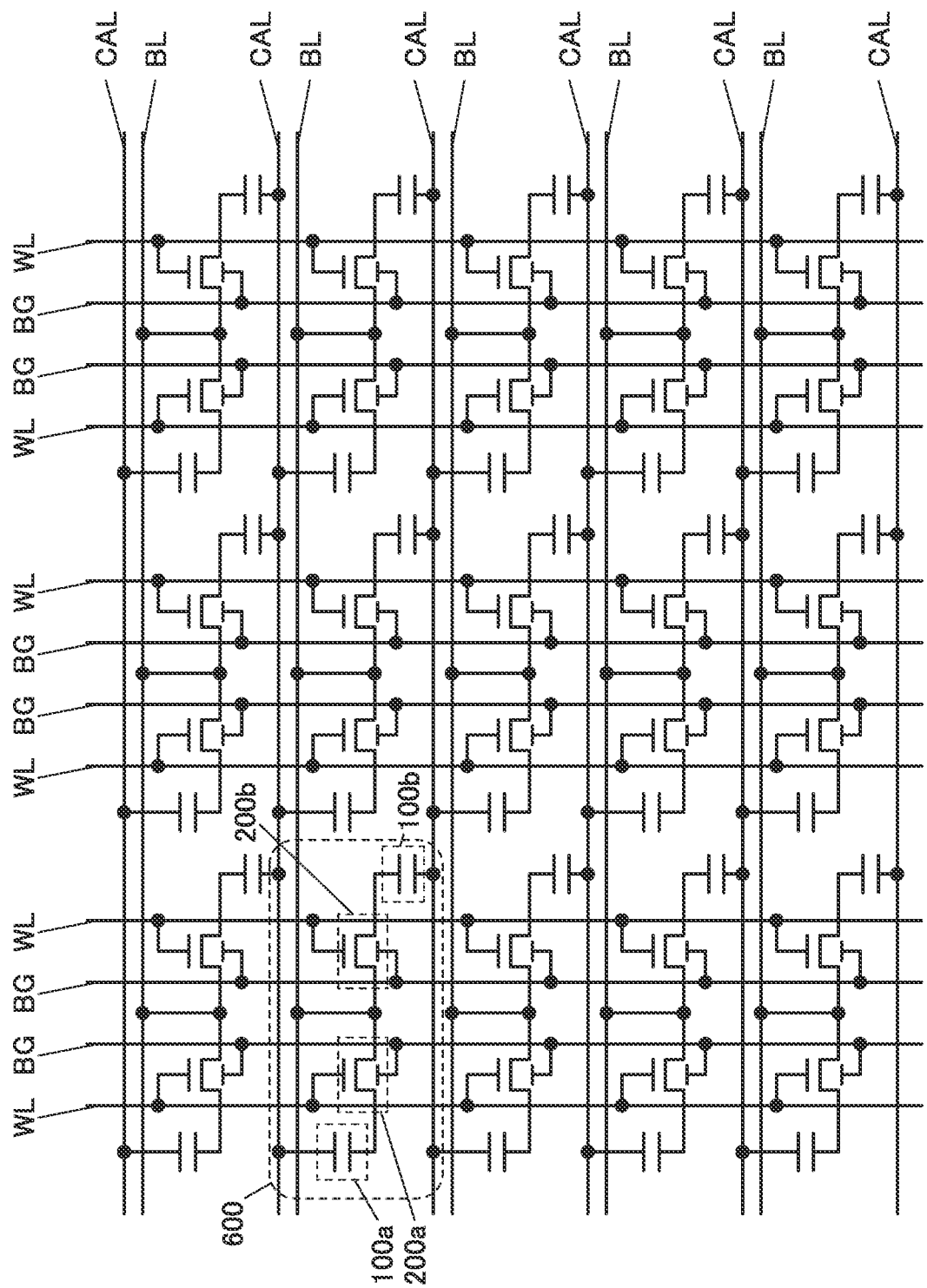
FIG. 6 A circuit diagram of a semiconductor device of one embodiment of the present invention.

FIG. 4 and FIG. 5 illustrate top views of the layout examples of the memory cell 600, and FIG. 6 illustrates a circuit configuration example of a memory cell of a DRAM. In this specification and the like, a DRAM using a memory cell including one OS transistor and one capacitor is referred to as DOSRAM (Dynamic Oxide Semiconductor Random Access Memory) in some cases. The memory cell 600 illustrated in FIG. 4 to FIG. 6 includes two memory cells; one includes the transistor 200a and the capacitor 100a, and the other includes the transistor 200b and the capacitor 100b. Note that the transistor 200a and the transistor 200b each include a gate (also referred to as a front gate in some cases) and a back gate. The memory cells 600 arranged in a matrix form a memory cell array.

FIG. 4 and FIG. 5 illustrate examples of the memory cell arrays in which the angle between the channel length directions of the transistor 200a and the transistor 200b included in the memory cell 600 and the direction in which one or both of the wiring BL and a wiring CAL extend(s) is greater than 0 and smaller than 90°. At this time, the angle between the channel length directions of the transistor 200a and the transistor 200b and the direction in which a wiring WL extends is greater than 0 and smaller than 90°. In other words, the channel length directions of the transistor 200a and the transistor 200b are not parallel or orthogonal to any directions in which the wiring BL, the wiring CAL, and the wiring WL extend.

FIG. 4 illustrates an example in which the channel length directions of the transistors 200a and the transistors 200b in all of the memory cells 600 in the memory cell array are parallel to one another; however, this embodiment is not limited thereto. As illustrated in FIG. 5, in the memory cell array, the channel length directions of the transistor 200a and the transistor 200b included in at least one memory cell 600 may be different from the channel length directions of the transistors 200a and the transistors 200b included in other memory cells 600. FIG. 5 illustrates an example in which the channel length directions of the transistors 200a and the transistors 200b included in the memory cells 600 are different column by column. In particular, the memory cells 600 adjacent to each other in the row direction are arranged axisymmetrically with respect to the column direction, that is, the direction in which the wiring WL extends.

A first terminal of the transistor 200a is connected to a first terminal of the capacitor 100a, a first terminal of the transistor 200b is connected to a first terminal of the capacitor 100b, a second terminal of the transistor 200a and a second terminal of the transistor 200b are connected to the wiring BL, the gate of the transistor 200a and the gate of the transistor 200b are connected to different wirings WL, and the back gate of the transistor 200a and the back gate of the transistor 200b are connected to different wirings BG. Each of a second terminal of the capacitor 100a and a second terminal of the capacitor 100b is connected to the wiring CAL. Note that the first terminal of the transistor 200 functions as one of the source and the drain, and the second terminal functions as the other of the source and the drain.

Here, the second terminal of the capacitor 100a and the second terminal of the capacitor 100b are connected to different wirings CAL. At this time, the wirings CAL may be supplied with equal potentials or different potentials.

The wiring BL functions as a bit line, and the wiring WL functions as a word line. The wiring CAL functions as a wiring for applying a predetermined potential to the second terminal of the capacitor 100a and the second terminal of the capacitor 100b. In the time of data writing and data reading, a low-level potential is preferably applied to the wiring CAL. The wiring BG functions as a wiring for applying a potential to the back gate of the transistor 200a or the transistor 200b. By applying a given potential to the wiring BG, the threshold voltage of the transistor 200a or the transistor 200b can be increased or decreased.

Note that the memory cell 600 is not limited to that illustrated in FIG. 6 and can have a different circuit configuration. For example, the memory cell 600 may be a memory cell in which the transistor 200a and the transistor 200b are transistors that do not include back gates. At this time, the wirings BG can be omitted. The circuit configuration can be selected as appropriate in accordance with the characteristics required for the memory cell or the memory cell array.

When OS transistors are used as the transistor 200a and the transistor 200b included in the memory cell 600, the leakage current of the transistor 200a and the transistor 200b can be very low. That is, with the use of the transistor 200a and the transistor 200b written data can be retained for a long time; thus, the frequency of refresh operations of the memory cell can be reduced. In addition, refresh operation for the memory cell can be omitted. In addition, extremely low leakage current allows multi-level data or analog data to be retained in the memory cell 600.

<Configuration Example of Memory Device>

Figure 7:
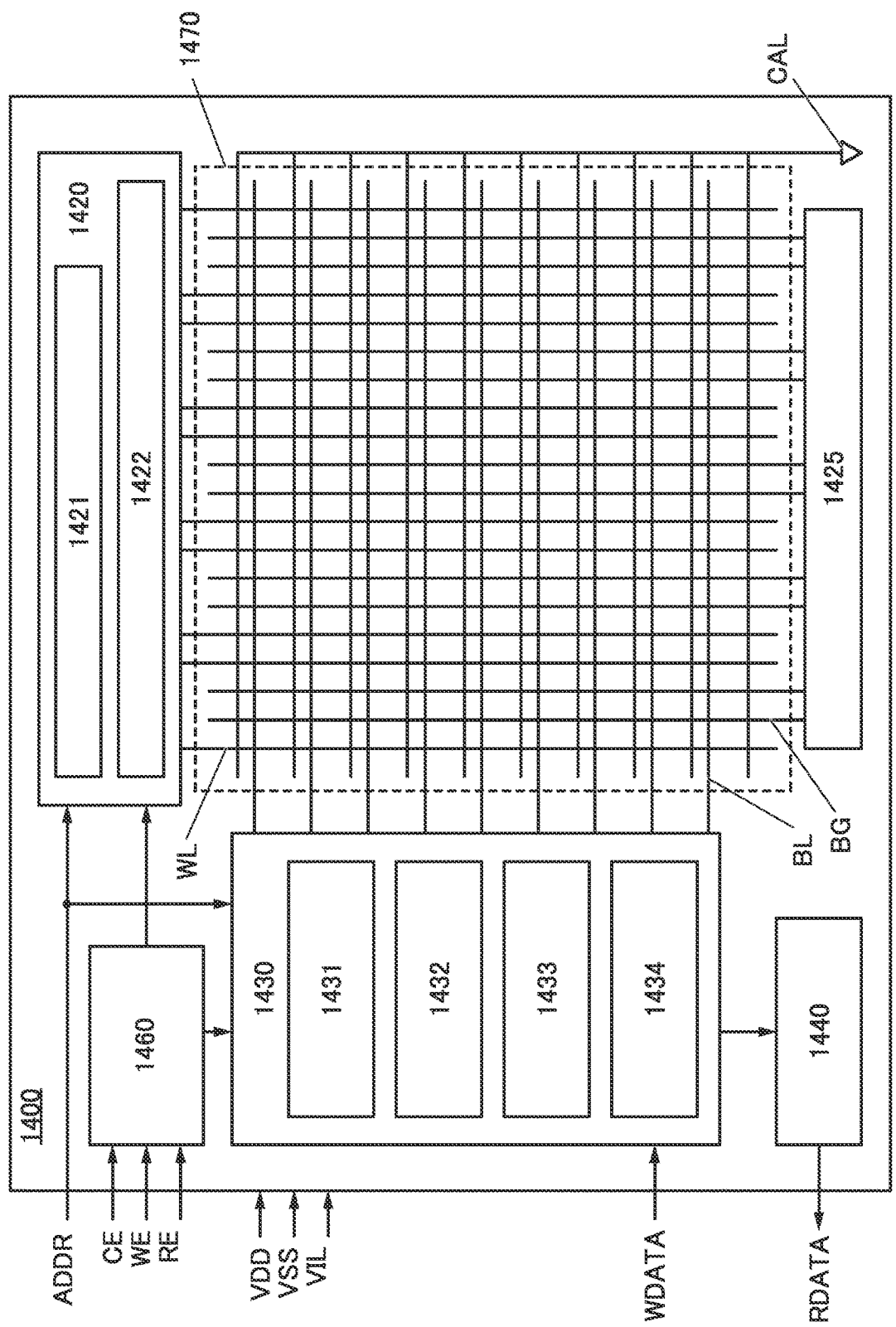
FIG. 7 A block diagram illustrating a configuration example of a semiconductor device of one embodiment of the present invention.

FIG. 7 illustrates an example of the structure of an OS memory device. The memory device 1400 includes a memory cell array 1470 and a peripheral circuit. The peripheral circuit includes a row circuit 1420, a column circuit 1430, an output circuit 1440, and a control logic circuit 1460. Furthermore, a back gate control circuit 1425 that controls a potential applied to the back gate of the transistor 200 may be provided in the peripheral circuit. The back gate control circuit 1425 can be regarded as part of the row circuit 1420.

The column circuit 1430 includes, for example, a column decoder 1431, a precharge circuit 1432, a sense amplifier 1433, a write circuit 1434, and the like. The precharge circuit 1432 has a function of precharging a wiring. The sense amplifier 1433 has a function of amplifying a data signal read from a memory cell. Note that the wirings are connected to the memory cell included in the memory cell array 1470. The amplified data signal is output as a data signal RDATA to the outside of the memory device 1400 through the output circuit 1440. The row circuit 1420 includes, for example, a row decoder 1421 and a word line driver circuit 1422, and can select a row to be accessed.

As power supply voltages from the outside, a low power supply voltage (VSS), a high power supply voltage (VDD) for the peripheral circuit, and a high power supply voltage (VIL) for the memory cell array 1470 are supplied to the memory device 1400. Control signals (CE, WE, and RE), an address signal ADDR, and a data signal WDATA are input to the memory device 1400 from the outside. The address signal ADDR is input to the row decoder 1421 and the column decoder 1431, and WDATA is input to the writing circuit 1434.

The control logic circuit 1460 processes the signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells 600 arranged in a matrix and a plurality of wirings. Note that the number of the wirings that connect the memory cell array 1470 to the row circuit 1420 depends on the structure of the memory cell 600, the number of the memory cells 600 in a column, and the like. The number of the wirings that connect the memory cell array 1470 to the column circuit 1430 depends on the structure of the memory cell 600, the number of the memory cells 600 in a row, and the like.

Note that FIG. 7 illustrates an example in which the memory cell array 1470 and the peripheral circuit are formed on the same plane; however, this embodiment is not limited thereto. For example, the memory cell array 1470 may be provided over the peripheral circuit or at least part thereof to overlap with the peripheral circuit or at least part thereof. At this time, the peripheral circuit or at least part thereof preferably includes an OS transistor including an oxide semiconductor or a silicon transistor. That is, a structure in which an OS transistor is stacked over an OS transistor or a structure in which an OS transistor is stacked over a silicon transistor is preferable. For example, a structure may be employed in which the memory cell array 1470 including an OS transistor is stacked over a sense amplifier including a silicon transistor so that the sense amplifier and the memory cell array 1470 overlap with each other.

Figure 8:
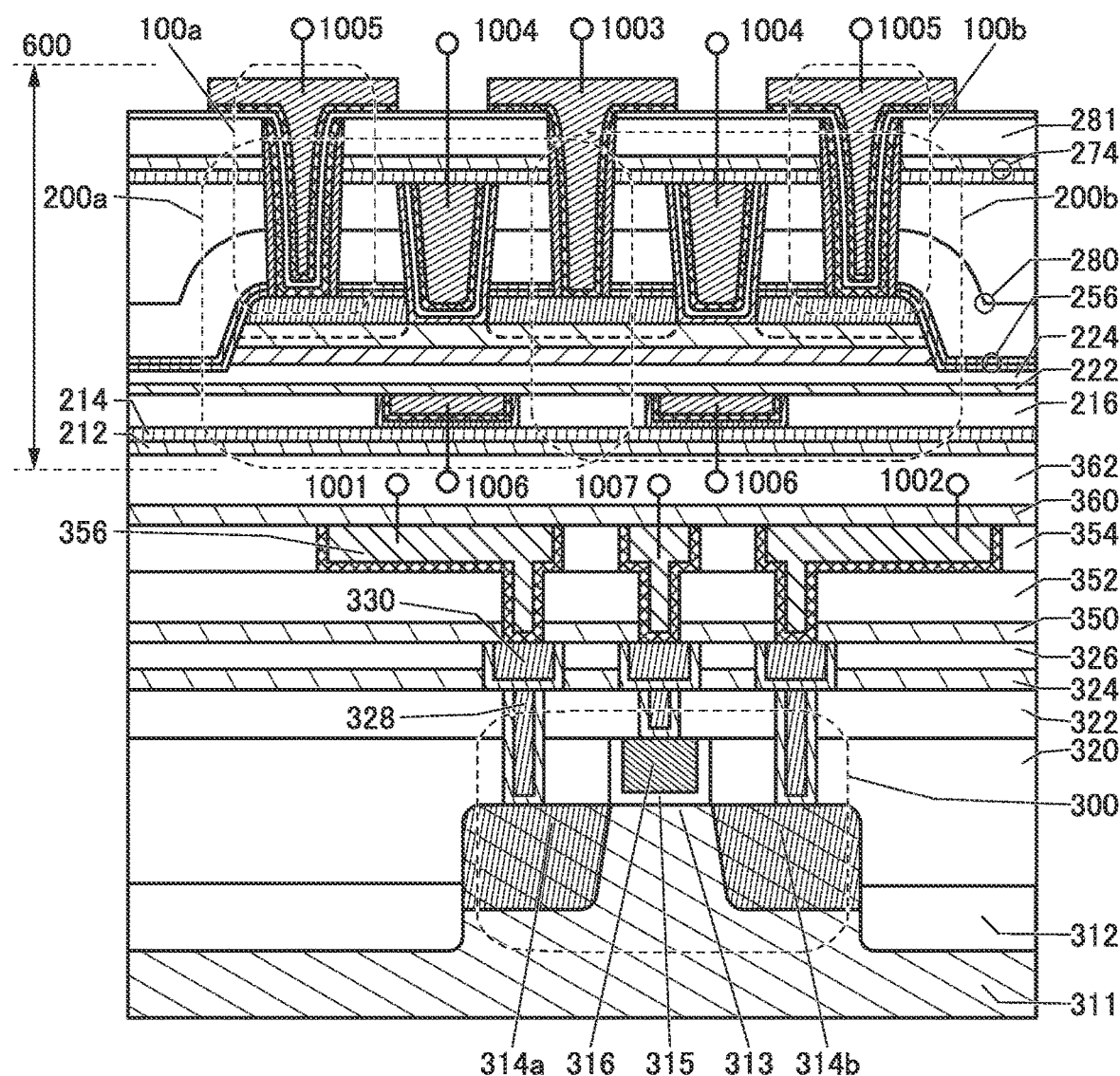
FIG. 8 A cross-sectional view of a semiconductor device of one embodiment of the present invention.

FIG. 8 illustrates an example in which the memory cell 600 including the transistor 200 and the capacitor 100 is provided over a transistor 300. The memory cell 600 can be regarded as part of the memory cell array 1470, and the transistor 300 can be regarded as part of the peripheral circuit, for example, part of the sense amplifier.

In the semiconductor device shown in FIG. 8, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. The other of the source and the drain of the transistor 200 is electrically connected to one of the electrodes of the capacitor 100, and a wiring 1005 is electrically connected to the other electrode of the capacitor 100. The wiring 1003 may be electrically connected to the wiring 1001, the wiring 1002, or the wiring 1007.

<Transistor 300>

The transistor 300 is provided over a substrate 311 and includes a conductor 316 functioning as the gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in the same layer are electrically isolated from each other by an insulator 312 functioning as an element isolation insulating layer. The insulator 312 can be formed using an insulator similar to that used as an insulator 326 or the like described later. The transistor 300 may be a p-channel transistor or an n-channel transistor.

In the substrate 311, it is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor; and it is also preferable that single crystal silicon is included therein. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 8, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 8 is only an example and the structure is not limited thereto; an appropriate transistor is used in accordance with a circuit configuration or a driving method.

As shown in FIG. 8, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 8, a silicon-based semiconductor material and an oxide semiconductor can be used in different layers. The semiconductor device shown in FIG. 8 can be manufactured in a process similar to that employing an apparatus for manufacturing a semiconductor device containing a silicon-based semiconductor material, and can be highly integrated.

<Wiring Layer>

Wiring layers provided with an interlayer film, a wiring, a plug, and the like may be provided between the components. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are sequentially stacked over the transistor 300 as interlayer films. In addition, a conductor 328, a conductor 330, and the like that are electrically connected to the wiring 1001, the wiring 1002, the wiring 1007, and the like are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 8, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. For example, as illustrated in FIG. 8, the conductor 356 can function as at least one of a wiring connecting the wiring 1001 and the source of the transistor 300, a wiring connecting the wiring 1002 and the drain of the transistor 300, and a wiring connecting the wiring 1007 and the gate of the transistor 300.

An insulator 360 is positioned over the insulator 354, an insulator 362 is positioned over the insulator 360, the insulator 212 is positioned over the insulator 362, and the memory cell 600 is positioned.

In the case where the transistor 300 is used as part of the sense amplifier, a structure in which the wiring 1003 is connected to at least one or more of the wiring 1001, the wiring 1002, and the wiring 1007 may be employed. With such a structure, the length of a wiring connecting the transistor 200 and the transistor 300 can be shortened as compared with the case where the wiring is led over the transistor 200.

A wiring layer may be provided over the memory cell 600.

Examples of an insulator that can be used as an interlayer film include an oxide, a nitride, an oxynitride, a nitride oxide, a metal oxide, a metal oxynitride, and a metal nitride oxide, each of which has an insulating property. For example, when a material having a low relative permittivity is used as the insulator functioning as an interlayer film, the parasitic capacitance generated between wirings can be reduced. Thus, a material is preferably selected depending on the function of an insulator.

For example, for the insulator 320, the insulator 322, the insulator 326, the insulator 352, the insulator 354, the insulator 362, and the like, an insulator with low relative permittivity is preferably used. For example, the insulators each preferably contain silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (nylon, aramid, or the like), polyimide, polycarbonate, and acrylic.

As the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

The above is the description of the structure example. With the use of this structure, the semiconductor device using the transistor including an oxide semiconductor can be miniaturized or highly integrated. Alternatively, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided.

Note that FIG. 8 illustrates an example in which the transistor 300 whose channel formation region is formed in the substrate 311 is provided; however, the semiconductor device described in this embodiment is not limited thereto.

Figure 9:
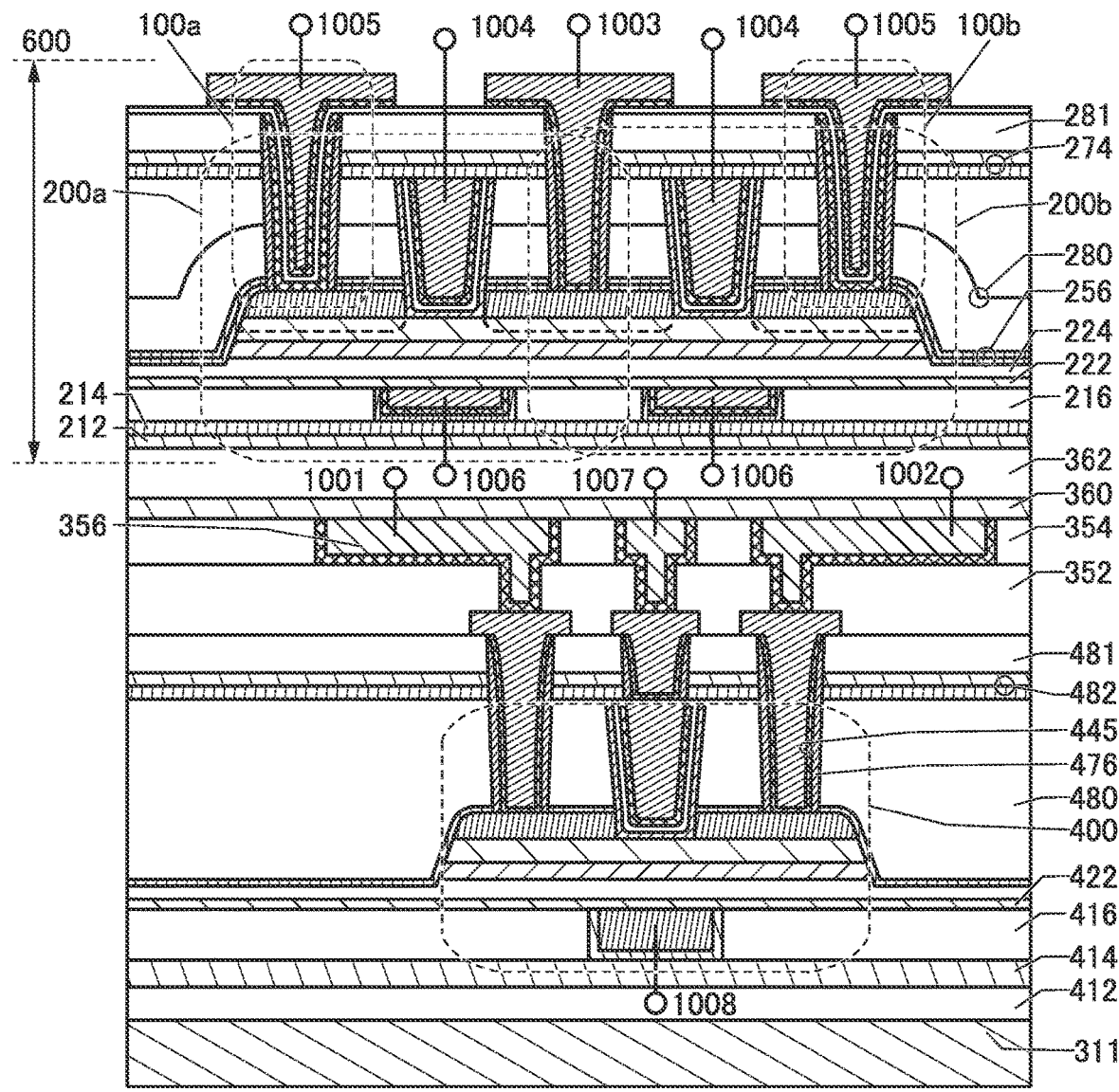
FIG. 9 A cross-sectional view of a semiconductor device of one embodiment of the present invention.

For example, as illustrated in FIG. 9, a structure in which a transistor 400 including an oxide semiconductor is provided below the transistor 200 may be employed. The semiconductor device illustrated in FIG. 9 has a structure similar to that of the semiconductor device illustrated in FIG. 8 except that the transistor 400 is provided instead of the transistor 300.

Unlike the semiconductor device illustrated in FIG. 8, the semiconductor device illustrated in FIG. 9 includes an insulator 412, an insulator 414, an insulator 416, an insulator 422, an insulator 480, an insulator 482, an insulator 481, and the transistor 400 formed in these layers between the substrate 311 and the insulator 352. Here, the insulator 412 corresponds to the insulator 212, the insulator 414 corresponds to the insulator 214, the insulator 416 corresponds to the insulator 216, the insulator 422 corresponds to the insulator 222, the insulator 480 corresponds to the insulator 280, the insulator 482 corresponds to the insulator 274, the insulator 481 corresponds to the insulator 281, and the transistor 400 corresponds to the transistor 200.

That is, the transistor 400 and the layers including the transistor 400 have structures similar to those of the transistor 200 and the layers including the transistor 200. Therefore, for the details of the transistor 400 and the layers including the transistor 400, the above description can be referred to.

Note that a conductor 445 is provided to be embedded in an opening formed in the insulator 480, the insulator 482, and the insulator 481. The conductor 445 function as a plug connecting the wiring 1001 and a source of the transistor 400, a plug connecting the wiring 1002 and a drain of the transistor 400, and a plug connecting the wiring 1007 and a gate of the transistor 400.

For the conductor 445, a conductive material containing tungsten, copper, or aluminum as its main component is preferably used. In addition, the conductor 445 may have a stacked-layer structure.

In the case where the conductor 445 has a stacked-layer structure, a conductive material having a function of inhibiting passage of oxygen and impurities such as water or hydrogen is preferably used for a conductor in a lower layer. For example, tantalum, tantalum nitride, titanium, titanium nitride, ruthenium, ruthenium oxide, or the like is preferably used. A single layer or a stacked layer of the conductive material having a function of inhibiting passage of oxygen and impurities such as water or hydrogen may be used. The use of the conductive material can prevent oxygen added to the insulator 480 from being absorbed by the conductor 445. Moreover, the mixing of impurities such as water or hydrogen into the transistor 400 through the conductor 445 from a layer above the insulator 481 can be inhibited.

In the case where an oxide semiconductor is used in the transistor 400, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, as illustrated in FIG. 9, an insulator 476 may be provided between the insulator 480 containing excess oxygen and the conductor 445. Here, the insulator 476 has a structure similar to that of the insulator 241 described in the above embodiment. That is, the excess oxygen contained in the insulator 480 can be inhibited from being absorbed by the conductor 445 when the insulator 476 is provided. In addition, diffusion of hydrogen, which is an impurity, into the transistor 400 through the conductor 445 can be inhibited when the insulator 476 is provided.

Furthermore, in the case where the memory cell array 1470 is provided to overlap with a sense amplifier, a bit line can be shortened. This reduces bit line capacity, which reduces the storage capacity of the memory cell.

Note that the structures of the peripheral circuit, the memory cell array 1470, and the like described in this embodiment are not limited to the above. The arrangement and functions of these circuits and the wirings, circuit components, and the like connected to the circuits can be changed, removed, or added as needed.

Figure 10A:
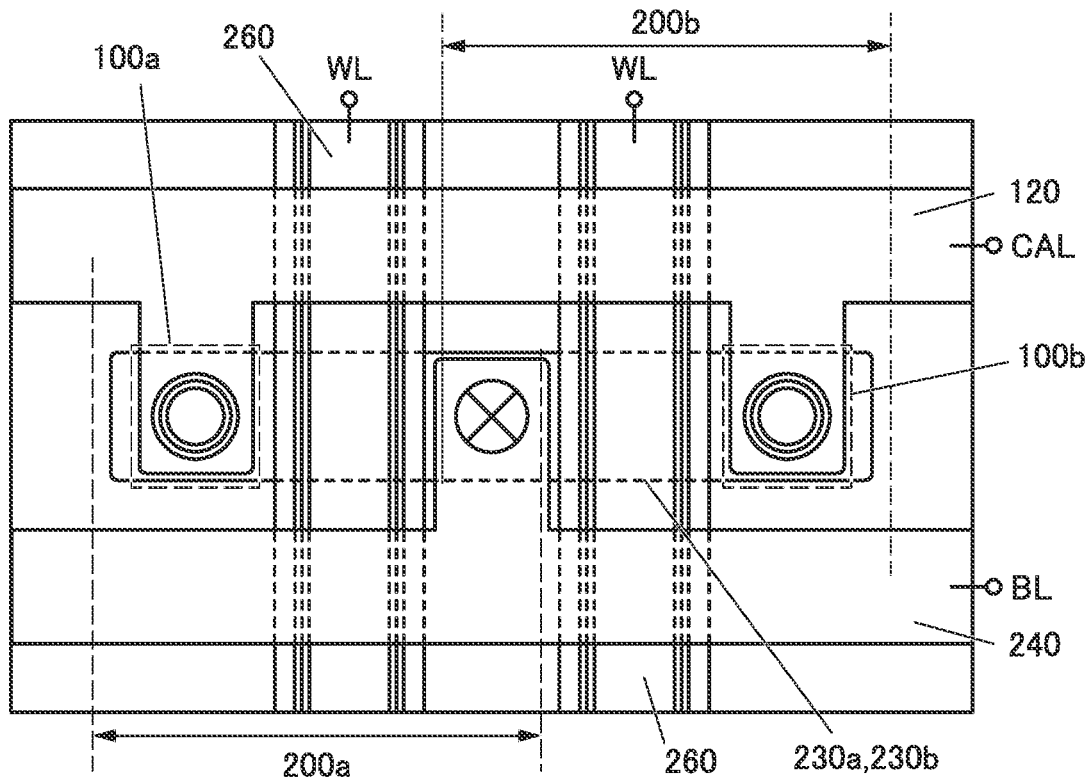
FIGS. 10A-10B A top view and a circuit diagram of a semiconductor device of one embodiment of the present invention.
Figure 10B:
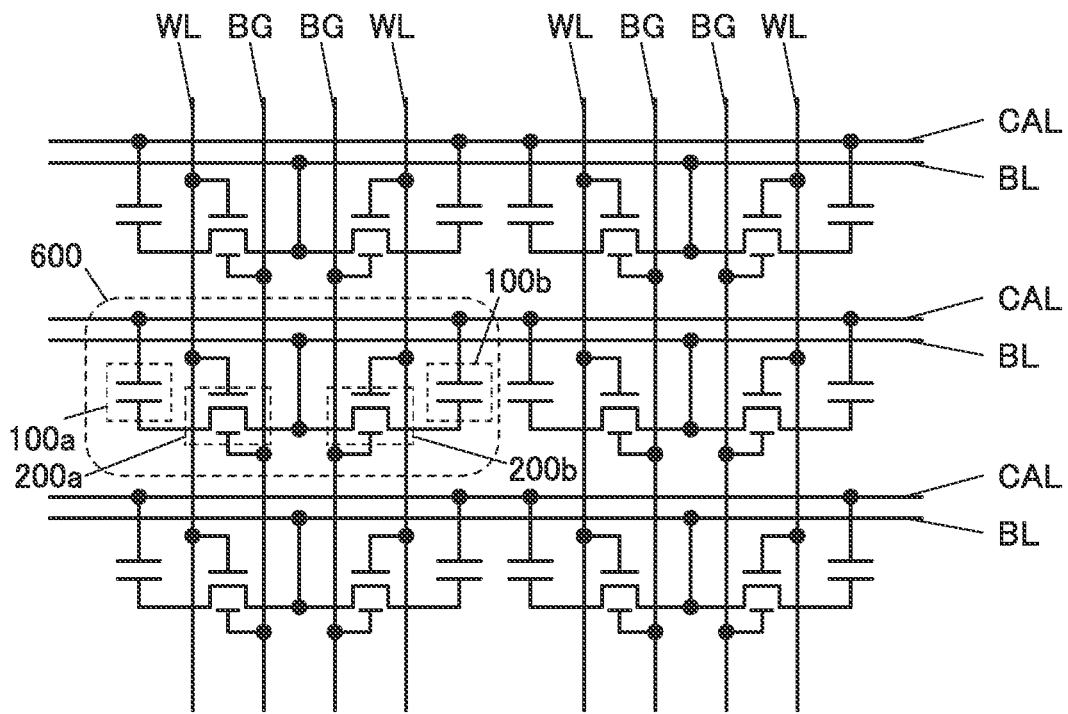
Figure 11A:
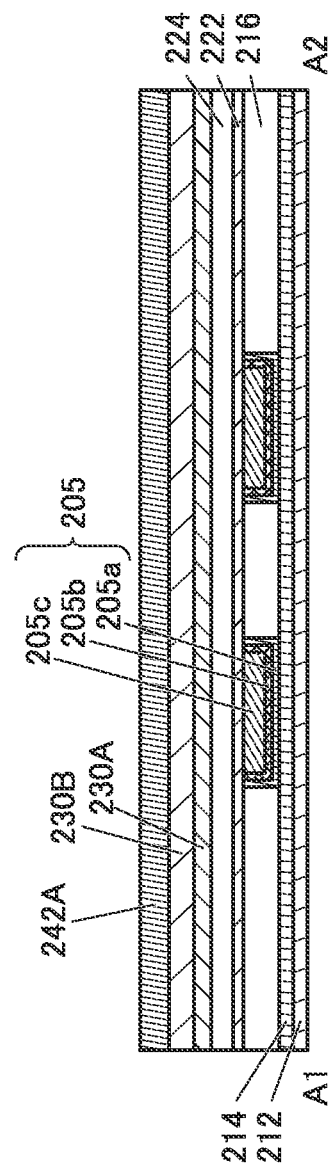
FIGS. 11A-11D Cross-sectional views illustrating a method for fabricating a semiconductor device of one embodiment of the present invention.
Figure 11B:
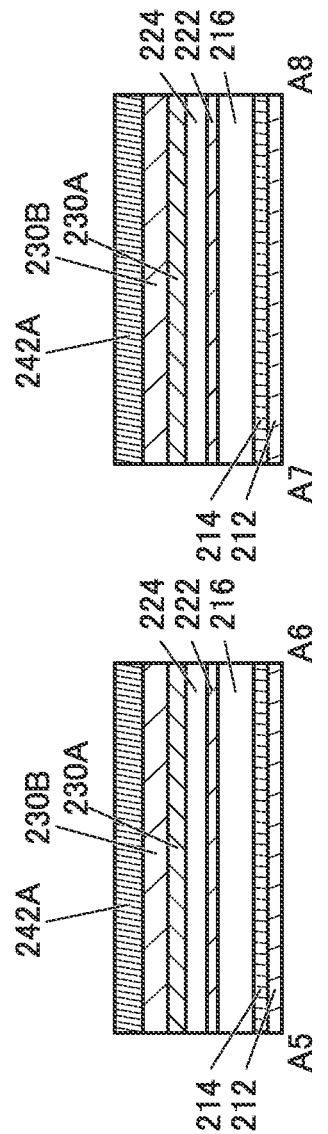
Figure 11C:
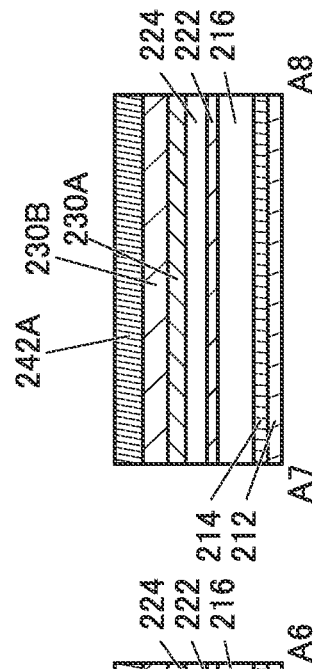
Figure 11D:
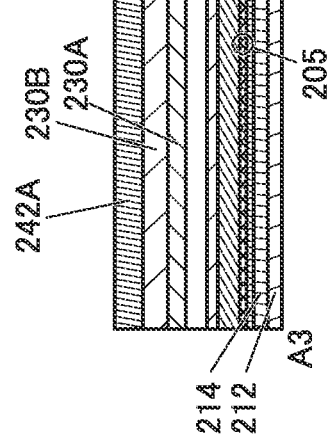
Figure 12A:
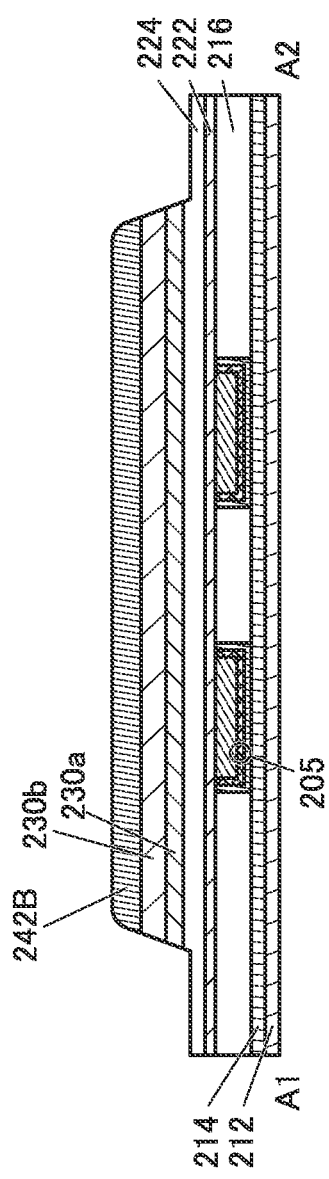
FIGS. 12A-12D Cross-sectional views illustrating a method for fabricating a semiconductor device of one embodiment of the present invention.
Figure 12B:
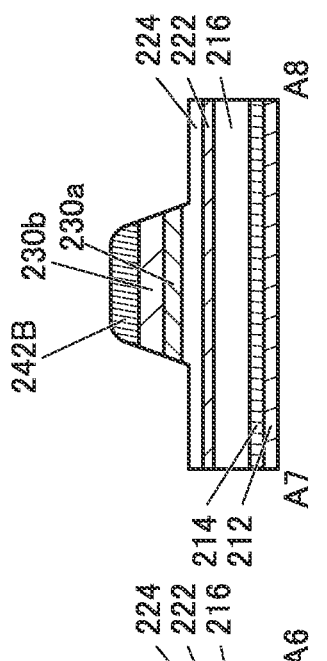
Figure 12C:
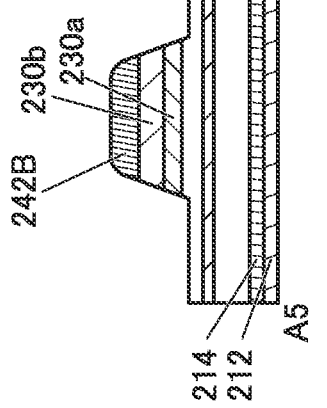
Figure 12D:
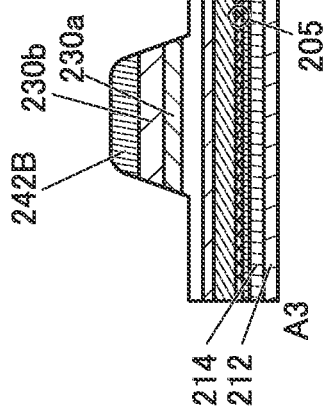
Figure 13A:
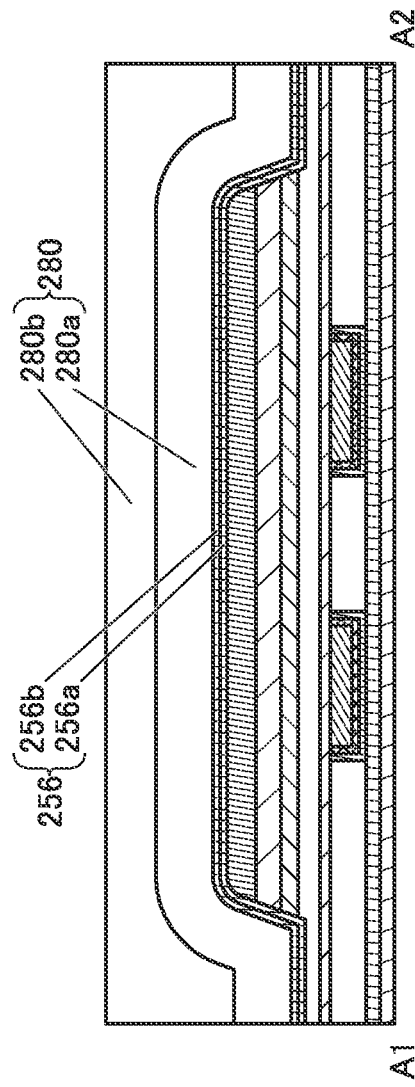
FIGS. 13A-13D Cross-sectional views illustrating a method for fabricating a semiconductor device of one embodiment of the present invention.
Figure 13B:
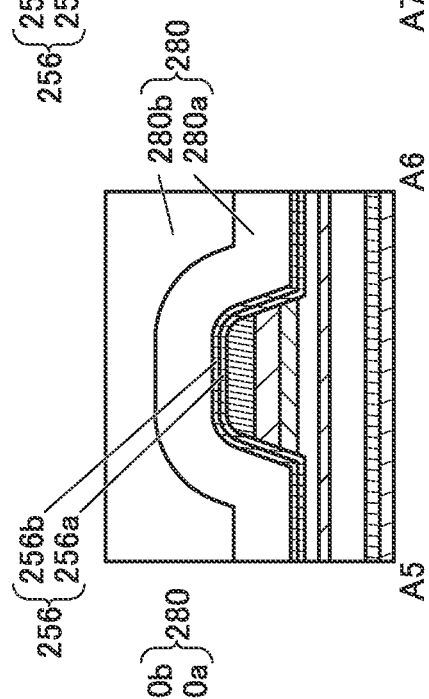
Figure 13C:
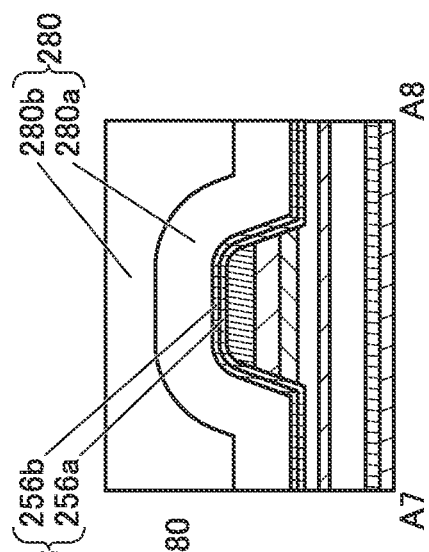
Figure 13D:
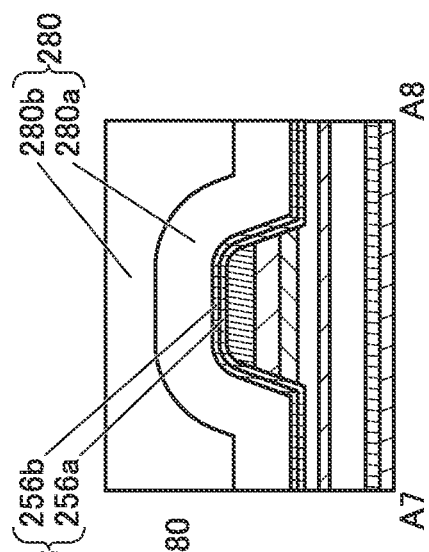
Figure 20A:
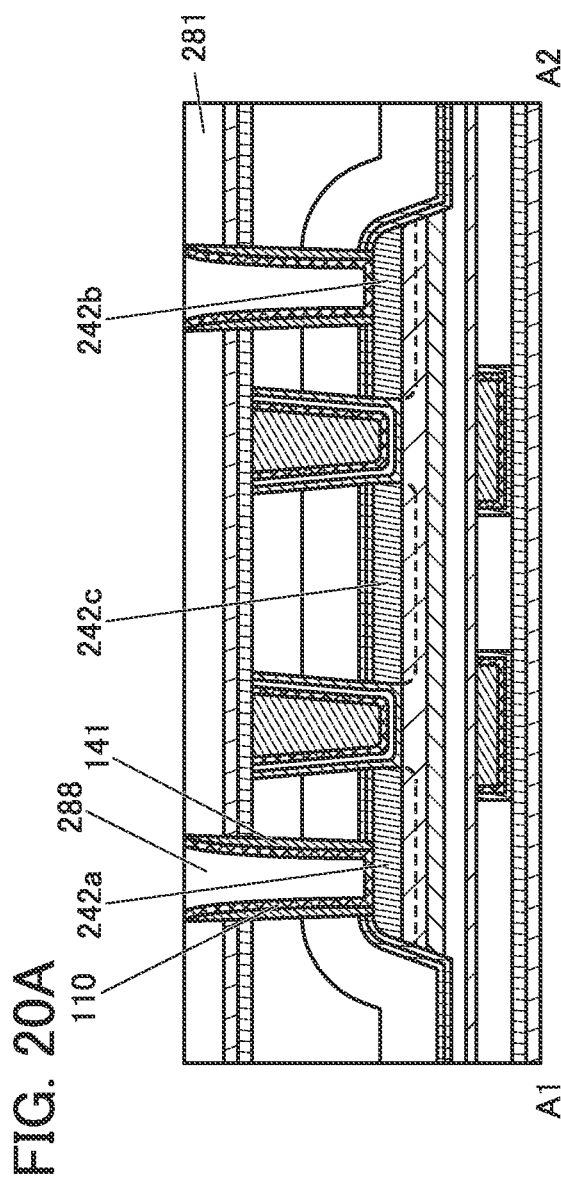
FIGS. 20A-20D Cross-sectional views illustrating a method for fabricating a semiconductor device of one embodiment of the present invention.
Figure 20D:
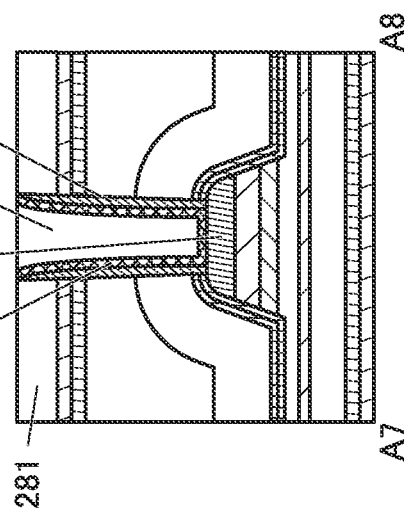
Figure 20C:
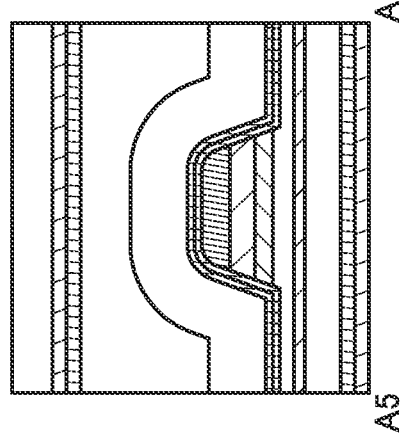
Figure 20B:
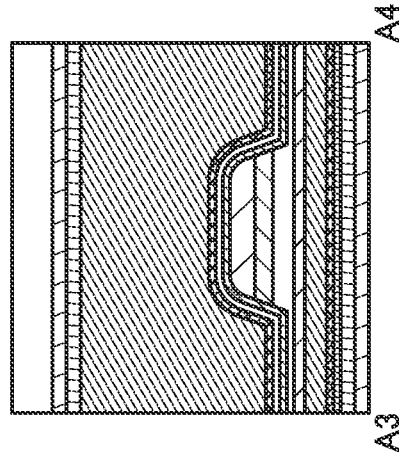
Figure 22A:
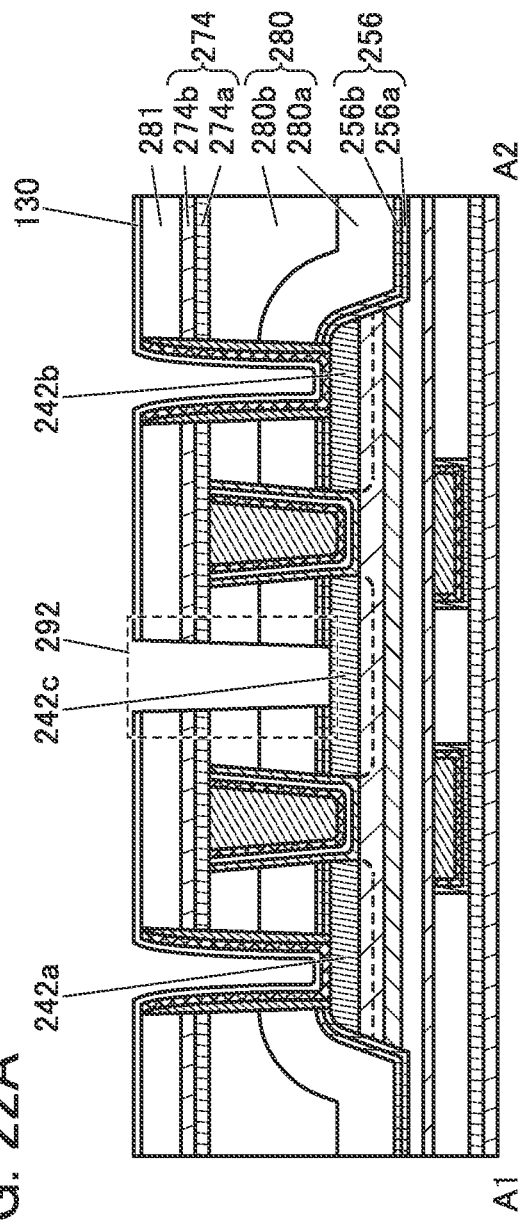
FIGS. 22A-22D Cross-sectional views illustrating a method for fabricating a semiconductor device of one embodiment of the present invention.
Figure 22D:
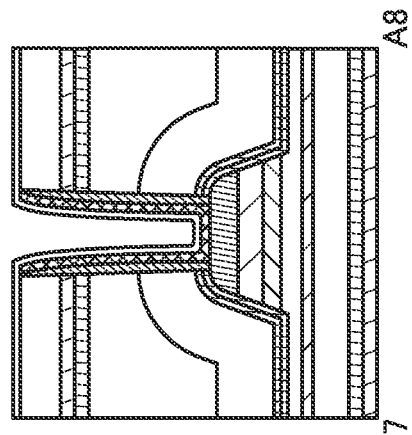
Figure 22C:
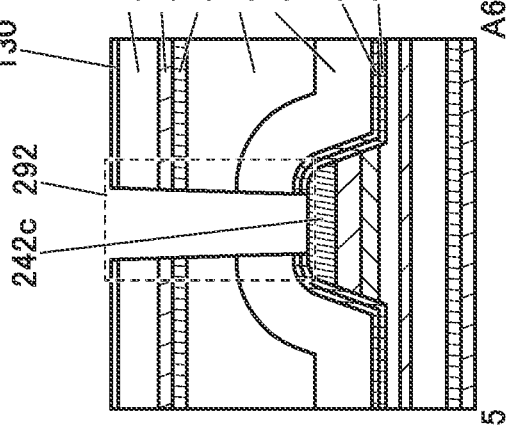
Figure 22B:
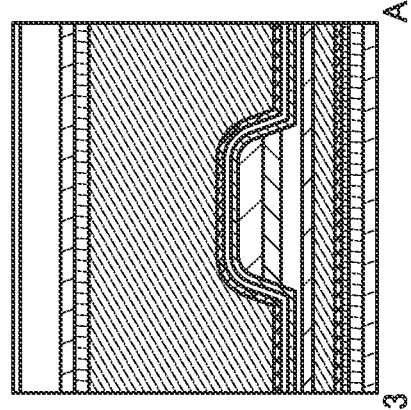
Figure 23A:
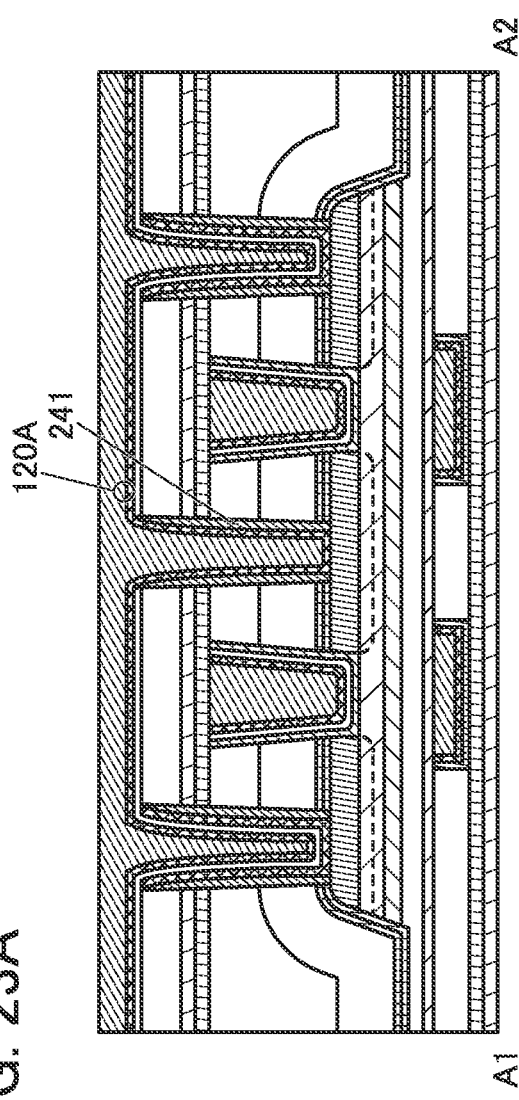
FIGS. 23A-23D Cross-sectional views illustrating a method for fabricating a semiconductor device of one embodiment of the present invention.
Figure 23D:
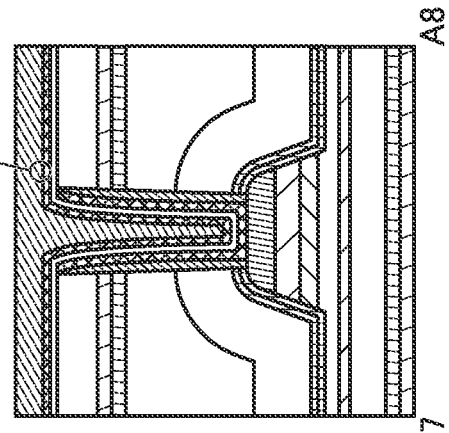
Figure 23C:
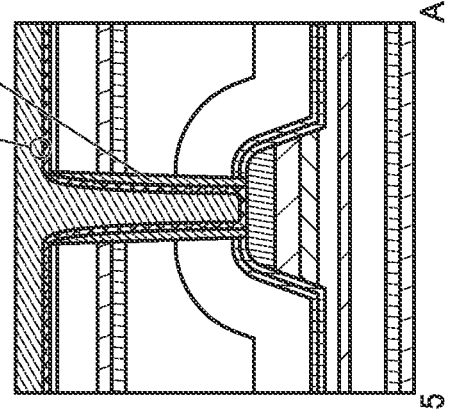
Figure 23B:
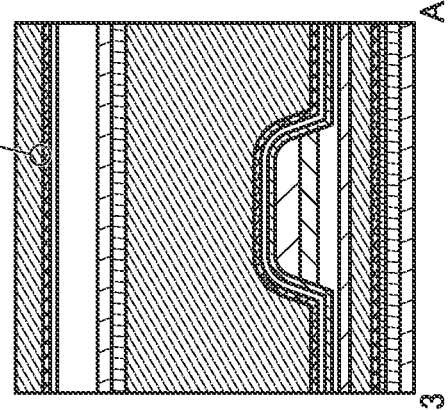

For example, although FIG. 4 to FIG. 6 each illustrate an example in which the second terminal of the capacitor 100*a* and the second terminal of the capacitor 100*b* are connected to different wirings CAL, this embodiment is not limited thereto. As illustrated in FIG. 10, the second terminal of the capacitor 100*a* and the second terminal of the capacitor 100*b* may be connected to one wiring. That is, the second terminal of the capacitor 100*a* and the second terminal of the capacitor 100*b* may be formed of one conductor. At this time, it is preferable that the channel length directions of the transistor 200*a* and the transistor 200*b* included in the memory cell 600 be substantially parallel to the direction in which one or both of the wiring BL and the wiring CAL extend(s). Moreover, it is preferable that the channel length directions of the transistor 200*a* and the transistor 200*b* included in the memory cell 600 be substantially orthogonal to the direction in which the wiring WL extends.

<Constituent Material for Semiconductor Device>

Constituent materials that can be used for the semiconductor device are described below.

«Substrate»

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as the material and a compound semiconductor substrate containing silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is formed over a non-flexible substrate and then the transistor is separated from the non-flexible substrate and transferred to the substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced, for example. That is, a durable semiconductor device can be provided.

For the substrate that is a flexible substrate, for example, a metal, an alloy, a resin, glass, or fiber thereof can be used. As the substrate, a sheet, a film, a foil or the like that contains a fiber may also be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K may be used. Examples of the resin include polyester, polyolefin, polyamide (nylon, aramid, or the like), polyimide, polycarbonate, and acrylic. In particular, aramid is suitable for the substrate that is a flexible substrate because of its low coefficient of linear expansion.

«Insulator»

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. In contrast, when a material with a low relative permittivity is used for the insulator functioning as an interlayer film, the parasitic capacitance generated between wirings can be reduced. Accordingly, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure, which is thermally stable and has a low relative permittivity, can be obtained by combination with a resin, for example. Examples of the resin include polyester, polyolefin, polyamide (nylon, aramid, or the like), polyimide, polycarbonate, and acrylic. Furthermore, a stacked-layer structure, which is thermally stable and has a high relative permittivity, can be obtained by combination of silicon oxide and silicon oxynitride with an insulator having a high relative permittivity, for example.

In addition, when a transistor using an oxide semiconductor is surrounded by an insulator having a function of inhibiting passage of oxygen and impurities such as hydrogen or water, the transistor can have stable electrical characteristics.

As the insulator having a function of inhibiting passage of oxygen and impurities such as water or hydrogen, for example, a single layer or a stacked layer of an insulator containing boron, carbon, nitrogen, oxygen, fluorine, phosphorus, chlorine, argon, silicon, aluminum, hafnium, magnesium, gallium, germanium, yttrium, zirconium, lanthanum, neodymium, tungsten, titanium, tantalum, or nickel. Specifically, as the insulator having a function of inhibiting passage of oxygen and impurities such as hydrogen, a metal oxide such as aluminum oxide, hafnium oxide, magnesium oxide, gallium oxide, germanium oxide, yttrium oxide, zirconium oxide, lanthanum oxide, neodymium oxide, tungsten oxide, titanium oxide, tantalum oxide, or nickel oxide; a silicon nitride such as silicon nitride oxide or silicon nitride; or the like can be used.

For example, the insulator 224 and the insulator 250 functioning as the gate insulator are each preferably an insulator including an excess-oxygen region. When a structure is employed in which silicon oxide or silicon oxynitride including an excess-oxygen region is in contact with the oxide 230, oxygen vacancies included in the oxide 230 can be compensated.

For example, an insulator containing an oxide of one or more kinds of aluminum, hafnium, and gallium can be used as the insulator 222, which functions as part of the gate insulator. In particular, as the insulator containing an oxide of one or both of aluminum and hafnium, aluminum oxide, hafnium oxide, an oxide containing aluminum and hafnium (hafnium aluminate), or the like is preferably used.

With the above stacked-layer structure, on-state current can be increased without a reduction in the influence of the electric field from the gate electrode. Since the distance between the gate electrode and the region where a channel is formed is kept by the physical thickness of the gate insulator, leakage current between the gate electrode and the channel formation region can be inhibited.

A material similar to those for the insulator 250, the insulator 222, and the insulator 224 can be used for the insulator 130. The insulator 130 may have a stacked-layer structure containing the above materials.

The insulator 216, the insulator 280, and the insulator 281 preferably include a single layer or a stacked layer of an insulator with a low relative permittivity. For example, the insulator 216, the insulator 280, and the insulator 281 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 216, the insulator 280, and the insulator 281 preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which are thermally stable, is combined with a resin, the stacked-layer structure can be thermally stable and have a low relative permittivity. Examples of the resin include polyester, polyolefin, polyamide (nylon, aramid, or the like), polyimide, polycarbonate, and acrylic.

For the insulator 212, the insulator 214, the insulator 256, the insulator 274, the insulator 141, and the insulator 241, an insulator having a function of inhibiting passage of oxygen and impurities such as hydrogen or water is used. For the insulator 212, the insulator 214, the insulator 256, the insulator 274, the insulator 141, and the insulator 241, for example, a metal oxide such as aluminum oxide, hafnium oxide, magnesium oxide, gallium oxide, germanium oxide, yttrium oxide, zirconium oxide, lanthanum oxide, neodymium oxide, tungsten oxide, titanium oxide, tantalum oxide, or nickel oxide; silicon nitride oxide; silicon nitride; or the like is used. Moreover, for the above insulator, a metal oxide such as an indium-gallium-zinc oxide in which the concentration of In is reduced or a metal oxide not containing In can be used.

«Conductor»

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen entering from an external insulator or the like can be trapped in some cases.

For the conductor 260, the conductor 205, the conductor 242, the conductor 240, the conductor 110, and the conductor 120, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

«Metal Oxide»

As the oxide 230, a metal oxide functioning as an oxide semiconductor (hereinafter also referred to as an oxide semiconductor) is preferably used. A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention is described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers flow also in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) are classified into a single-crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even near distortion in the CAAC-OS. That is, formation of a crystal grain boundary is inhibited due to the distortion of lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (oxygen vacancies (also referred to as Vo) or the like). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an indium-gallium-zinc oxide (hereinafter, IGZO) that is a kind of a metal oxide containing indium, gallium, and zinc has a stable structure in some cases by being formed of the above-described nanocrystals. In particular, crystals of IGZO tend not to grow in the air and thus, a stable structure is obtained in some cases when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor (a metal oxide) can have various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used for a channel formation region of a transistor is described.

Note that when the above metal oxide is used for a channel formation region of a transistor, the transistor having high field-effect mobility can be achieved. In addition, the transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the concentration of impurities in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide is described.

When silicon or carbon that is a Group 14 element is contained in the metal oxide, defect states are formed in the metal oxide. Thus, the concentration of silicon or carbon in the metal oxide and the concentration of silicon or carbon near an interface with the metal oxide (the concentration measured by secondary ion mass spectrometry (SIMS)) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region of the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics.

Hydrogen contained in the metal oxide forms shallow defect states (sDOS: shallow level Density of States) in the metal oxide in some cases. Shallow defect states refer to interface states near the conduction band minimum. Shallow defect states probably exist near the boundary between a high-density region and a low-density region in the metal oxide. Here, the high-density region and the low-density region in the metal oxide are distinguished by the amounts of hydrogen contained in the regions. That is, the high-density region contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition containing indium, gallium, and zinc, the high-density region contains indium, gallium, and zinc and the low-density region contains indium and zinc, in some cases. In other words, the proportion of gallium in the low-density region is lower than that in the high-density region in some cases.

Note that the above shallow defect states probably result from oxygen vacancies. When oxygen vacancies in the metal oxide increase, the density of deep defect states (dDOS: deep level Density of States) as well as the density of shallow defect states probably increase. This is because deep defect states also result from oxygen vacancies. Note that deep defect states refer to defect states that are located around the center of the band gap.

Therefore, a reduction in the number of oxygen vacancies in the metal oxide can lead to a reduction in the density of both shallow defect states and deep defect states. Furthermore, shallow defect states can possibly be controlled to some extent by adjusting the temperature at the time of deposition of the metal oxide. Specifically, the temperature at the time of deposition of the metal oxide is set to 170° C. or its vicinity, preferably 130° C. or its vicinity, further preferably room temperature, whereby the density of shallow defect states can be reduced.

Shallow defect states in a metal oxide affect the electrical characteristics of the transistor that uses the metal oxide for a semiconductor layer. That is, owing to shallow defect states, the drain current $I_d$ changes gently with respect to the gate voltage $V_g$ in the drain current-gate voltage ($I_d$–$V_g$) characteristics of the transistor, worsening the S value (also referred to as Subthreshold Swing, or SS), which is a criterion for judging the rising characteristics of a transistor from an off state to an on state. This is probably because of trapping of electrons by shallow defect states.

Therefore, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used for a channel formation region of a transistor, stable electrical characteristics can be given.

<Manufacturing Method of Semiconductor Device>

Next, a method for manufacturing a semiconductor device including the transistor 200 of the present invention is described with reference to FIG. 11 to FIG. 24. In each of FIG. 11 to FIG. 24, figure (A) is a cross-sectional view corresponding to a portion indicated by the dashed-dotted line A1-A2 in FIG. 1(A). Furthermore, (B) of each drawing is a cross-sectional view corresponding to a portion indicated by the dashed-dotted line A3-A4 in FIG. 1 (A). Furthermore, (C) of each drawing is a cross-sectional view corresponding to a portion indicated by the dashed-dotted line A5-A6 in FIG. 1 (A). Furthermore, (D) of each drawing is a cross-sectional view corresponding to a portion indicated by the dashed-dotted line A7-A8 in FIG. 1 (A).

First, a substrate (not illustrated) is prepared, and the insulator 212 is deposited over the substrate. The insulator 212 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

In particular, an ALD method has excellent step coverage and excellent thickness uniformity, and thus is suitable for the case of covering a surface of an opening portion with a high aspect ratio, for example. On the other hand, an ALD method has a relatively low deposition rate, and thus is preferably used in combination with another deposition method with a high deposition rate such as a CVD method, in some cases.

In this embodiment, for the insulator 212, silicon nitride is deposited by a sputtering method, a CVD method, or an ALD method. In addition, the insulator 212 may have a multilayer structure. For example, a structure may be employed in which silicon oxide is deposited by a sputtering method, a CVD method, or an ALD method, and silicon nitride is deposited over the silicon oxide by a sputtering method, a CVD method, or an ALD method.

Next, the insulator 214 is deposited over the insulator 212. In this embodiment, for the insulator 214, aluminum oxide is deposited by a sputtering method. In addition, the insulator 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide or silicon oxynitride is deposited by a CVD method.

Then, openings are formed in the insulator 216. Note that examples of the opening include a groove and a slit. A region where the opening is formed may be referred to as an opening portion. A wet etching method may be used for the formation of the opening; however, a dry etching method is preferable for microfabrication. As the insulator 214, it is preferable to select an insulator that functions as an etching stopper used in forming the opening by etching the insulator 216. For example, in the case where silicon oxide is used as the insulator 216 in which the openings are formed, aluminum oxide, hafnium oxide, or silicon nitride is preferably used as the insulator 214.

After the formation of the opening, a conductive film to be the conductor 205a is deposited. The conductive film preferably includes a conductive material that has a function of inhibiting passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, for the conductive film to be the conductor 205a, tantalum nitride is deposited by a sputtering method.

Next, a conductive film to be the conductor 205b is deposited over the conductive film to be the conductor 205a. The conductive film can be deposited by a sputtering method, a CVD method, an MBE method, a PLD method, an ALD method, or the like.

In this embodiment, as the conductive film to be the conductor 205b, titanium nitride is deposited by a CVD method.

Next, a conductive film to be the conductor 205c is formed over the conductive film to be the conductor 205b. The conductive film can be deposited by a sputtering method, a CVD method, an MBE method, a PLD method, an ALD method, or the like.

In this embodiment, as the conductive film to be the conductor 205c, tungsten is deposited by a CVD method.

Next, part of the conductive film to be the conductor 205a, part of the conductive film to be the conductor 205b, and part of the conductive film to be the conductor 205c are removed by CMP treatment to expose the insulator 216. As a result, the conductive film to be the conductor 205a, the conductive film to be the conductor 205b, and the conductive film to be the conductor 205c remain only in the opening portion. Thus, the conductor 205 including the conductor 205a, the conductor 205b, and the conductor 205c, which has a flat top surface, can be formed (see FIG. 11). Note that the insulator 216 is partly removed by the CMP treatment in some cases.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. A film formed by an ALD method has good coverage. In contrast, a film formed by a sputtering method can have lower hydrogen concentration than that formed by other methods, which is preferable. The deposition method may be selected in accordance with characteristics required for the device.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide is deposited by a sputtering method. Furthermore, silicon oxide or silicon oxynitride may be deposited by a CVD method.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere or an atmosphere containing an oxidizing gas at 10 ppm or more, 1% or more, or 10% or more. Moreover, the heat treatment may be performed under a reduced pressure. Alternatively, the heat treatment may be performed in such a manner that heat treatment is performed in a nitrogen or inert gas atmosphere, and then another heat treatment is performed in an atmosphere containing an oxidizing gas at 10 ppm or more, 1% or more, or 10% or more in order to compensate for released oxygen.

In this embodiment, as the heat treatment, treatment is performed in a nitrogen atmosphere at 400° C. for one hour after deposition of the insulator 224. By the above heat treatment, impurities such as hydrogen and water contained in the insulator 224 can be removed, for example.

The heat treatment can be performed after deposition of the insulator 222. For the heat treatment, the conditions for the above-described heat treatment can be used.

Here, to make the insulator 224 contain a large amount of oxygen, plasma treatment containing oxygen may be performed under reduced pressure. The plasma treatment with oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as hydrogen and water contained in the insulator 224 can be removed by selecting the conditions for the plasma treatment appropriately. In that case, the heat treatment does not need to be performed.

Next, an oxide film 230A and an oxide film 230B are deposited in this order over the insulator 224 (see FIG. 11). Note that the oxide films are preferably deposited successively without exposure to an air atmosphere. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. By increasing the proportion of oxygen contained in the sputtering gas, the amount of excess oxygen in the oxide film to be deposited can be increased. In the case where the above oxide films are deposited by a sputtering method, an In-M-Zn oxide target can be used, for example.

In particular, the oxide film 230A preferably contains a large amount of oxygen. Therefore, the proportion of oxygen included in the sputtering gas for the oxide film 230A is preferably 70% or higher, further preferably 80% or higher, and still further preferably 100%.

In the case where the oxide film 230B is formed by a sputtering method, when the proportion of oxygen contained in the sputtering gas is 1% or higher and 30% or lower, and preferably 5% or higher and 20% or lower during the deposition, an oxygen-deficient oxide semiconductor is formed. In a transistor using an oxygen-deficient oxide semiconductor for a channel formation region, relatively high field-effect mobility can be obtained.

In the case where the oxide film 230A and the oxide film 230B are deposited by an ALD method, a precursor containing In, a precursor containing M, and a precursor containing Zn can be used. A precursor containing two or more of In, M, and Zn may be used. The oxide film 230A and the oxide film 230B may be deposited by introducing the above precursors sequentially or simultaneously in a reaction chamber in which the substrate is placed and then performing a step of introducing an oxidizing agent repeatedly; or the oxide film 230A and the oxide film 230B may be deposited by repeating a step of introducing each precursor and introducing the oxidizing agent.

In this embodiment, the oxide film 230A can be deposited by a sputtering method using a target with In:Ga:Zn=1:3:4 or 1:1:0.5 [each of them shows the atomic ratio]. The oxide film 230B can be deposited by a sputtering method using a target with In:Ga:Zn=4:2:4.1, 5:1:6, or 1:1:1 [each of them shows the atomic ratio]. Note that each of the oxide films is formed to have characteristics required for the oxide 230 by selecting the deposition condition and the atomic ratio as appropriate.

Next, heat treatment may be performed. For the heat treatment, the conditions for the above-described heat treatment can be used. Through the heat treatment, impurities such as water and hydrogen contained in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Then, the conductive film 242A is formed over the oxide film 230B (see FIG. 11). For the conductive film 242A, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Note that the conductive film 242A can be formed by a sputtering method, a CVD method, an MBE method, a PLD method, an ALD method, or the like.

Then, the conductive film 242A is processed to form a hard mask for processing the oxide film 230A and the oxide film 230B.

Note that for the processing of the conductive film 242A, a lithography method can be employed. For the processing, either a dry etching method or a wet etching method can be employed. The processing by a dry etching method is suitable for microfabrication.

In the lithography method, first, a resist is exposed to light through a mask. Next, a region exposed to light is removed or left using a developing solution, so that a resist mask is formed. Then, etching treatment through the resist mask is performed, so that the conductor, the semiconductor, the insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. Note that the above mask for the exposure of the resist to light is unnecessary in the case of using an electron beam or an ion beam because direct writing is performed on the resist. Note that the resist mask can be removed by, for example, performing dry etching treatment such as ashing, performing wet etching treatment, performing wet etching treatment after dry etching treatment, or performing dry etching treatment after wet etching treatment.

Next, the conductive film 242A is etched using a resist mask, so that the conductor 242B functioning as the hard mask is formed (see FIG. 12). After the formation of the conductor 242B, the oxide films may be processed after removal of the resist mask or without removal of the resist mask. In the latter case, the resist mask sometimes disappears during the etching.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Then, the oxide film 230A and the oxide film 230B are processed into island shapes with the use of the conductor 242B as a hard mask to form the oxide 230a and the oxide 230b (see FIG. 12). Note that the insulator 224 is partly removed by the processing in some cases. The conductor 242B functioning as the hard mask may be removed by etching after the oxide films are etched; however, since the conductor 242B is further processed to form the conductor functioning as the source electrode and the drain electrode in this embodiment, the conductor 242B is not removed.

Here, the oxide 230a and the oxide 230b are formed to at least partly overlap with the conductor 205. It is preferable that the side surfaces of the oxide 230a and the oxide 230b be tapered with respect to a top surface of the insulator 222 or a top surface of the substrate. When the side surfaces of the oxide 230a and the oxide 230b are tapered with respect to the top surface of the insulator 222 or the top surface of the substrate, forming a film on the side surfaces of the oxide 230a and the oxide 230b or removing the film formed on the side surfaces can be easily performed in a later step.

There is a curved surface between the side surfaces of the oxide 230a, the oxide 230b, and the conductor 242B and a top surface of the conductor 242B. That is, an end portion of the side surface and an end portion of the top surface are preferably curved (hereinafter also referred to as a rounded shape). The radius of curvature of the curved surface at an end portion of the conductor 242B is greater than or equal to 3 nm and less than or equal to 10 nm, preferably greater than or equal to 5 nm and less than or equal to 6 nm, for example. When the end portions are not angular, the coverage with films deposited in a later step is improved.

Note that for the processing of the oxide films, the conductor 242B can be used as a hard mask and either a dry etching method or a wet etching method can be employed. The processing by a dry etching method is suitable for microfabrication.

In some cases, treatment such as dry etching described above makes impurities due to an etching gas or the like to attach to the side surface or to be diffused into the oxide 230a, the oxide 230b, and the like. Examples of the impurities include fluorine and chlorine.

In order to remove the above impurities or the like, cleaning is performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution obtained by diluting an oxalic acid, a phosphoric acid, hydrogen peroxide water, a hydrofluoric acid, or the like with pure water or carbonated water. Alternatively, ultrasonic cleaning using pure water or carbonated water may be performed. In this embodiment, the ultrasonic cleaning using pure water or carbonated water is performed.

Next, heat treatment may be performed. For the heat treatment, the conditions for the above-described heat treatment can be used. Note that in the case where the heat treatment might cause oxidation of the conductor 242B, the heat treatment is preferably performed in an atmosphere containing no oxygen. In the case where the conductor 242B contains an oxidation-resistant material, the heat treatment may be performed in an oxygen-containing atmosphere.

Next, the insulator 256 is deposited over the insulator 224, the oxide 230a, the oxide 230b, and the conductor 242B (see FIG. 13). Note that the insulator 256 preferably functions as an insulating barrier, and an insulator including a metal oxide such as aluminum oxide, hafnium oxide, magnesium oxide, gallium oxide, germanium oxide, yttrium oxide, zirconium oxide, lanthanum oxide, neodymium oxide, tungsten oxide, titanium oxide, tantalum oxide, or nickel oxide; silicon nitride oxide; silicon nitride; or the like is deposited for the insulator 256. An oxide containing aluminum and hafnium (hafnium aluminate), or the like can be used for the insulator including an oxide containing both aluminum and hafnium. Moreover, a metal oxide such as an indium-gallium-zinc oxide in which the concentration of In is reduced or a metal oxide not containing In can be used.

The insulator 256 may have a stacked-layer structure including the insulator 256a and the insulator 256b over the insulator 256a. At this time, the insulator 256a and the insulator 256b may be formed using different materials. Furthermore, the insulator 256a and the insulator 256b can be formed by different methods. For example, aluminum oxide formed by a sputtering method can be used for the insulator 256a, and aluminum oxide formed by an ALD method can be used for the insulator 256b.

The insulator 256 having a barrier property can inhibit oxidation of the conductor 242B. Note that when the conductor 242B contains an oxidation-resistant material, the insulator 256 does not always need to be provided. The insulator 256 can be deposited by a sputtering method, a CVD method, an MBE method, a PLD method, an ALD method, or the like.

Next, the insulator 280 is deposited over the insulator 256. The insulator 280 preferably includes an insulator with a low relative permittivity. For example, the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are preferable because of their thermal stability. The insulator 280 can be formed by a sputtering method, a CVD method, an MBE method, a PLD method, an ALD method, or the like. Alternatively, the insulator 280 can be formed by a spin coating method, a dipping method, a droplet discharging method (e.g., an ink-jet method), a printing method (e.g., screen printing or offset printing), a doctor knife method, a roll coater method, a curtain coater method, or the like.

The insulator 280 may have a stacked-layer structure including the insulator 280a and the insulator 280b over the insulator 280a. At this time, the insulator 280a and the insulator 280b may be formed using different materials. Furthermore, the insulator 280a and the insulator 280b can be formed by different methods.

In this embodiment, silicon oxide is deposited by a sputtering method as the insulator 280a, and silicon oxynitride is deposited by a CVD method as the insulator 280b. When the insulator 280a is formed by a sputtering method, the hydrogen concentration in the insulator 280 can be reduced, which is preferable. When the insulator 280b is formed by a CVD method, the insulator 280 can be formed with good coverage, which is preferable.

Note that the insulator 280 is preferably formed to have a flat top surface. For example, the insulator 280 may have a flat top surface right after the deposition. Alternatively, for example, the insulator 280 may have flatness by removing an insulator or the like from the top surface after the deposition so that the top surface becomes parallel to a reference surface such as a rear surface of the substrate. Such treatment is referred to as planarization treatment, and the obtained film is referred to as a planarization film in some cases. Examples of the planarization treatment include CMP treatment and dry etching treatment. In this embodiment, CMP treatment is used as the planarization treatment. Note that the insulator 280 does not necessarily have a flat top surface.

Then, the insulator 280, the insulator 256, and the conductor 242B are processed, whereby openings 245 are formed to have a region overlapping with at least the conductor 205 (see FIG. 14). To form the openings, a wet etching method or dry etching method using a resist mask or a hard mask can be used. Note that a dry etching method is preferably used because it enables microfabrication and enables the side surface of the insulator 280 to be processed substantially vertical. By processing the conductor 242B, the conductor 242 (the conductor 242a, the conductor 242b, and the conductor 242c) is formed. Through the processing, the side surface of the oxide 230a, the top surface and the side surface of the oxide 230b, and part of a surface of the insulator 224 are exposed. Furthermore, part of the insulator 224 is etched by the processing, so that the insulator 224 is reduced in thickness or part of the insulator 222 is exposed in some cases. In the case where a hard mask is used for the processing, it is preferable that the hard mask be also removed by the processing. In contrast, the hard mask may remain over the insulator 280, and in that case, it is removed in a polish step of the conductor 260 and the like, which is a later step.

A cross section of a plane where the conductor 242a and the conductor 242c face each other and the conductor 242b and the conductor 242c face each other has a tapered shape in some cases. Alternatively, the cross sections may have substantially vertical shapes.

Note that the conductors 260 formed in a later step are positioned in the openings 245 in a self-aligning manner.

Here, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. In the case where the conductor 242 is an oxidation-resistant conductor, the heat treatment may be performed in an oxygen-containing atmosphere. Moreover, the heat treatment may be performed under a reduced pressure. The heat treatment is performed at 400° C. in a nitrogen atmosphere for one hour, for example.

Through the heat treatment, impurities such as hydrogen and water contained in the oxide 230a and the oxide 230b can be removed. Furthermore, damages that have been caused in the oxide 230a or the oxide 230b by the dry etching in the above processing can be recovered. In the case where the heat treatment is performed in an oxygen-containing atmosphere, oxygen can be added to the oxide 230a and the oxide 230b.

Through the heat treatment, the metal element contained in the conductor 242 is diffused from the conductor 242 into the oxide 230b; thus, the metal element can be added to the oxide 230b. Moreover, oxygen in the oxide 230b in the vicinity of the interface with the conductor 242 may be absorbed by the conductor 242. As a result, the oxide 230b in the vicinity of the interface with the conductor 242 becomes a metal compound and the resistance thereof is reduced. At this time, part of the oxide 230b may be alloyed with the metal element. When part of the oxide 230b is alloyed with the metal element, the metal element added to the oxide 230b is brought into a relatively stable state; therefore, a highly reliable semiconductor device can be provided. Note that in FIG. 14(A), the region 231 (the region 231a, the region 231b, and the region 231c) is shown by dotted lines as an example of the above-described low-resistance region of the oxide 230b. The region 234 (the region 234a and the region 234b) functioning as a channel formation region is formed in the oxide 230b that is exposed in the opening 245.

The region 231 is provided to spread in the depth direction in the oxide 230b near the conductor 242 in the shown example; however, the present invention is not limited thereto. In the depth direction, the region 231 may be formed in the whole oxide 230b or may be formed in the oxide 230a. The region 231 is formed only in a region overlapping with the conductor 242 in the horizontal direction in the shown example; however, the present invention is not limited thereto. The region 231 may be formed in a region spreading from the conductor 242 in the horizontal direction and may be formed in a region overlapping with part of the conductor 260 that is formed in the later step.

In the case where hydrogen in the oxide 230 is diffused into the region 231 and enters an oxygen vacancy in the region 231, the hydrogen is probably brought into a relatively stable state. Hydrogen in an oxygen vacancy in the region 234 is released from the oxygen vacancy by heat treatment at 250° C. or higher, is diffused into the region 231, enters an oxygen vacancy in the region 231, and is probably brought into a relatively stable state. Thus, by the heat treatment, it is probable that the resistance of the region 231 is further reduced, and the region 234 is highly purified (reduction of impurities such as water and hydrogen) and the resistance of the region 234 is further increased.

Alternatively, the heat treatment may be performed in such a manner that heat treatment is performed in a nitrogen or inert gas atmosphere, and then another heat treatment is performed in an atmosphere containing an oxidizing gas at 10 ppm or more, 1% or more, or 10% or more. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C.

After the deposition of the conductive film 242A or during the heat treatment following the formation of the conductor 242, the conductive film 242A or the conductor 242 sometimes absorbs oxygen in the region 231 of the oxide 230, which causes oxygen vacancies in the region 231 in some cases. Entry of hydrogen in the oxide 230 to the oxygen vacancy increases the carrier density of the region 231. Therefore, the region 231 of the oxide 230 becomes n-type and has a reduced resistance.

The oxygen concentration in the region 231 is lower than the oxygen concentration in the region 234 in some cases. The hydrogen concentration in the region 231 is higher than the hydrogen concentration in the region 234 in some cases.

Then, an oxide film 230C is formed over the insulator 280 to have regions in contact with the side surface of the oxide 230a, the top surface and the side surface of the oxide 230b, the side surface of the conductor 242, the side surface of the insulator 256, and the side surface of the insulator 280 in the opening 245 (see FIG. 15).

The oxide film 230C can be formed by a sputtering method, a CVD method, an MBE method, a PLD method, an ALD method, or the like. The oxide film 230C is deposited by a method similar to that for the oxide film 230A or the oxide film 230B in accordance with characteristics required for the oxide 230c. In this embodiment, the oxide film 230C can be deposited by a sputtering method using a target with In:Ga:Zn=4:2:4.1 or 1:3:4 [each of them shows the atomic ratio].

The oxide film 230C may have a stacked-layer structure. For example, an oxide film to be the oxide 230c1 may be deposited by a sputtering method using a target of In:Ga:Zn=4:2:4.1 [atomic ratio], and an oxide film to be the oxide 230c2 may be deposited successively using a target of In:Ga:Zn=1:3:4 [atomic ratio].

Then, an insulator 250A is deposited over the oxide film 230C (see FIG. 15).

The insulator 250A can be deposited by a sputtering method, a CVD method, an MBE method, a PLD method, an ALD method, or the like. Silicon oxynitride is preferably deposited by a CVD method as the insulator 250A. Note that the deposition temperature at the time of the deposition of the insulator 250A is preferably higher than or equal to 350° C. and lower than 450° C., particularly preferably approximately 400° C. When the insulator 250A is deposited at 400° C., an insulator having few impurities can be deposited.

Note that oxygen is excited by microwaves to generate high-density oxygen plasma, and the insulator 250A is exposed to the oxygen plasma, whereby oxygen can be introduced into the insulator 250A.

Furthermore, heat treatment may be performed. For the heat treatment, the conditions for the above-described heat treatment can be used. The heat treatment can reduce the moisture concentration and the hydrogen concentration in the insulator 250A.

Next, a conductive film 260aA and a conductive film 260bA are sequentially deposited (see FIG. 15). The conductive film 260aA and the conductive film 260bA can be formed by a sputtering method, a CVD method, an MBE method, a PLD method, an ALD method, or the like. Titanium nitride may be deposited for the conductive film 260aA, and tungsten may be deposited for the conductive film 260bA, for example.

For the conductive film 260aA, a metal nitride is preferably formed by a CVD method or a sputtering method. With the use of a metal nitride for the conductive film 260aA, a reduction in conductivity of the conductive film 260bA due to oxidation caused by oxygen contained in the insulator 250A can be prevented.

Furthermore, when a low-resistance metal film is stacked as the conductive film 260bA, a transistor with a low driving voltage can be provided.

Subsequently, heat treatment can be performed. For the heat treatment, the conditions for the above heat treatment can be used. Note that the heat treatment is not necessarily performed in some cases. By the heat treatment, oxygen can be added from the insulator 250A to the oxide 230b, so that the concentration of oxygen contained in the oxide 230b can be increased. Through this heat treatment, a low-resistance region (the region 231) is sometimes formed in the oxide 230b.

Next, the conductive film 260bA, the conductive film 260aA, the insulator 250A, and the oxide film 230C are polished until the insulator 280 is exposed, so that the conductor 260 including the conductor 260a and the conductor 260b, the insulator 250, and the oxide 230c are formed (see FIG. 16). A CMP method can be used for the polishing. The top surfaces of the conductor 260, the insulator 250, and the oxide 230c preferably become substantially level with the top surface of the insulator 280 by the polishing.

At this time, the conductor 260 is formed to overlap with the conductor 205, the oxide 230a, and the oxide 230b at least partly. The width of the conductor 260 in the channel length direction depends on the width of the opening 245 provided in the insulator 280, the thickness of the oxide film 230C, and the thickness of the insulator 250A. The conductor 260 with a desired width can be formed by adjusting the above widths and thicknesses in accordance with the performance required for the transistor 200 or the semiconductor device.

In such a manner, the conductor 260 is formed to be embedded in the opening 245. The conductor 260 is formed in a self-aligned manner without employing a lithography method; thus, an alignment margin for the conductor 260 is unnecessary. Therefore, the area occupied by the transistor 200 can be reduced and the miniaturization and high integration of the semiconductor device can be achieved. Furthermore, since the lithography process is not necessary, an improvement in productivity due to simplification of the process is expected.

The gate length needs to be short for miniaturization of the semiconductor device, but it is necessary to prevent reduction in the conductivity of the conductor 260. When the conductor 260 is made thick to achieve this, the conductor 260 might have a shape with a high aspect ratio. In this embodiment, the conductor 260 is provided to be embedded in the opening 245; hence, even when the conductor 260 has a shape with a high aspect ratio, the conductor 260 can be formed without collapsing during the process.

Next, the insulator 274 (the insulator 274a and the insulator 274b) is formed to cover the conductor 260, the insulator 250, the oxide 230c, and the insulator 280 (see FIG. 17). It is particularly preferable that the insulator 274 be provided in contact with the top surfaces of the conductor 260, the insulator 250, the oxide 230c, and the insulator 280. For the insulator 274a, aluminum oxide is deposited by a sputtering method. In addition, the insulator 274a may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method. For the insulator 274b, silicon nitride is deposited by a sputtering method, a CVD method, or an ALD method. In addition, the insulator 274b may have a multilayer structure.

Then, the insulator 281 is formed over the insulator 274 (see FIG. 17). The insulator 281 can be formed using an apparatus and a material that are similar to those used for the insulator 280. For example, the insulator 281 containing silicon oxynitride is formed by a CVD method.

Next, the insulator 281, the insulator 274, the insulator 280, and the insulator 256 are processed by a lithography method to form openings 290 in which the conductor 242a and the conductor 242b are exposed (see FIG. 18).

Next, an insulating film to be the insulator 141 is deposited and the insulating film is subjected to anisotropic etching, so that the insulator 141 is formed. The insulating film can be deposited by a sputtering method, a CVD method, an MBE method, a PLD method, an ALD method, or the like. As the insulating film to be the insulator 141, an insulating film having a function of inhibiting passage of oxygen is preferably used. For example, aluminum oxide or silicon nitride is preferably deposited by an ALD method. For the anisotropic etching, a dry etching method or the like may be employed, for example. When a sidewall portion of the opening 290 has such a structure, passage of oxygen from the outside can be inhibited and oxidation of a conductor 110A that is formed next can be prevented. Furthermore, impurities such as water and hydrogen can be prevented from diffused from the conductor 110A to the outside. In the case where the conductor 110A is not oxidized in the opening 290 or the case where the oxidation of the conductor 110A affects the characteristics of the semiconductor device little or does not affect them, the insulator 141 does not always need to be provided. In the case where impurities such as water or hydrogen are not diffused from the conductor 110A in the opening 290 or the case where impurities diffused from the conductor 110A affect the characteristics of the semiconductor device little or do not affect them, the insulator 141 does not always need to be provided.

Next, the conductor 110A is deposited. For the conductor 110A, a material containing tantalum nitride, titanium nitride, tungsten, molybdenum, copper, silicon, and germanium can be used. Alternatively, a stack of these materials may be used. The conductor 110A can be deposited by a sputtering method, a CVD method, an MBE method, a PLD method, an ALD method, or the like.

Then, a filler 288 is deposited over the conductor 110A (see FIG. 19). The filler 288 fills the openings 290 to the degree allowing CMP treatment in a later step to be performed. Thus, there may be a cavity or the like in the openings 290. A material such as an insulator, a conductor, and a semiconductor can be used for the filler 288. In the case where an insulator is used for the filler 288, a material containing an oxide containing silicon, a nitride containing silicon, an oxide containing a metal, a nitride containing a metal, or the like, a resin such as acrylic or polyimide, or an organic material such as a resist can be used. In the case where a semiconductor is used for the filler 288, a material containing silicon, germanium, or the like can be used. The filler 288 can be formed by a sputtering method, a CVD method, an MBE method, a PLD method, an ALD method, or the like. Alternatively, the filler 288 can be formed by a spin coating method, a dipping method, a droplet discharging method (e.g., an ink-jet method), a printing method (e.g., screen printing or offset printing), a doctor knife method, a roll coater method, a curtain coater method, or the like. For the filler 288, for example, silicon oxide is deposited by an APCVD method.

Then, a layer above the insulator 281 is removed by CMP treatment, so that the conductor 110 is formed (see FIG. 20). Here, the insulator 281 preferably functions as a stopper for the conductor 110A during the CMP treatment. Note that the insulator 281 is partly removed by the CMP treatment in some cases.

Next, the filler 288 in the openings 290 is removed by etching treatment. The etching treatment may be performed by a wet etching method or a dry etching method; the filler 288 in the openings 290 can be more easily removed by a wet etching method in some cases. When wet etching is employed, an acid solution such as a hydrofluoric acid, an alkaline solution, or the like can be used as an etchant. Furthermore, a developer may be used as the etchant. Alternatively, the filler 288 may be removed by ashing, which is a dry etching method, using plasma containing oxygen.

Next, the insulator 130 is deposited over the conductor 110 and the insulator 281 (see FIG. 21). The insulator 130 is preferably formed in contact with the conductor 110 that is provided inside the opening 290 having a large aspect ratio. Thus, the insulator 130 is preferably formed by a method that enables favorable coverage, such as an ALD method or a CVD method, and is silicon oxide deposited by an ALD method, for example, in this embodiment. Note that silicon oxide may be deposited by a PEALD method.

When the insulator 130 is formed by a deposition method such as an ALD method to cover the conductor 110 favorably, a short circuit between the upper electrode and the lower electrode of the capacitor 100 can be prevented.

Then, an opening 292 in which the conductor 242c is exposed is formed by processing the insulator 130, the insulator 281, the insulator 274, the insulator 280, and the insulator 256 by a lithography method (see FIG. 22).

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film to be the insulator 241, an insulating film having a function of inhibiting passage of oxygen is preferably used. For example, aluminum oxide or silicon nitride is preferably deposited by an ALD method. For the anisotropic etching, a dry etching method or the like may be employed, for example. When the sidewall portion of the opening 292 have such a structure, passage of oxygen from the outside can be inhibited and oxidation of the conductor 120A that is formed next can be prevented. Furthermore, impurities such as water and hydrogen can be prevented from diffused from the conductor 120A to the outside. In the case where the conductor 120A is not oxidized in the opening 292 or the case where the oxidation of the conductor 120A affects the characteristics of the semiconductor device little or does not affect them, the insulator 241 does not always need to be provided. In the case where impurities such as water or hydrogen are not diffused from the conductor 120A in the opening 292 or the case where impurities diffused from the conductor 120A affect the characteristics of the semiconductor device little or do not affect them, the insulator 241 does not always need to be provided.

Next, the conductor 120A is deposited over the insulator 130 (see FIG. 23). The conductor 120A needs to be formed in the openings 290 and the opening 292 and thus, the conductor 120A is preferably deposited by a deposition method such as an ALD method and a CVD method providing favorable embeddability. For example, titanium nitride is deposited by an ALD method, and tungsten is deposited thereover by a CVD method.

The conductor 120A is formed in the above manner, whereby the upper electrode of the capacitor 100 can be provided in the opening 290 with favorable embeddability and thus, the capacitor 100 can have increased capacitance.

Next, the conductor 120A is processed by a photolithography method or the like to form the conductors 120 and the conductor 240 (see FIG. 24). Note that in the processing of the conductor 120A, the insulator 130 may be processed. A conductor functioning as a wiring may be formed in a layer above the conductor 120. The conductor 120 functions as the upper electrode of the capacitor 100 and a wiring, and the conductor 240 functions as a plug electrically connected to the conductor 242c and a wiring. The conductor 120 and the conductor 240 formed in such a manner are positioned in the same layer over the insulator 130. For example, the conductor 120 and the conductor 240 are in contact with the top surface of the insulator 130.

Through the above process, the semiconductor device including the transistor 200 and the capacitor 100, which is illustrated in FIG. 1, can be manufactured.

According to one embodiment of the present invention, a semiconductor device that can be miniaturized or highly integrated can be provided. Alternatively, according to one embodiment of the present invention, a semiconductor device having favorable electrical characteristics can be provided. According to one embodiment of the present invention, a semiconductor device having favorable frequency characteristics can be provided. Alternatively, according to one embodiment of the present invention, a semiconductor device having favorable reliability can be provided. Alternatively, according to one embodiment of the present invention, a semiconductor device having high productivity can be provided.

Alternatively, a semiconductor device capable of retaining data for a long time can be provided. Alternatively, a semiconductor device capable of high-speed data writing can be provided. Alternatively, a semiconductor device having high design flexibility can be provided. Alternatively, a semiconductor device in which power consumption can be reduced can be provided. Alternatively, a novel semiconductor device can be provided.

The structure, method, and the like described above in this embodiment can be used in appropriate combination with structures, methods, and the like described in the other embodiments and the examples.

Modification Example 1 of Semiconductor Device

An example of a semiconductor device including the transistor 200 and the capacitor 100 of one embodiment of the present invention that is different from that described in the above <Structure example of semiconductor device> is described below with reference to FIG. 25.

Figure 25:
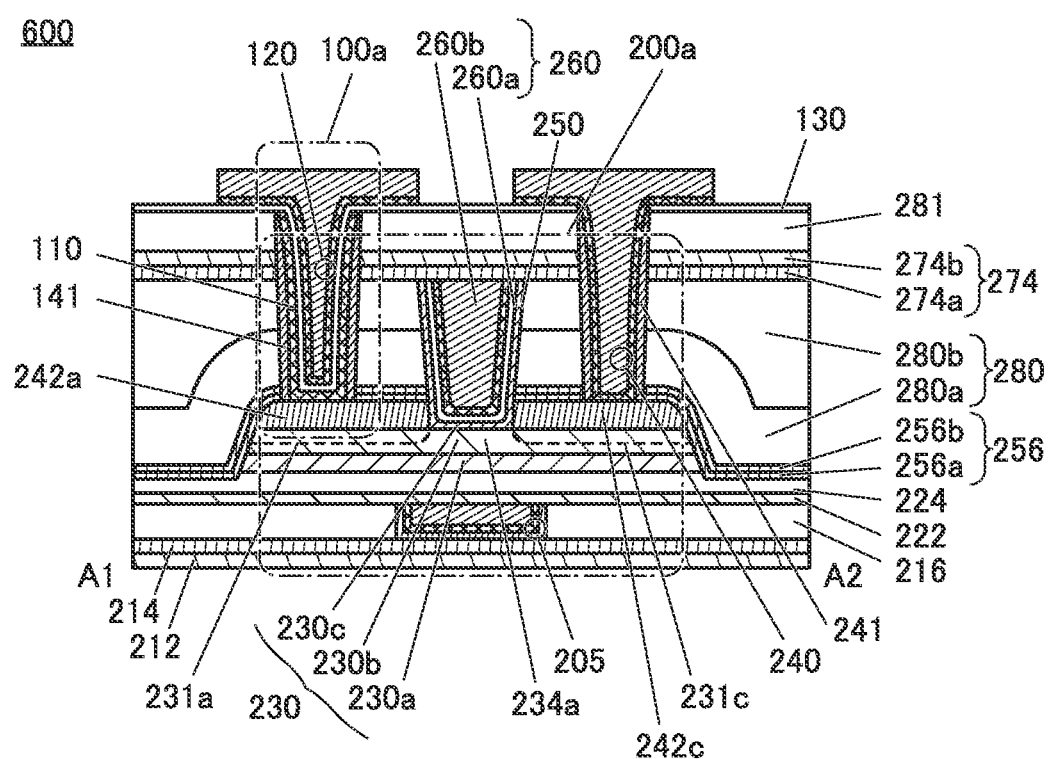
FIG. 25 A cross-sectional view of a semiconductor device of one embodiment of the present invention.

Note that in the semiconductor device shown in FIG. 25, structures having the same functions as the structures in the semiconductor device described in <Structure example of semiconductor device> (see FIG. 1) are denoted by the same reference numerals.

A structure of the transistor 200 and the capacitor 100 is described with reference to FIG. 25 below. Note that also in this section, the materials described in detail in <Structure example of semiconductor device> can be used as the constituent materials for the transistor 200 and the capacitor 100.

The semiconductor device described in <Structure example of semiconductor device> (see FIG. 1) is described as an example in which the transistor 200 includes two transistors (the transistor 200a and the transistor 200b) in one semiconductor layer, and the capacitors (the capacitor 100a and the capacitor 100b) electrically connected to the transistors; however, the present invention is not limited thereto. As illustrated in FIG. 25, the transistor 200 may include one transistor (the transistor 200a) in one semiconductor layer and one capacitor (the capacitor 100a) electrically connected to the transistor 200a.

In that case, the insulator 256 is provided in contact with side surfaces of the oxide 230a, the oxide 230b, and the conductor 242c on the A2 side.

When the conductor 240 electrically connected to the conductor 242c of the transistor 200a and the conductor 120 functioning as an upper electrode of the capacitor 100a are formed using the same material at the same step, the number of steps and the number of masks can be reduced, so that the cost for manufacturing the semiconductor device can be reduced.

As described above, the components, structures, methods, and the like described in this embodiment can be combined with any of the components, structures, methods, and the like described in the other embodiments as appropriate.

Embodiment 2

In this embodiment, an example of a chip 1200 on which the semiconductor device of the present invention is mounted is described with reference to FIG. 26. A plurality of circuits (systems) are mounted on the chip 1200. The technique for integrating a plurality of circuits (systems) on one chip as described above is referred to as system on chip (SoC) in some cases.

Figure 26A:
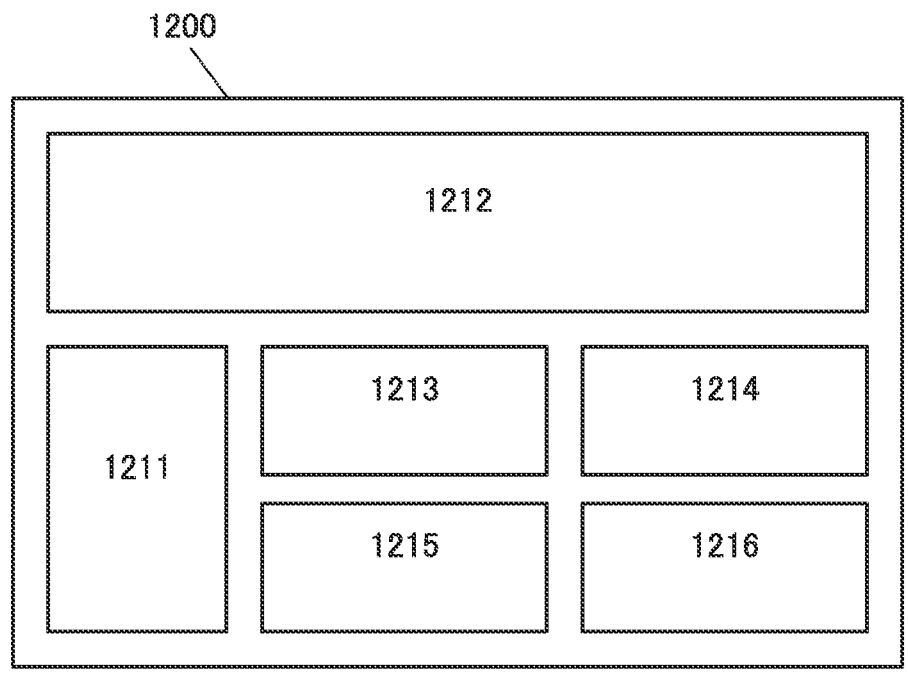

As illustrated in FIG. 26(A), the chip 1200 includes a CPU 1211, a GPU 1212, one or more of analog arithmetic units 1213, one or more of memory controllers 1214, one or more of interfaces 1215, one or more of network circuits 1216, and the like.

Figure 26B:
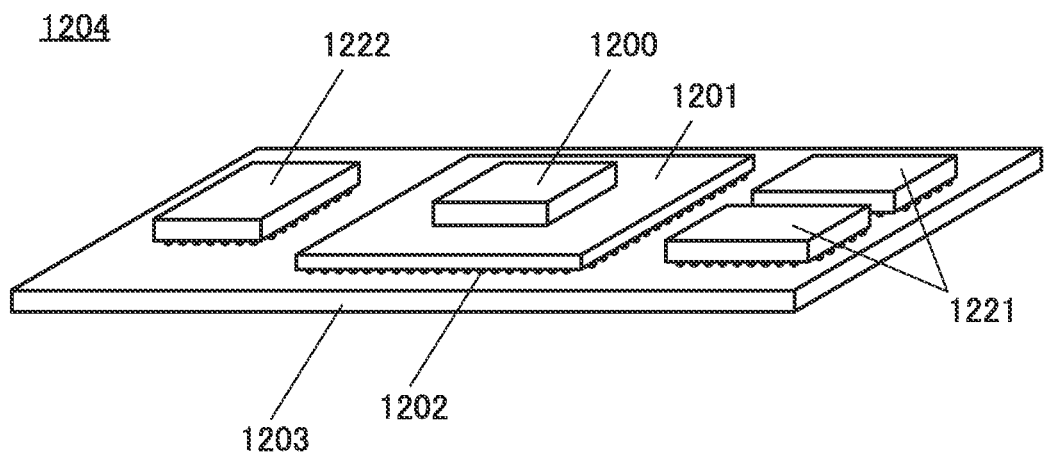

A bump (not illustrated) is provided on the chip 1200, and as illustrated in FIG. 26(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can execute a method such as a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments and the like.

Embodiment 3

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 27 schematically illustrates some structure examples of removable memory devices. The semiconductor device described in the above embodiment is processed into a packaged memory chip and used in a variety of storage devices and removable memories, for example.

Figure 27A:
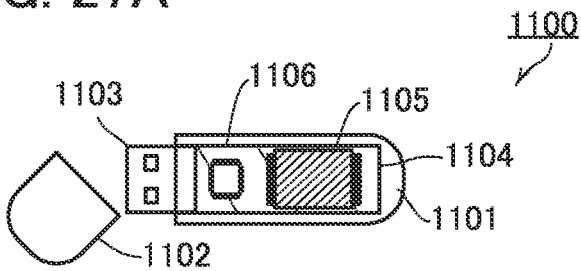

FIG. 27(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 27B:
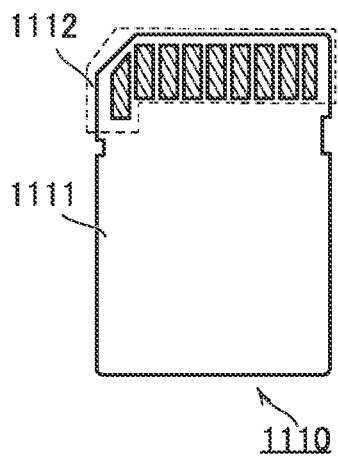
Figure 27C:
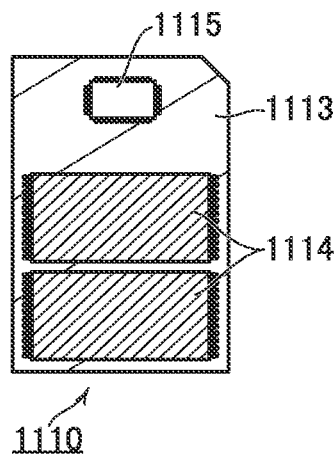

FIG. 27(B) is a schematic external view of an SD card, and FIG. 27(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 27D:
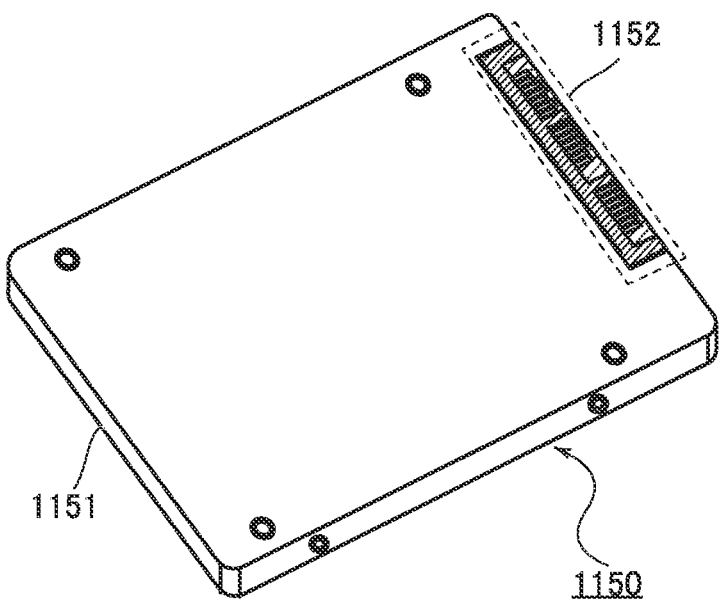
Figure 27E:
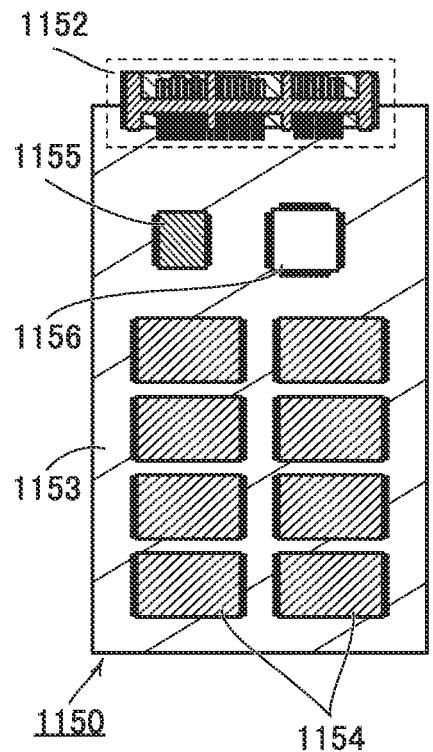

FIG. 27(D) is a schematic external view of an SSD, and FIG. 27(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

Embodiment 4

Specifically, the semiconductor device of one embodiment of the present invention can be used for a processor such as a CPU and a GPU or a chip. FIG. 28 illustrates specific examples of electronic devices including a processor such as a CPU and a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28 illustrates examples of electronic devices.

[Information Terminal]

Figure 28A:
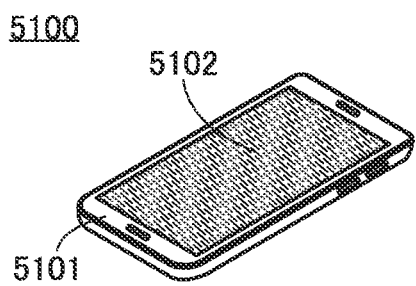

FIG. 28(A) illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 28B:
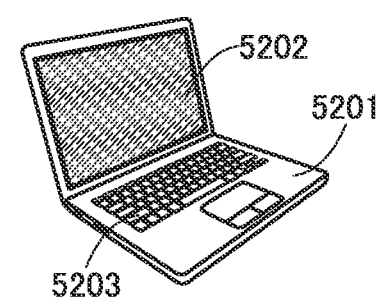

FIG. 28(B) illustrates a notebook information terminal 5200. The notebook information terminal 5200 includes a main body 5201 of the information terminal, a display portion 5202, and a keyboard 5203.

As the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 28(A) and FIG. 28(B) as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machine]

Figure 28C:
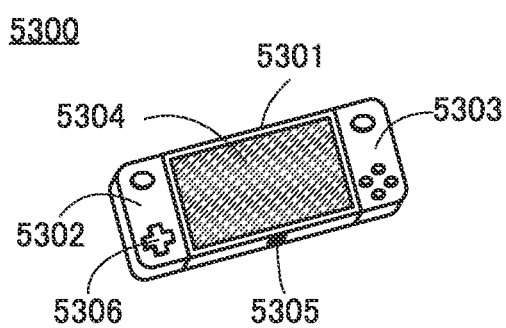

FIG. 28(C) illustrates a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 28D:
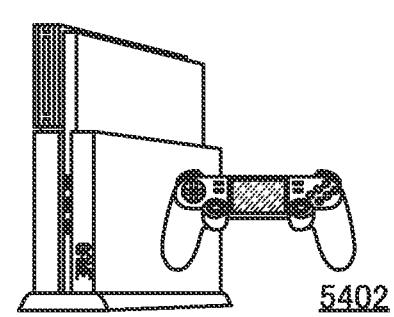

FIG. 28(D) illustrates a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, expressions are possible in which questions posed by the player, the progress of the game, time, and the actions and words of game characters are changed.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively illustrated in FIG. 28(C) and FIG. 28(D) as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 28E:
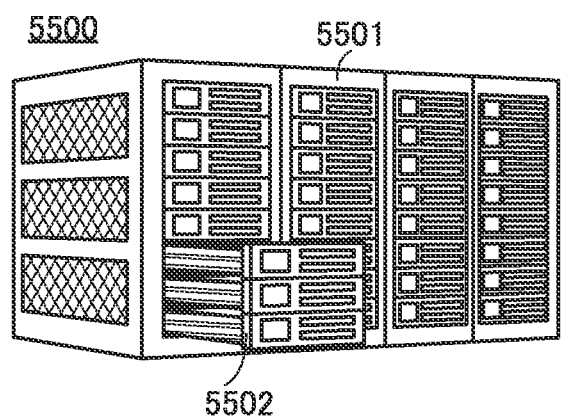
Figure 28F:
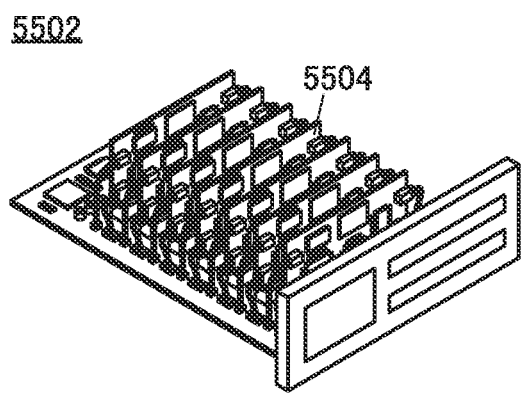

FIG. 28(E) illustrates a supercomputer 5500 as an example of a large computer. FIG. 28(F) illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 28(E) and FIG. 28(F), a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 28G:
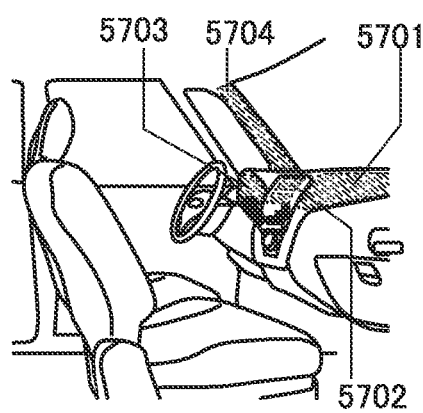

FIG. 28(G) illustrates the periphery of a windshield inside an automobile, which is an example of a moving vehicle. FIG. 28(G) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gear-shift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile. That is, displaying an image taken by the imaging device provided on the outside of the automobile leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Electrical Appliance]

Figure 28H:
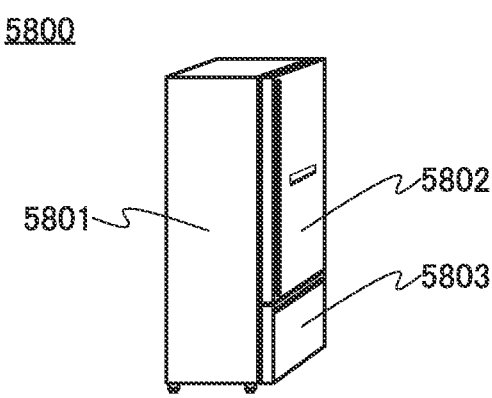

FIG. 28(H) illustrates an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electronic oven, a rice cooker, a water heater, an IH cooker, a water server, a heating-cooling combination appliance such as an air conditioner, a washing machine, a drying machine, and an audio visual appliance.

The electronic devices, the functions of the electronic devices, application examples of artificial intelligence and its effects, and the like described in this embodiment can be combined as appropriate with the description of another electronic device.

This embodiment can be implemented in an appropriate combination with the structures described in the other embodiments and the like.

REFERENCE NUMERALS

100: capacitor, 110: conductor, 120: conductor, 130: insulator, 141: insulator, 200: transistor, 205: conductor, 210: insulator, 212: insulator, 214: insulator, 216: insulator, 222: insulator, 224: insulator, 230: oxide, 231: region, 234: region, 240: conductor, 241: insulator, 242: conductor, 245: opening, 250: insulator, 256: insulator, 260: conductor, 274: insulator, 280: insulator, 281: insulator, 288: filler, 290: opening, 292: opening, 600: memory cell

The invention claimed is:

1. A semiconductor device comprising:
an oxide;
a first conductor and a second conductor apart from each other over the oxide;
a third conductor over the oxide, the third conductor overlapping with a region between the first conductor and the second conductor;
a first insulator over the third conductor;
a fourth conductor electrically connected to the first conductor through a first opening in the first insulator;
a second insulator over the first insulator and over the fourth conductor in the first opening;
a fifth conductor overlapping with the fourth conductor with the second insulator between the fifth conductor and the fourth conductor in the first opening; and
a sixth conductor electrically connected to the second conductor in a second opening in the first insulator and the second insulator, and
wherein the fifth conductor and the sixth conductor are in contact with a top surface of the second insulator over the first insulator.

2. The semiconductor device according to claim 1, wherein the fourth conductor, the second insulator, and the fifth conductor form a capacitor.

3. The semiconductor device according to claim 1, wherein the semiconductor device comprises a third insulator, and
wherein the third insulator is between the third conductor and the oxide, between the third conductor and the first conductor, and between the third conductor and the second conductor.

4. The semiconductor device according to claim 3, wherein the third insulator is in contact with the first insulator.

5. The semiconductor device according to claim 1, wherein the fifth conductor and the sixth conductor comprise the same material.

6. The semiconductor device according to claim 1, wherein the fifth conductor and the sixth conductor are formed in the same step.

7. The semiconductor device according to claim 1, wherein the oxide comprises indium, an element M, and zinc, and
wherein the element M is aluminum, gallium, yttrium, or tin.

8. A semiconductor device comprising:
a transistor comprising a semiconductor layer comprising a channel region, a first conductor and a second conductor apart from each other over the semiconductor layer, and a third conductor over the semiconductor layer and overlapping with a region between the first conductor and the second conductor;

a first insulator over the third conductor; and a capacitor comprising a fourth conductor, a second insulator, and a fifth conductor, wherein the fourth conductor is electrically connected to the first conductor through a first opening in the first insulator, wherein the second insulator is over the first insulator and over the fourth conductor in the first opening, wherein the fifth conductor overlaps with the fourth conductor with the second insulator between the fifth conductor and the fourth conductor in the first opening, and wherein in a plan view, an angle between a channel length direction of the transistor and a direction in which the fifth conductor extends is greater than 0 and smaller than 90°.

9. The semiconductor device according to claim 8, wherein the semiconductor device comprises a third insulator, and wherein the third insulator is between the third conductor and the semiconductor layer, between the third conductor and the first conductor, and between the third conductor and the second conductor.

10. The semiconductor device according to claim 9, wherein the third insulator is in contact with the first insulator.

11. The semiconductor device according to claim 8, further comprising:

a sixth conductor electrically connected to the second conductor in a second opening in the first insulator and the second insulator, wherein the fifth conductor and the sixth conductor are in contact with a top surface of the second insulator over the first insulator.

12. The semiconductor device according to claim 11, wherein the fifth conductor and the sixth conductor comprise the same material.

13. The semiconductor device according to claim 11, wherein the fifth conductor and the sixth conductor are formed in the same step.

14. The semiconductor device according to claim 8, wherein the semiconductor layer comprises an oxide which comprises indium, an element M, and zinc, and wherein the element M is aluminum, gallium, yttrium, or tin.

* * * * *